United States Patent
Hikosaka et al.

(10) Patent No.: US 12,500,172 B2
(45) Date of Patent: Dec. 16, 2025

(54) 3D SEMICONDUCTOR MEMORY DEVICE INCLUDING INTER-FINGER STRUCTURE AND INTERLAYER INSULATING LAYERS CONFIGURED TO ABSORB COMPRESSING STRESS

(71) Applicant: Kioxia Corporation, Tokyo (JP)

(72) Inventors: So Hikosaka, Yokkaichi (JP); Akiko Nomachi, Sapporo (JP); Osamu Matsuura, Kuwana (JP)

(73) Assignee: Kioxia Corporation, Tokyo (JP)

( * ) Notice: Subject to any disclaimer, the term of this patent is extended or adjusted under 35 U.S.C. 154(b) by 1035 days.

(21) Appl. No.: 17/643,917

(22) Filed: Dec. 13, 2021

(65) Prior Publication Data

US 2022/0399275 A1    Dec. 15, 2022

(30) Foreign Application Priority Data

Jun. 14, 2021  (JP) .................................. 2021-099066

(51) Int. Cl.
*H01L 23/535*    (2006.01)
*H01L 23/522*    (2006.01)
(Continued)

(52) U.S. Cl.
CPC ........ *H01L 23/535* (2013.01); *H01L 23/5226* (2013.01); *H10B 41/27* (2023.02); *H10B 43/27* (2023.02)

(58) Field of Classification Search
CPC ... H01L 23/535; H01L 23/5226; H10B 41/10; H10B 41/27; H10B 41/50; H10B 43/10; H10B 43/27; H10B 43/50
(Continued)

(56) References Cited

U.S. PATENT DOCUMENTS 11,049,872 B2   6/2021  Nojima et al.
2017/0179154 A1*  6/2017  Furihata ............... H10D 89/911
(Continued)

FOREIGN PATENT DOCUMENTS

JP   2020-047810 A   3/2020
JP   2021-048155 A   3/2021

OTHER PUBLICATIONS

"Oppose." Merriam-Webster.com Dictionary, Merriam-Webster, https://www.merriam-webster.com/dictionary/oppose. Accessed Mar. 16, 2025. (Year: 2025).*

*Primary Examiner* — Julian D Huffman
(74) *Attorney, Agent, or Firm* — Oblon, McClelland, Maier & Neustadt, L.L.P.

(57) ABSTRACT

A semiconductor memory device includes: a stacked structure including first layers including conductive layers disposed in a first and a third regions and insulating layers disposed in a second region, first to third insulating members extending in a stacking direction, semiconductor layers disposed in the first and the third regions, and a contact electrode disposed in the second region. The first and the third insulating members extend across the first to third regions and the second insulating member extends across the first and the third regions. The second insulating member contacts the insulating layers. The first layers extend in a direction in the second region from a side of the first insulating member to a side of the third insulating member. The conductive layers in the first and the third regions are mutually connected via conductive layers in the second region.

12 Claims, 64 Drawing Sheets

(51) Int. Cl.
   *H10B 41/27* (2023.01)
   *H10B 43/27* (2023.01)
(58) Field of Classification Search
   USPC .......................................................... 257/314
   See application file for complete search history.

(56) References Cited

U.S. PATENT DOCUMENTS

2017/0358593 A1* 12/2017 Yu ........................... H10B 43/27
2019/0237475 A1*  8/2019 Jung ..................... H10D 30/694
2021/0082949 A1   3/2021 Harada et al.
2021/0384207 A1* 12/2021 Iwai ....................... H10B 41/10
2022/0037351 A1*  2/2022 Lee .................... H01L 21/76895
2022/0102375 A1*  3/2022 Kubo ..................... H10B 41/35

* cited by examiner

PRIOR ART

PRIOR ART

3D SEMICONDUCTOR MEMORY DEVICE INCLUDING INTER-FINGER STRUCTURE AND INTERLAYER INSULATING LAYERS CONFIGURED TO ABSORB COMPRESSING STRESS

CROSS-REFERENCE TO RELATED APPLICATIONS

This application is based upon and claims the benefit of Japanese Patent Application No. 2021-099066, filed on Jun. 14, 2021, the entire contents of which are incorporated herein by reference.

FIELD

Embodiments described herein relate to a semiconductor memory device.

BACKGROUND

Description of the Related Art

There has been known a semiconductor memory device that includes a semiconductor substrate, a plurality of conductive layers, a semiconductor layer, and a gate insulating layer. These plurality of conductive layers are stacked in a direction intersecting with a surface of the semiconductor substrate. The semiconductor layer is opposed to these conductive layers. The gate insulating layer is disposed between the conductive layers and the semiconductor layer. The gate insulating layer includes a memory unit possible to store data, and the memory unit is, for example, an insulating electric charge accumulating layer of silicon nitride (SiN) or the like, or a conductive electric charge accumulating layer, such as a floating gate.

DETAILED DESCRIPTION

Figure 1:
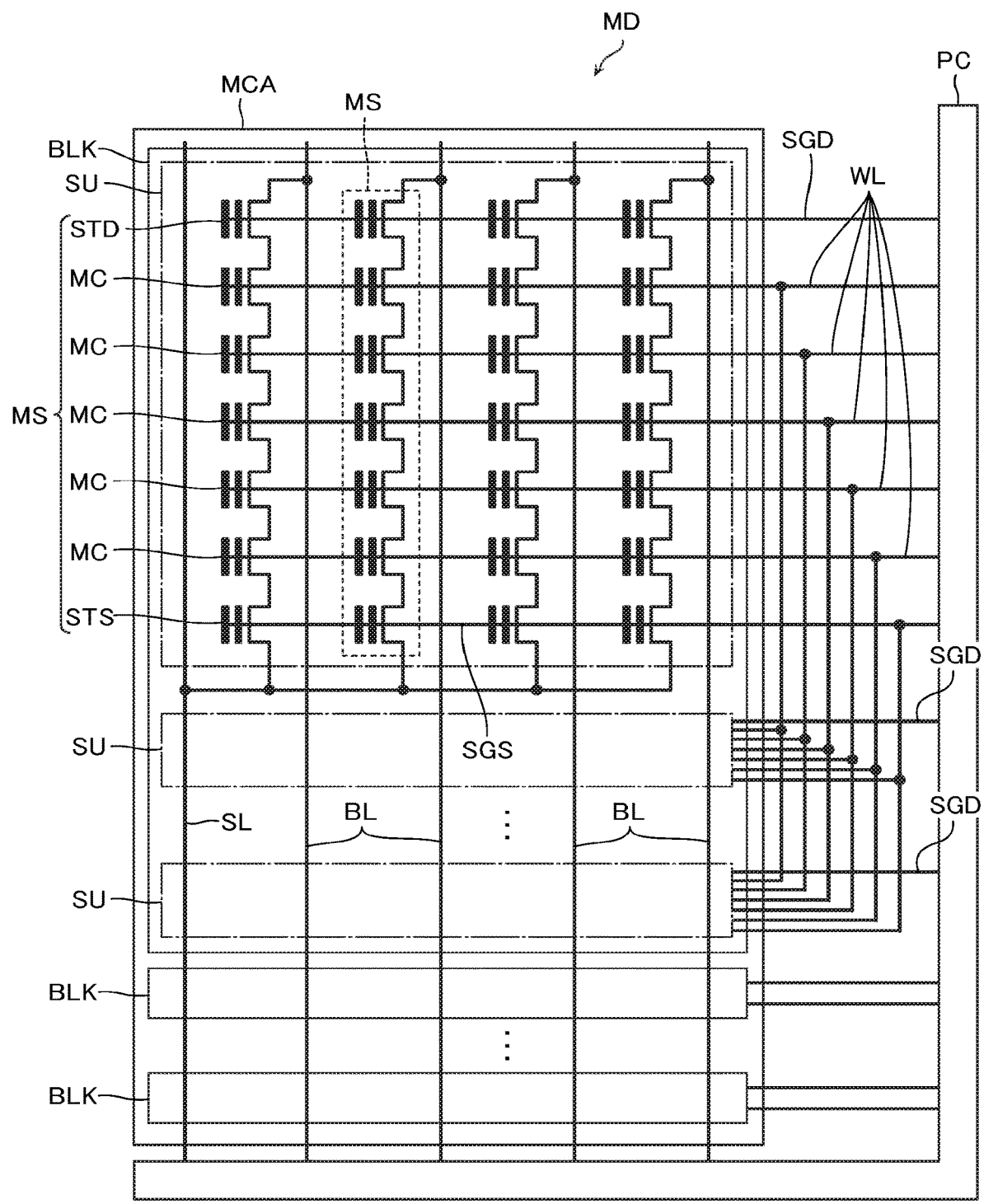
FIG. 1 is a schematic circuit diagram illustrating a part of a configuration of a semiconductor memory device according to a first embodiment.

A semiconductor memory device according to one embodiment comprises: a semiconductor substrate, a stacked structure, first to third insulating members, a plurality of semiconductor layers, and a contact electrode. The semiconductor substrate includes a first region, a second region, and a third region arranged in a first direction. The second region is disposed between the first region and the third region in the first direction. The stacked structure is disposed above the semiconductor substrate and includes a plurality of first layers stacked so as to be spaced apart from one another. The plurality of first layers include a plurality of conductive layers disposed corresponding to the respective plurality of first layers in the first region and the third region. The stacked structure includes a plurality of insulating layers disposed corresponding to the respective plurality of first layers in the second region. The first to third insulating members are disposed above the semiconductor substrate and extend in the first direction and in a stacking direction of the plurality of first layers in the stacked structure. The second insulating member is disposed so as to be spaced apart from the first insulating member and the third insulating member in a second direction intersecting with the first direction and the stacking direction between the first insulating member and the third insulating member in the second direction. The first insulating member and the third insulating member extend across the first to third regions in the first direction and separate the plurality of first layers in the second direction. The second insulating member extend extends across the first region and the third region in the first direction. The plurality of semiconductor layers are disposed extending in the stacking direction in the stacked structure in the first region and the third region. The plurality of semiconductor layers form a plurality of memory cells in at least one of intersection portions with the plurality of conductive layers. The contact electrode is disposed extending in the stacking direction in the stacked structure in the second region and include an outer peripheral surface surrounded by the plurality of insulating layers. The second insulating member contacts side edge portions on both sides of the plurality of insulating layers in the first direction in the second region. The plurality of first layers extend in the second direction in the second region from an edge portion on a side of the first insulating member through a central region including the plurality of insulating layers surrounding the contact electrode to an edge portion on a side of the third insulating member. The plurality of first layers include a plurality of conductive layers in each of one side region in the second direction between the first insulating member and the central region and the other side region in the second direction between the third insulating member and the central region. The plurality of conductive layers in the first region and the plurality of conductive layers in the third region are mutually connected via the plurality of conductive layers in the one side region and the other side region.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor "is electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface (substrate surface) of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at aside opposite to the substrate of this configuration. A surface intersecting with the X-direction or the Y-direction is referred to as aside surface and the like. An edge portion intersecting with the X-direction or the Y-direction is referred to as a side edge portion and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

[Circuit Configuration of Memory Die MD]

FIG. 1 is a schematic circuit diagram illustrating a part of a configuration of a memory die MD. As illustrated in FIG. 1, the memory die MD includes a memory cell array MCA and a peripheral circuit PC.

The memory cell array MCA includes a plurality of memory blocks BLK. These memory blocks BLK each include a plurality of string units SU. These string units SU each include a plurality of memory strings MS. These memory strings MS have one ends each connected to the peripheral circuit PC via a bit line BL. Furthermore, these memory strings MS have other ends each connected to the peripheral circuit PC via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may be simply referred to as select transistors STD, STS.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC stores one bit or a plurality of bits of data. Word lines WL are connected to the respective gate electrodes of the plurality of memory cells MC corresponding to one memory string MS. These respective word lines WL are connected to all the memory strings MS in one memory block BLK in common.

The select transistors STD, STS are field-effect type transistors. The select transistors STD, STS include a semiconductor layer, a gate insulating film, and a gate electrode. The semiconductor layer functions as a channel region. Select gate lines SGD, SGS are connected to the respective gate electrodes of the select transistors STD, STS. One drain-side select gate line SGD is connected to all the memory strings MS in one string unit SU in common. One source-side select gate line SGS is connected to all the memory strings MS in one memory block BLK in common.

The peripheral circuit PC includes, for example, a voltage generation circuit that generates a voltage to be supplied to the memory cell array MCA or the like, a driver circuit and a decode circuit that supplies the voltage generated by the voltage generation circuit to a configuration in the memory cell array MCA, and a sense amplifier circuit that detects voltages or currents of the bit lines BL. The peripheral circuit PC includes, for example, a cache memory, an address register, a command register, a status register, and an input/output control circuit.

[Structure of Memory Die MD]

Figure 2:
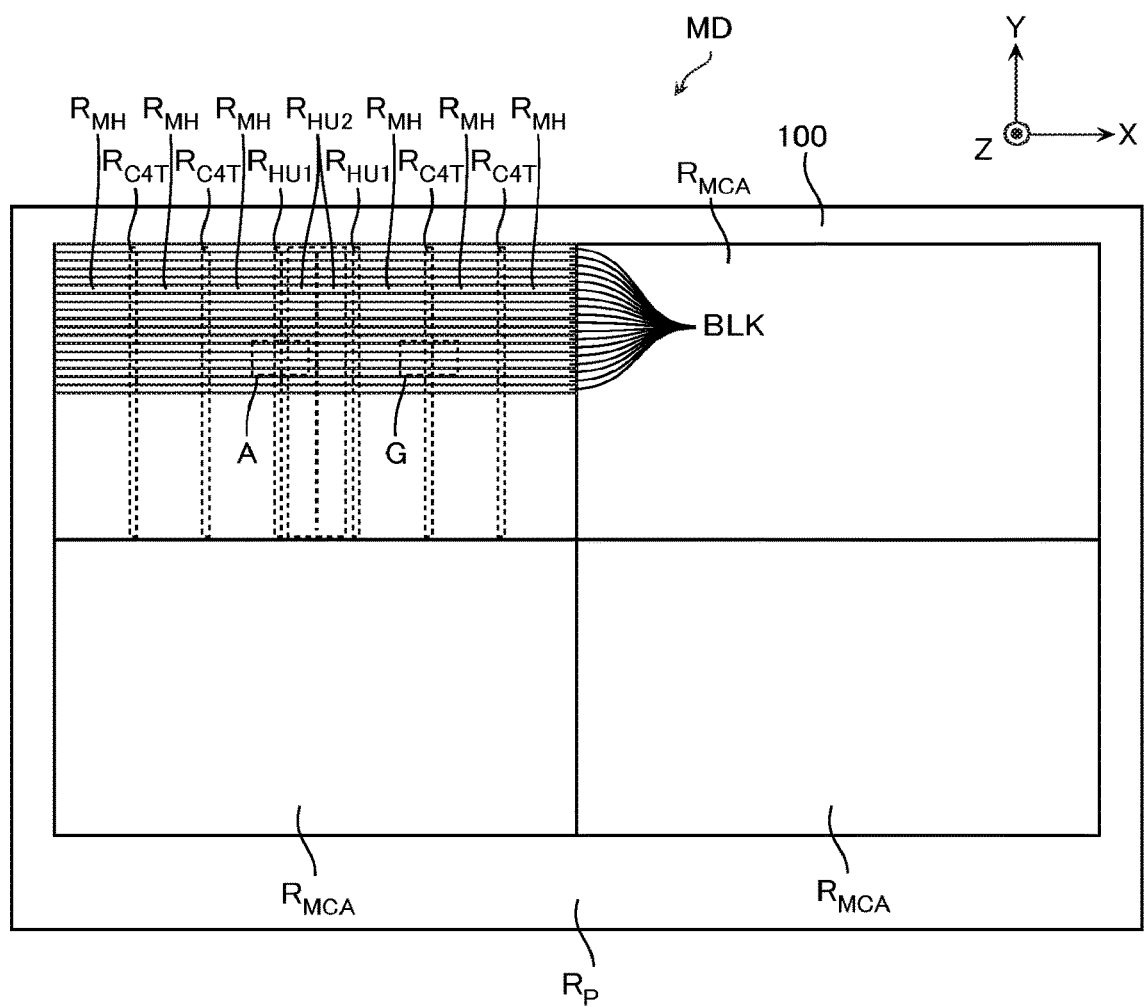
FIG. 2 is a schematic plan view of the same semiconductor memory device.
Figure 3:
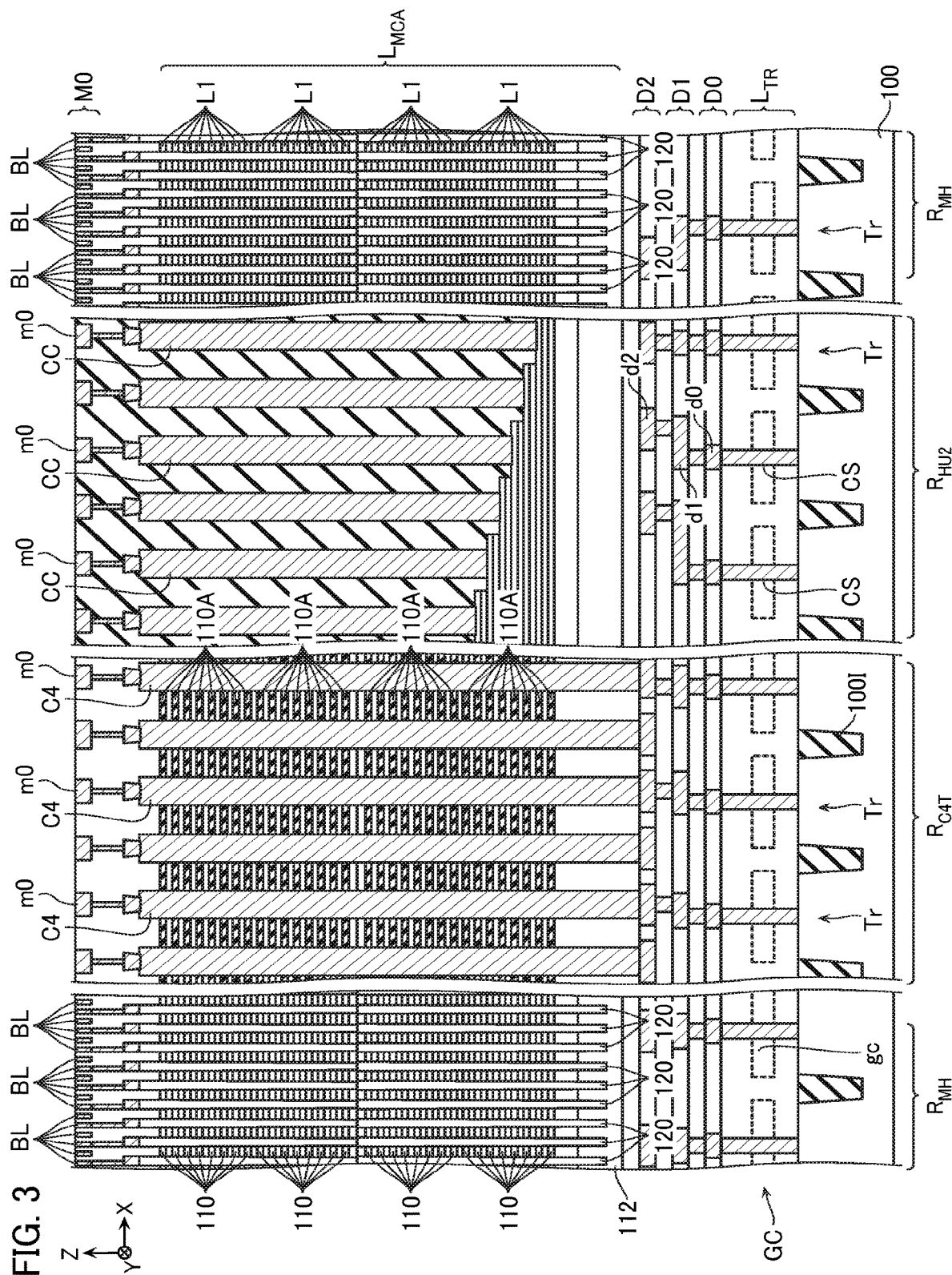
FIG. 3 is a schematic cross-sectional view of the same semiconductor memory device.
Figure 4:
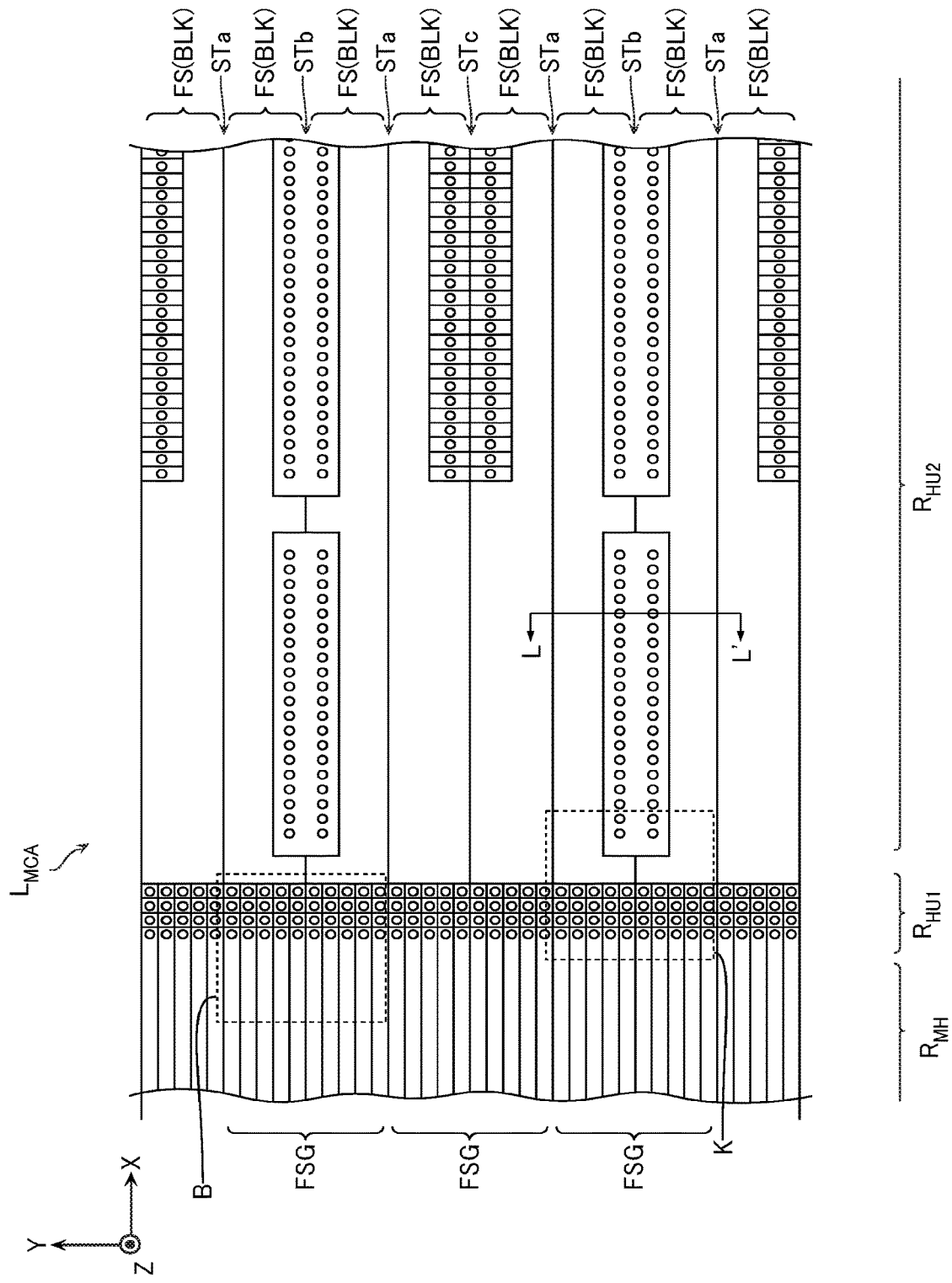
FIG. 4 is a schematic enlarged view of a part indicated by A in FIG. 2.
Figure 5:
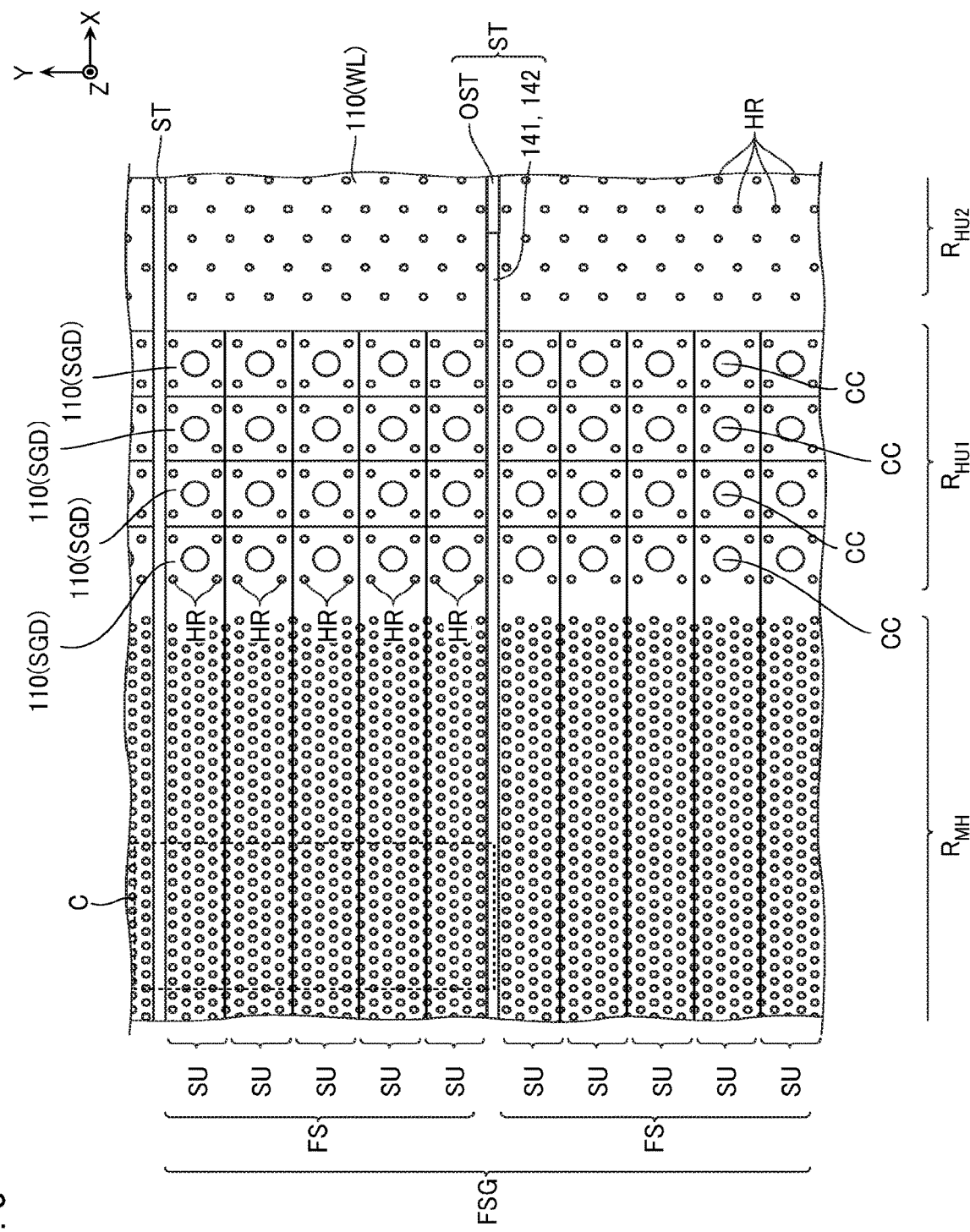
FIG. 5 is a schematic enlarged view of a part indicated by B in FIG. 4.
Figure 6:
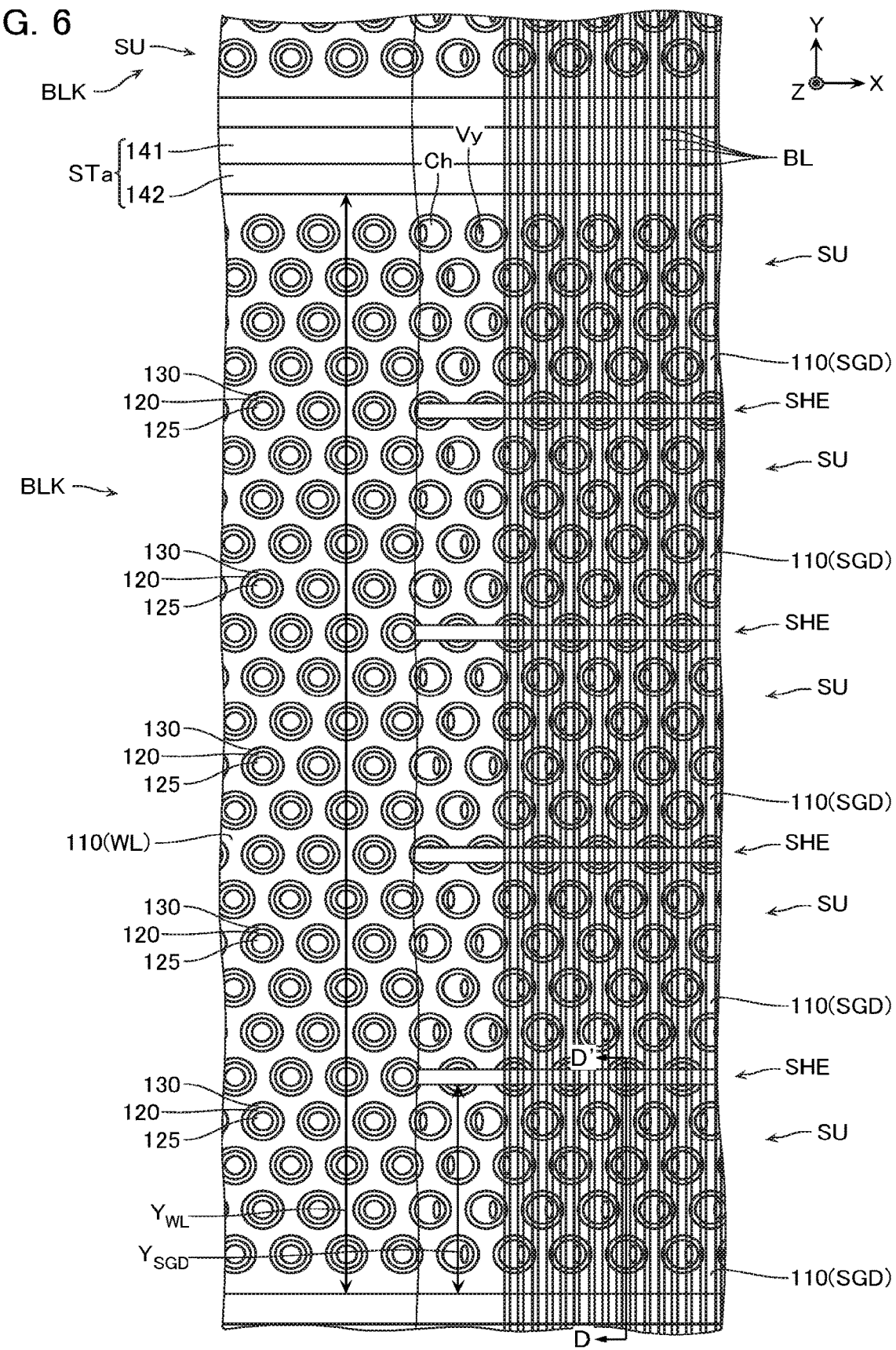
FIG. 6 is a schematic enlarged view of a part indicated by C in FIG. 5.
Figure 7:
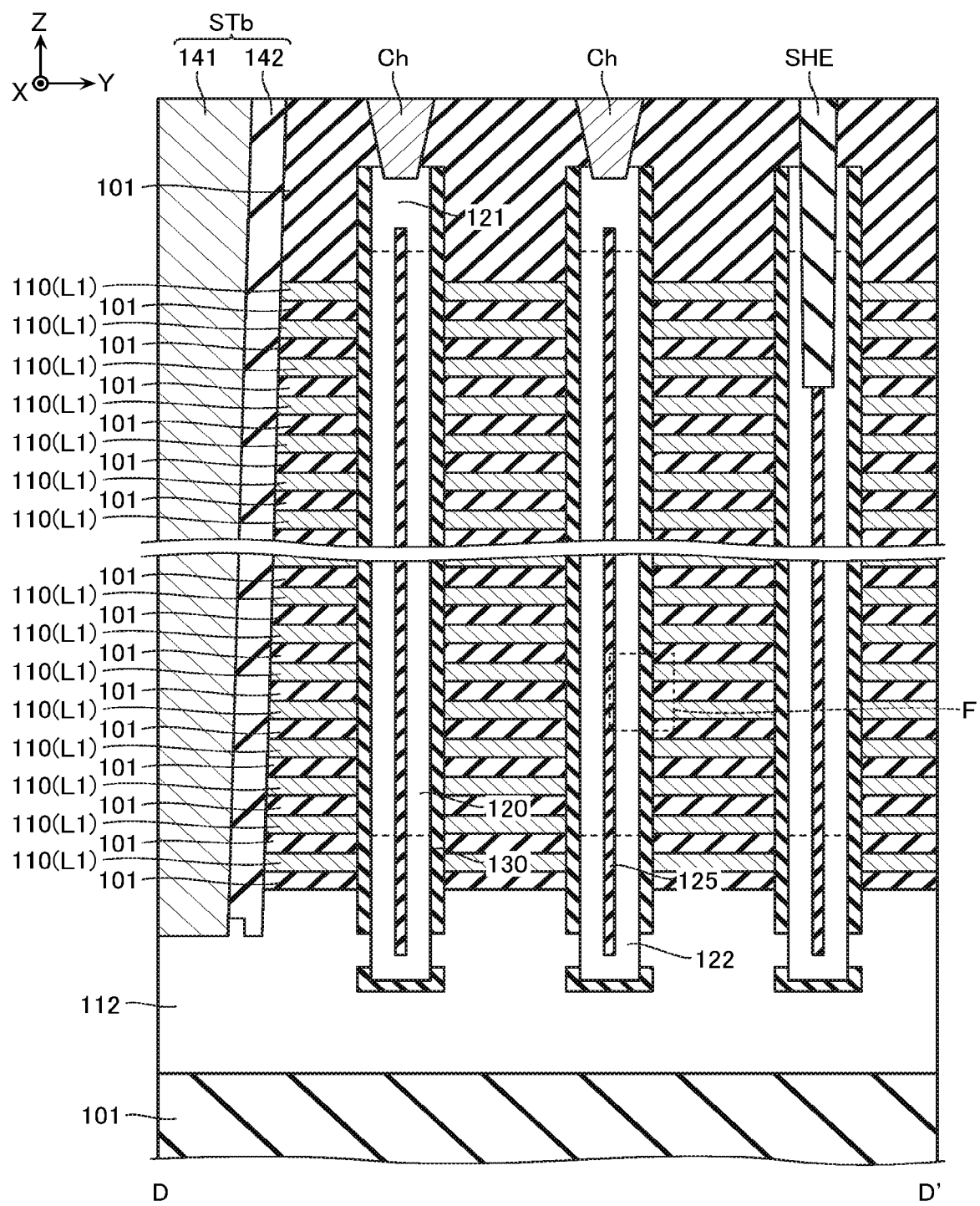
FIG. 7 is a schematic cross-sectional view taking the structure illustrated in FIG. 6 along the line D-D' and viewed along the arrow direction.
Figure 8:
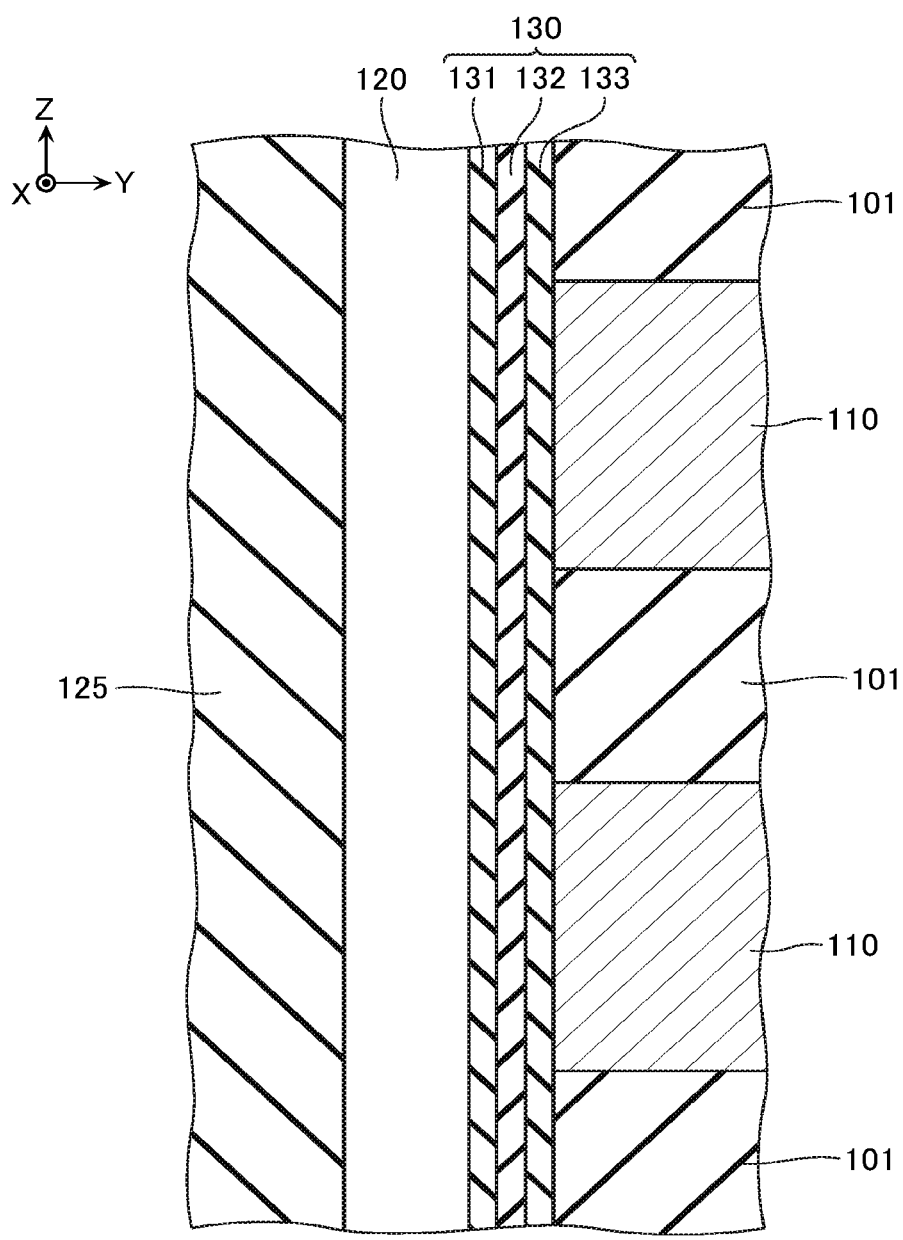
FIG. 8 is a schematic enlarged view of a part indicated by F in FIG. 7.
Figure 9:
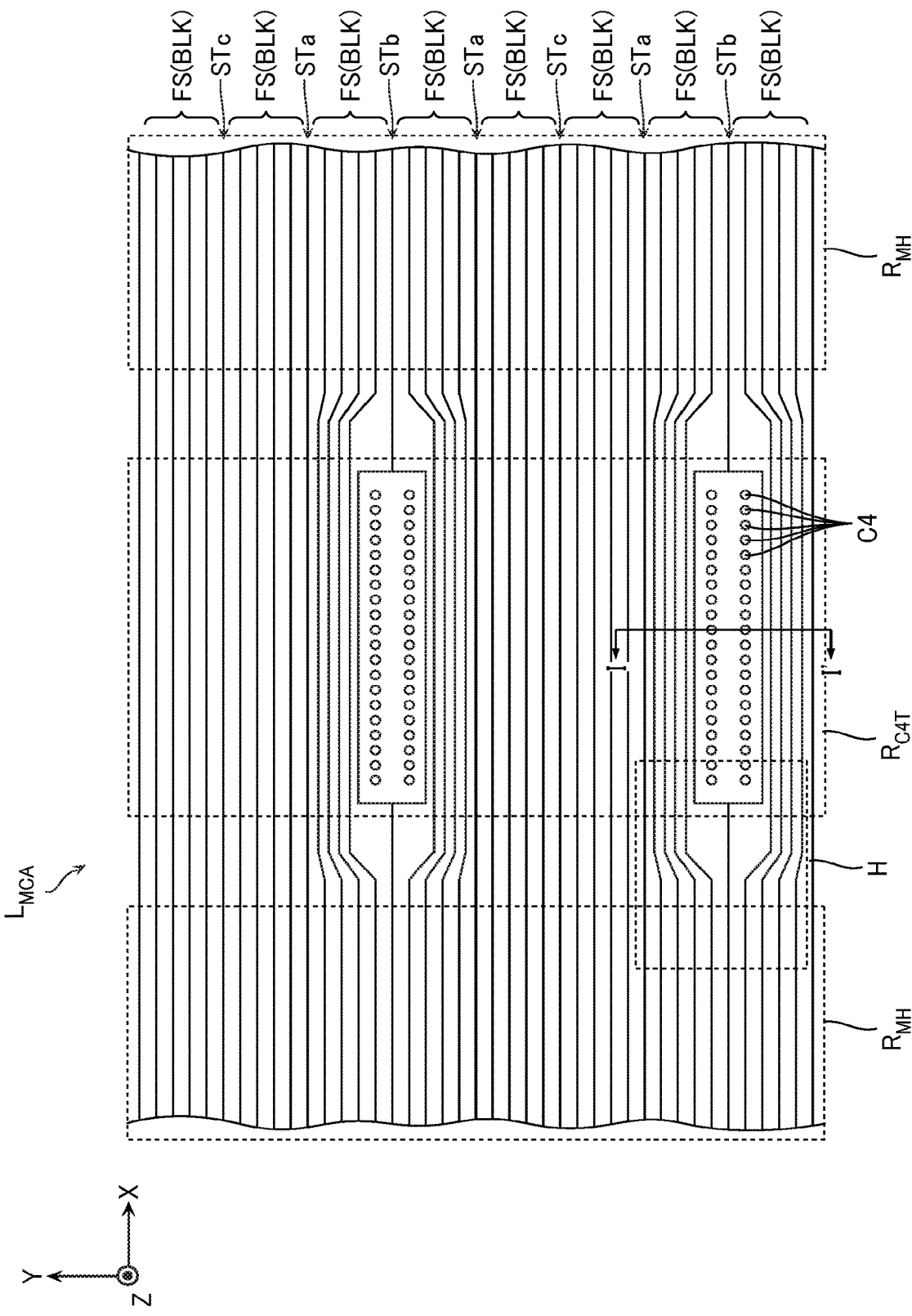
FIG. 9 is a schematic enlarged view of a part indicated by G in FIG. 2.
Figure 10:
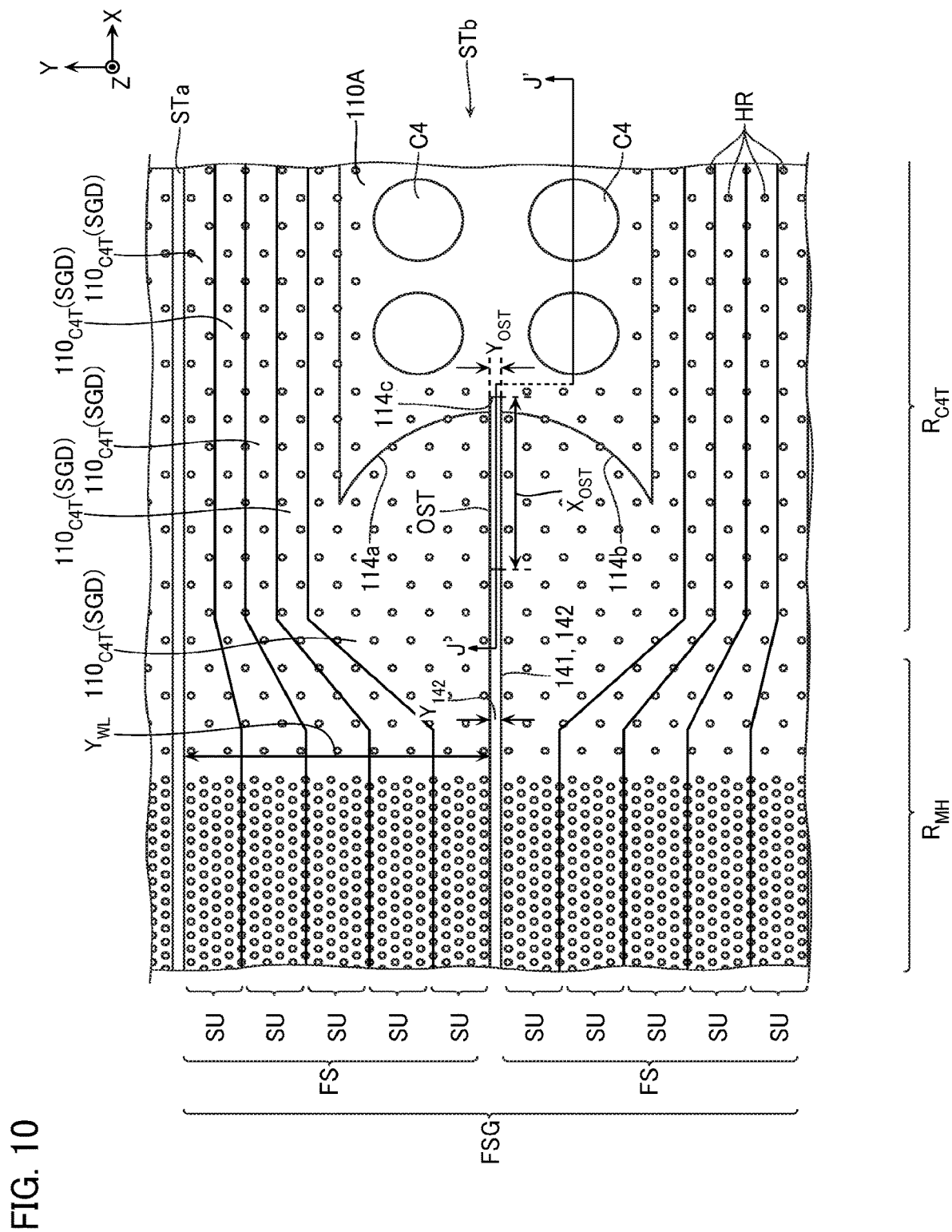
FIG. 10 is a schematic enlarged view of a part indicated by H in FIG. 9.
Figure 11:
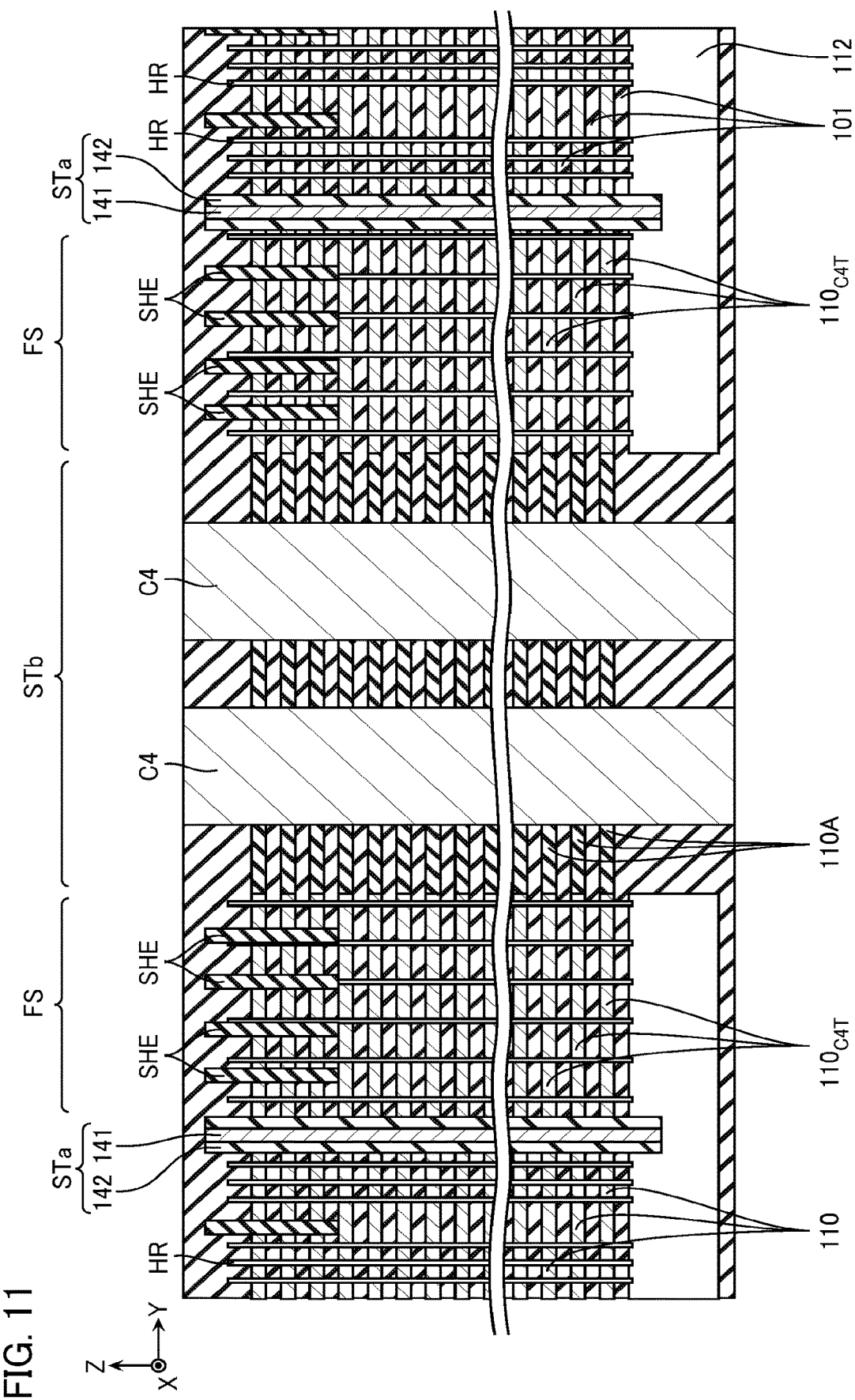
FIG. 11 is a schematic cross-sectional view taking the structure illustrated in FIG. 9 along the line I-I' and viewed along the arrow direction.
Figure 12:
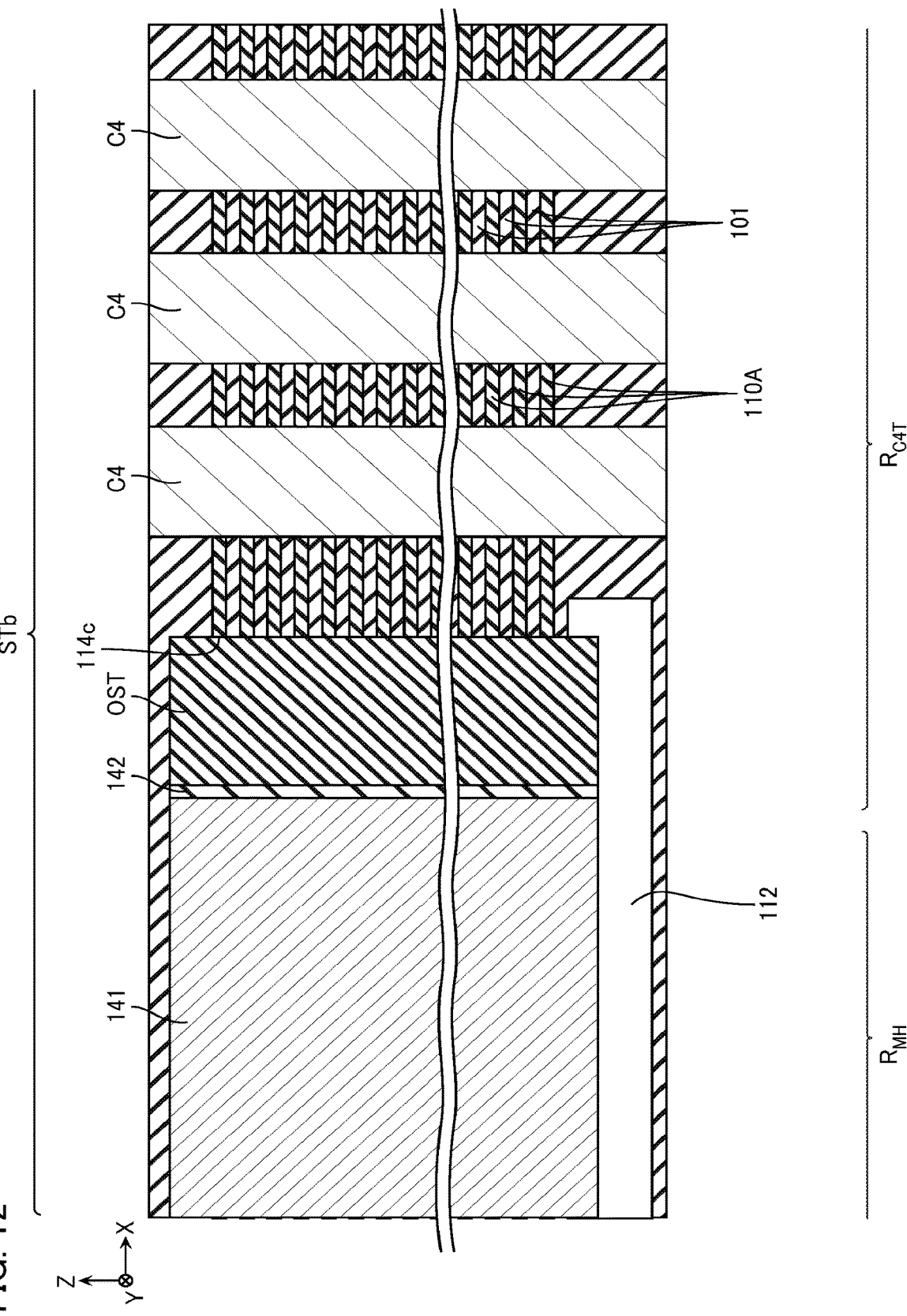
FIG. 12 is a schematic cross-sectional view taking the structure illustrated in FIG. 10 along the line J-J' and viewed along the arrow direction.
Figure 13:
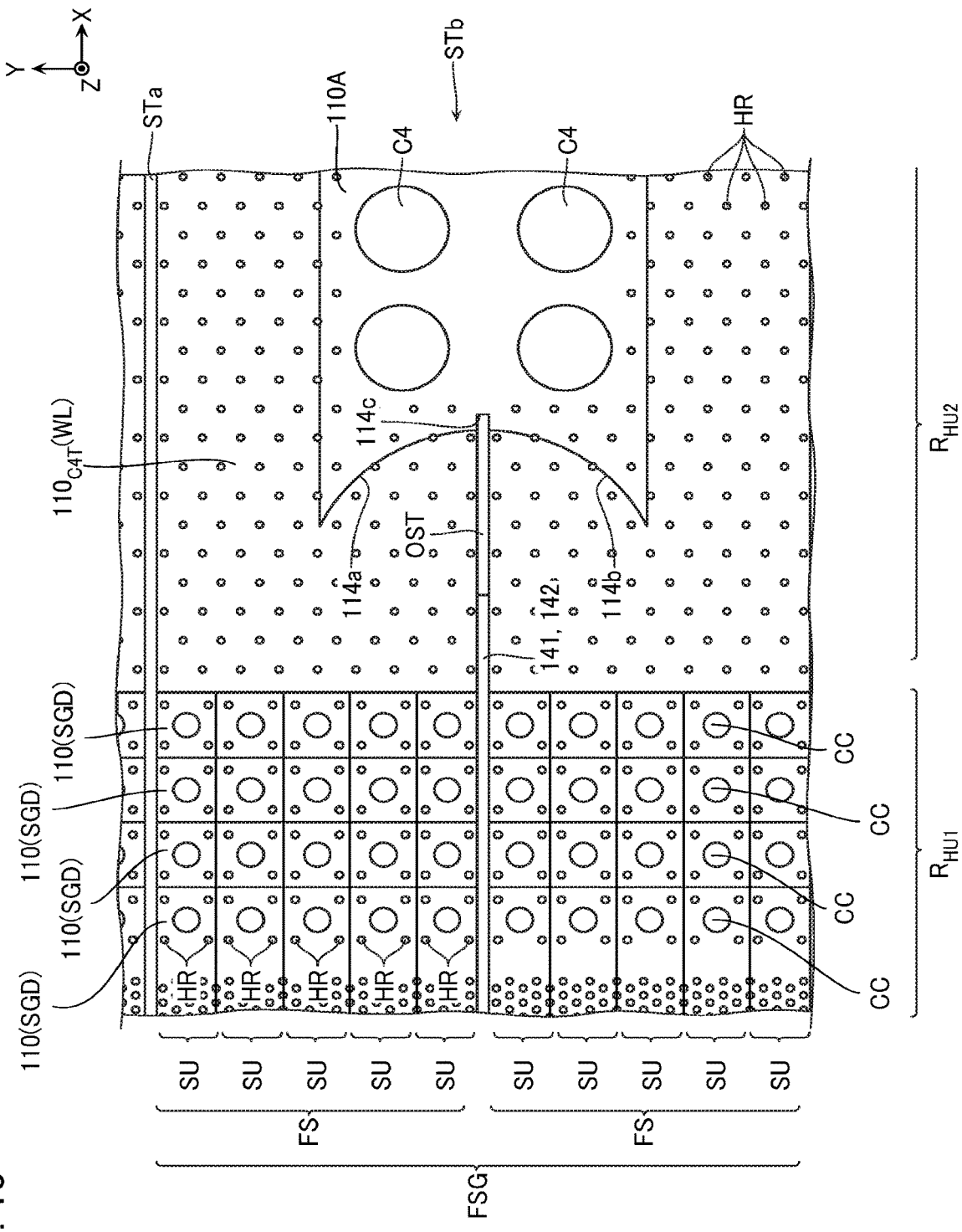
FIG. 13 is a schematic enlarged view of a part indicated by K in FIG. 4.
Figure 14:
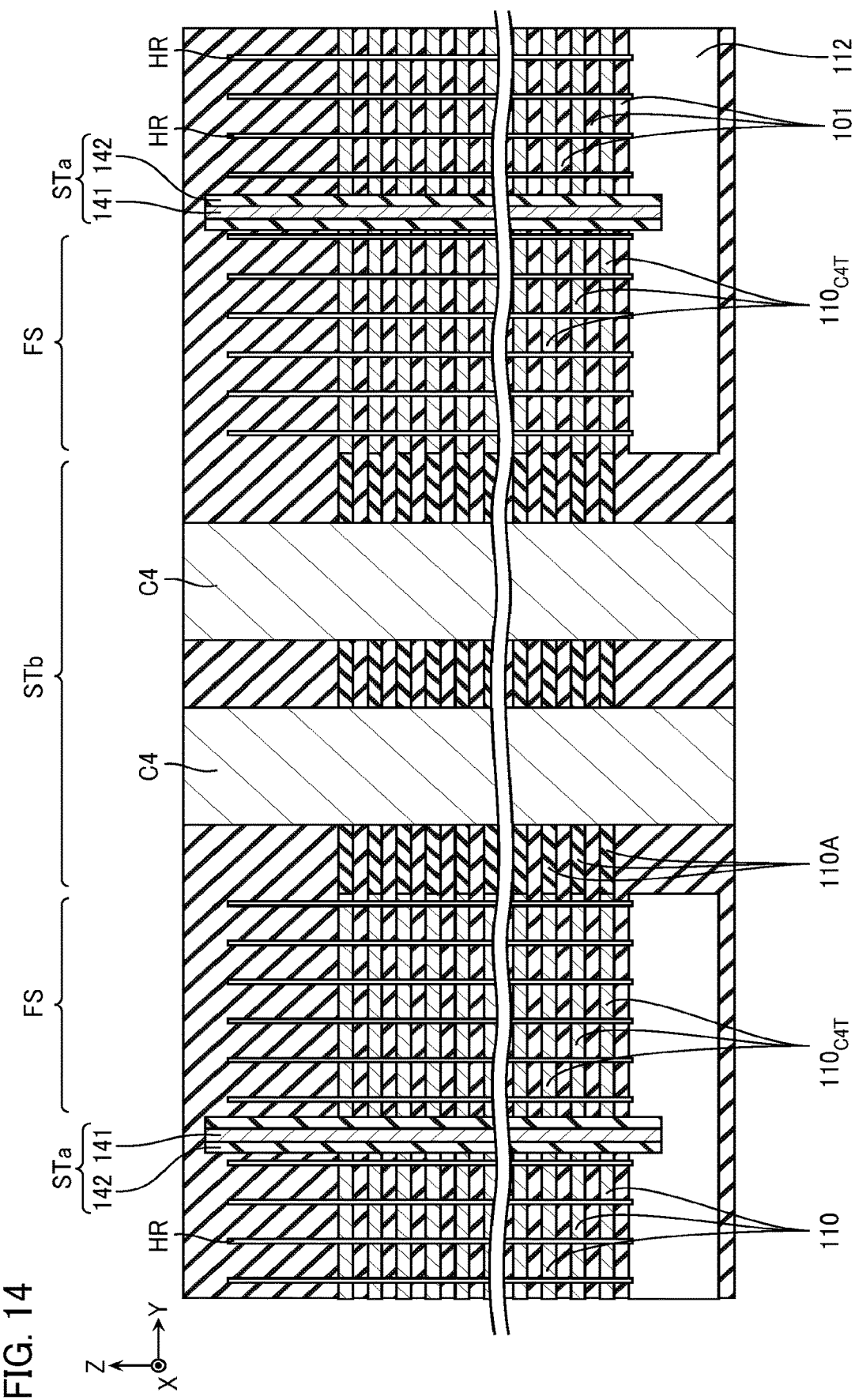
FIG. 14 is a schematic cross-sectional view taking the structure illustrated in FIG. 4 along the line L-L' and viewed along the arrow direction.

FIG. 2 is a schematic plan view of the memory die MD. FIG. 3 is a schematic cross-sectional view of the memory die MD. FIG. 3 is a drawing for describing a schematic configuration of the memory die MD, and does not illustrate the specific number, shape, arrangement, or the like of the configuration. FIG. 4 is a schematic enlarged view of a part indicated by A in FIG. 2. FIG. 5 is a schematic enlarged view of a part indicated by B in FIG. 4. FIG. 6 is a schematic enlarged view of a part indicated by C in FIG. 5. FIG. 7 is a schematic cross-sectional view of the structure illustrated in FIG. 6 taken along the line D-D' viewed along the arrow direction. FIG. 8 is a schematic enlarged view of a part indicated by F in FIG. 7. While FIG. 8 indicates a YZ cross-sectional surface, when other cross-sectional surfaces along a center axis of a semiconductor layer 120 other than the YZ cross-sectional surface (for example, an XZ cross-sectional surface) is observed, a structure similar to that in FIG. 8 is observed. FIG. 9 is a schematic enlarged view of a part indicated by G in FIG. 2. FIG. 10 is a schematic enlarged view of a part indicated by H in FIG. 9. FIG. 11 is a schematic cross-sectional view of the structure illustrated in FIG. 9 taken along the line I-I' viewed along the arrow direction. FIG. 12 is a schematic cross-sectional view of the structure illustrated in FIG. 10 taken along the line J-J' viewed along the arrow direction. FIG. 13 is a schematic enlarged view of a part indicated by K in FIG. 4. FIG. 14 is a schematic cross-sectional view of the structure illustrated in FIG. 4 taken along the line L-L' viewed along the arrow direction.

For example, as illustrated in FIG. 2, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes a plurality of memory hole regions $R_{MH}$ arranged in the X-direction and a plurality of contact connection regions $R_{C4T}$ disposed between these memory hole regions $R_{MH}$. In the center position in the X-direction of the memory cell array region $R_{MCA}$, two first hook-up regions $R_{HU1}$ arranged in the X-direction and two second hook-up region regions $R_{HU2}$ arranged in the X-direction and disposed between the first hook-up regions $R_{HU1}$ are disposed. In an end portion in the Y-direction of the semiconductor substrate 100, a peripheral region $R_P$ is disposed.

For example, as illustrated in FIG. 3, the memory die MD includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA}$ disposed above the wiring layer D2, and a wiring layer M0 disposed above the memory cell array layer $L_{MCA}$.

[Structure of Semiconductor Substrate 100]

For example, the semiconductor substrate 100 includes P-type silicon (Si) containing P-type impurities, such as boron (B). On a surface of the semiconductor substrate 100, an N-type well region containing N-type impurities, such as phosphorus (P), a P-type well region containing P-type impurities, such as boron (B), a semiconductor substrate region in which the N-type well region or the P-type well region is not disposed, and an insulating region 1001 as illustrated in FIG. 3 are disposed.

[Structure of Transistor Layer $L_{TR}$]

For example, as illustrated in FIG. 3, a wiring layer GC is disposed above an upper surface of the semiconductor substrate 100 via an insulating layer (not illustrated). The wiring layer GC includes a plurality of electrodes gc opposed to the surface of the semiconductor substrate 100. The regions of the semiconductor substrate 100 and the plurality of electrodes gc included in the wiring layer GC are each connected to a contact CS.

The N-type well region, the P-type well region, and the semiconductor substrate region of the semiconductor substrate 100 function as channel regions of the plurality of transistors Tr, one electrodes of a plurality of capacitors, and the like constituting the peripheral circuit PC.

The plurality of respective electrodes gc included in the wiring layer GC function as gate electrodes of the plurality of transistors Tr, the other electrodes of the plurality of capacitors, and the like constituting the peripheral circuit PC.

The contact CS extends in the Z-direction and is connected to the semiconductor substrate 100 or an upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

[Structures of Wiring Layer D0, Wiring Layer D1, Wiring Layer D2]

For example, as illustrated in FIG. 3, the plurality of wirings included in the wiring layer D0, the wiring layer D1, and the wiring layer D2 are electrically connected to at least one of the configurations in the memory cell array MCA and the configuration in the peripheral circuit PC.

The wiring layer D0, the wiring layer D1, and the wiring layer D2 include a plurality of wirings do, wirings d1, and wirings d2, respectively. For example, these wirings do, wirings d1, and wirings d2 may include a stacked film of a barrier conductive film, such as titanium nitride (TiN), and a metal film, such as tungsten (W), or the like.

[Structure of Memory Cell Array Layer $L_{MCA}$]

For example, as illustrated in FIG. 3, the memory cell array layer $L_{MCA}$ includes a stacked structure including a plurality of layers L1 stacked so as to be spaced apart from one another in the Z-direction. Furthermore, as exemplified in FIG. 7, an interlayer insulating layer 101 of silicon oxide (SiO$_2$) or the like is disposed between the plurality of layers L1.

For example, as illustrated in FIG. 4, the memory cell array layer $L_{MCA}$ includes a plurality of finger structures FS arranged in the Y-direction. In the embodiment, one finger structure FS functions as one memory block BLK (FIG. 1). However, for example, two or more finger structures FS may function as one memory block BLK (FIG. 1). For example, as illustrated in FIG. 5, the finger structure FS includes the plurality of string units SU arranged in the Y-direction. As illustrated in FIG. 6, an inter-string unit insulating layer SHE of silicon oxide (SiO$_2$) or the like is disposed between the two string units SU mutually adjacent in the Y-direction.

FIG. 4 illustrates a set constituting of two finger structures FS adjacent in the Y-direction as a finger structure group FSG. An inter-finger structure STa is disposed between the two finger structure groups FSG adjacent in the Y-direction. Furthermore, an inter-finger structure STb is disposed between two finger structures FS included in an even-numbered or odd-numbered finger structure group FSG counted from a negative side in the Y-direction. Furthermore, an inter-finger structure STc is disposed between the two finger structures FS included in an odd-numbered or even-numbered finger structure group FSG counted from the negative side in the Y-direction. Note that, in the following description, the inter-finger structures STa, STb, STc may be referred to as inter-finger structures ST.

As described later with reference to FIG. 6 and the like, the inter-finger structure STa includes a conductive layer 141 and an insulating layer 142. Each of members constituting these conductive layer 141 and insulating layer 142 run through the stacked structure including the plurality of layers L1 and the interlayer insulating layers 101 in the X-direction, and extend in the X-direction across the entire memory cell array region $R_{MCA}$ (FIG. 2). Accordingly, the plurality of layers L1 and the interlayer insulating layers 101 are separated in the Y-direction by the inter-finger structure STa.

As described later with reference to FIG. 7 and the like, the inter-finger structures STb, STc include the conductive layer 141 and the insulating layer 142. Each of members constituting the conductive layer 141 and the insulating layer 142 partially run through the stacked structure including the plurality of layers L1 and the interlayer insulating layer 101 in the X-direction, and extend in the X-direction. The plurality of layers L1 and the interlayer insulating layer 101 include portions that are separated in the Y-direction by the inter-finger structures STb, STc, and portions that are not separated in the Y-direction by the inter-finger structures STb, STc.

[Structure in Memory Hole Region $R_{MH}$]

For example, as illustrated in FIG. 7, the finger structure FS includes a plurality of conductive layers 110 disposed in each of the plurality of layers L1, a plurality of semiconductor layers 120 extending in the Z-direction, and a plurality of gate insulating films 130 respectively disposed between the plurality of conductive layers 110 and the plurality of semiconductor layers 120.

The conductive layer 110 is an approximately plate-shaped layer extending in the X-direction. The conductive layer 110 may include a stacked film of a barrier conductive film, such as titanium nitride (TiN), and a metal film, such as tungsten (W), or the like. Furthermore, for example, the conductive layer 110 may contain polycrystalline silicon containing impurities, such as phosphorus (P) or boron (B), or the like.

A conductive layer 112 is disposed below the conductive layers 110. For example, the conductive layer 112 may contain polycrystalline silicon containing impurities, such as phosphorus (P) or boron (B), or the like. Furthermore, the conductive layer 112 may include, for example, a metal, such as tungsten (W), a conductive material, such as tungsten silicide, or another conductive material. Between the conductive layer 112 and the conductive layers 110, the interlayer insulating layer 101 of silicon oxide ($SiO_2$) or the like is disposed.

The conductive layer 112 functions as the source line SL (FIG. 1). The source line SL is, for example, disposed in common among all of the memory blocks BLK included in the memory cell array region $R_{MCA}$ (FIG. 2).

Among the plurality of conductive layers 110, one or a plurality of conductive layers 110 positioned at the lowermost layer function as the source-side select gate line SGS (FIG. 1) and the gate electrodes of the plurality of source-side select transistors STS connected thereto. These conductive layers 110 are electrically independent for each memory block BLK.

A plurality of conductive layers 110 positioned above these conductive layers 110 function as the word lines WL (FIG. 1) and the gate electrodes of the plurality of memory cells MC (FIG. 1) connected thereto. These conductive layers 110 are each electrically independent for each memory block BLK.

One or a plurality of conductive layers 110 positioned above these conductive layers 110 function as the drain-side select gate line SGD and the gate electrodes of the plurality of drain-side select transistors STD (FIG. 1) connected thereto. These conductive layers 110 have a width $Y_{SGD}$ (FIG. 6) in the Y-direction smaller than a width $Y_{WL}$ (FIG. 6) in the Y-direction of the conductive layers 110 that function as the word lines WL. Between two of these conductive layers 110 mutually adjacent in the Y-direction, the inter-string unit insulating layer SHE is disposed. These conductive layers 110 are each electrically independent for each string unit SU.

For example, as illustrated in FIG. 6, the semiconductor layers 120 are arranged in a predetermined pattern in the X-direction and the Y-direction. The semiconductor layers 120 respectively function as channel regions of the plurality of memory cells MC and the select transistors STD, STS included in one memory string MS (FIG. 1). The semiconductor layer 120 contains, for example, polycrystalline silicon (Si) or the like. The semiconductor layer 120 has, for example, as illustrated in FIG. 7, an approximately cylindrical shape and includes an insulating layer 125 of silicon oxide or the like at its center part. Each of the outer peripheral surfaces of the semiconductor layer 120 is surrounded by the conductive layers 110 and is opposed to the conductive layers 110.

On the upper end portion of the semiconductor layer 120, an impurity region 121 containing N-type impurities, such as phosphorus (P), is disposed. In the example of FIG. 7, a boundary line between the upper end portion of the semiconductor layer 120 and the lower end portion of the impurity region 121 is indicated by a dashed line. The impurity region 121 is connected to the bit line BL via a contact Ch and a contact Vy (FIG. 6).

On the lower end portion of the semiconductor layer 120, an impurity region 122 containing N-type impurities, such as phosphorus (P), is disposed. In the example of FIG. 7, a boundary line between the lower end portion of the semiconductor layer 120 and the upper end portion of the impurity region 122 is indicated by a dashed line. The impurity region 122 is connected to the above-described conductive layer 112.

The gate insulating film 130 has an approximately cylindrical shape that covers the outer peripheral surface of the semiconductor layer 120. The gate insulating film 130 includes, for example, as illustrated in FIG. 8, a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$) or the like. The electric charge accumulating film 132 contains, for example, silicon nitride (SiN) or the like and can accumulate electric charge. The tunnel insulating film 131, the electric charge accumulating film 132, and the block insulating film 133, which have approximately cylindrical shapes, extend in the Z-direction along the outer peripheral surface of the semiconductor layer 120 excluding the contact portion of the semiconductor layer 120 and the conductive layer 112.

FIG. 8 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

For example, as illustrated in FIG. 7, the inter-finger structure ST includes the conductive layer 141 extending in the Z-direction and the insulating layer 142 disposed on side surfaces in the Y-direction of the conductive layer 141. The conductive layer 141 and the insulating layer 142 run through the stacked structure including the plurality of layers L1 and the interlayer insulating layers 101 in the X-direction, and extend in the X-direction across the whole region of the memory hole region $R_{MH}$. Accordingly, in the memory hole region $R_{MH}$, the plurality of layers L1 and the plurality of interlayer insulating layers 101 are separated in the Y-direction by the configuration inside the inter-finger structure ST (STa, STb, STc). The conductive layer 141 may include a stacked film of a barrier conductive film, such as titanium nitride (TiN), and a metal film, such as tungsten (W), or the like. The conductive layer 141 may contain, for example, polycrystalline silicon containing impurities, such as phosphorus (P) or boron (B), or the like. The conductive layer 141 may include, for example, a metal, such as tungsten (W), a conductive material, such as tungsten silicide, or another conductive material. The conductive layer 141 functions as a part of the source line SL (FIG. 1). The insulating layer 142 contains, for example, silicon oxide (SiO$_2$) or the like. The conductive layer 141 may be omitted in the inter-finger structure ST, and the insulating layer 142 may constitute not only the side surface part but also the core part of the inter-finger structure ST.

In the illustrated example, a height position of the upper end of the inter-finger structure ST (height position of the upper end of the conductive layer 141 and the insulating layer 142) is disposed above a height position of the upper end of the impurity region 121 disposed on the upper end of the semiconductor layer 120.

[Structure in Contact Connection Region R$_{C4T}$]

In the example of FIG. 10, in the contact connection region R$_{C4T}$, a region positioned at a center in the Y-direction of the finger structure group FSG corresponding to the inter-finger structure STb has a structure including a plurality of contacts C4. Furthermore, a region disposed on one side in the Y-direction with respect to this region and a region disposed on the other side each have a structure including a plurality of conductive layers 110$_{C4T}$. While illustration is omitted, among the plurality of contact connection regions R$_{C4T}$ arranged mutually the X-direction, in the contact connection regions R$_{C4T}$ mutually adjacent in the X-direction with respect to the ones exemplified in FIG. 9 and FIG. 10, the finger structure group FSG corresponding to the inter-finger structure STc may have a configuration similar to the configuration exemplified in FIG. 10. Furthermore, in a part or the entire contact connection regions R$_{C4T}$, all of the inter-finger structures STb and STc may have a configuration exemplified in FIG. 10.

For example, as illustrated in FIG. 11, in the contact connection region R$_{C4T}$, the finger structure FS includes the plurality of conductive layers 110$_{C4T}$ disposed in the respective plurality of layers L1 and a plurality of supporting structures HR extending in the Z-direction.

The conductive layer 110$_{C4T}$ is an approximately plate-shaped layer extending in the X-direction. As illustrated in FIG. 10, the conductive layer 110$_{C4T}$ is continuously formed with the conductive layer 110 disposed in the memory hole region R$_{MH}$ and contains the same material as the conductive layer 110. That is, the conductive layer 110 and the conductive layer 110$_{C4T}$ are each a part of a conductive layer extending across the plurality of memory hole regions R$_{MH}$ and the plurality of contact connection regions R$_{C4T}$ arranged in the X-direction. The width in the Y-direction of at least a part of the conductive layer 110$_{C4T}$ is smaller than the width in the Y-direction of the conductive layer 110.

For example, as illustrated in FIG. 10, the supporting structures HR are arranged in a predetermined pattern in the X-direction and the Y-direction. The supporting structure HR may include, for example, materials similar to those of the semiconductor layer 120, the insulating layer 125, and the gate insulating film 130. The supporting structure HR may include, for example, an insulating layer of silicon oxide (SiO$_2$) or the like.

In the example of FIG. 11, a height position of the upper end of the supporting structure HR is disposed below the height position of the upper end of the inter-finger structure STa. While illustration is omitted, the height position of the upper end of the supporting structure HR matches the height position of the upper end of the impurity region 121 disposed on the upper end of the semiconductor layer 120.

For example, as illustrated in FIG. 11, in the contact connection region R$_{C4T}$, similarly to the configuration inside the memory hole region R$_{MH}$, the inter-finger structure STa includes the conductive layer 141 extending in the Z-direction and the insulating layer 142 disposed on a side surface in the Y-direction of the conductive layer 141. The conductive layer 141 and the insulating layer 142 runs through the stacked structure including the plurality of layers L1 in the X-direction, and extends in the X-direction across the whole region of the contact connection region R$_{C4T}$. Accordingly, in the contact connection region R$_{C4T}$, the plurality of layers L1 and the interlayer insulating layers 101 are separated in the Y-direction by the configuration inside the inter-finger structure STa.

For example, as illustrated in FIG. 11, in the contact connection region R$_{C4T}$, the inter-finger structure STb includes a plurality of insulating layers 110A disposed in each of the plurality of layers L1, and the interlayer insulating layers 101 between these insulating layers 110A, and the plurality of contacts C4 extending in the Z-direction. Furthermore, as illustrated in FIG. 10, the inter-finger structure STb includes an insulating layer OST of silicon oxide (SiO$_2$) or the like connected to one end in the X-direction of the insulating layer 110A. FIG. 10 exemplifies a structure of an end portion on a negative side in the X-direction of the contact connection region R$_{C4T}$. In an end portion on the positive side in the X-direction of the contact connection region R$_{C4T}$, a configuration as exemplified in FIG. 10 being rotated 180° in an XY plane surface is disposed.

Furthermore, as illustrated in FIG. 11, the contact connection region R$_{C4T}$ includes a region in which the plurality of layers L1 and the interlayer insulating layers 101 are not separated in the Y-direction by the configuration inside the inter-finger structure STb. In such region, the plurality of layers L1 and the interlayer insulating layers 101 extend in the Y-direction from a side surface (an edge portion) on the positive side in the Y-direction of the inter-finger structure STa disposed on the negative side in the Y-direction to a side surface (an edge portion) on the negative side in the Y-direction of the inter-finger structure STa disposed on the positive side in the Y-direction.

The insulating layer 110A is an approximately plate-shaped layer extending in the X-direction. The insulating layer 110A may contain silicon nitride (SiN) or the like. As illustrated in FIG. 10, a side surface in the Y-direction of the insulating layer 110A is in contact with the conductive layer 110$_{C4T}$. A side surface in the X-direction of the insulating layer 110A includes side edge portions 114a, 114b, 114c. The side edge portions 114a, 114b are each in contact with two of the conductive layers 110$_{C4T}$ arranged in the Y-direction. The side edge portion 114c is in contact with an insulating layer OST. In the illustrated example, the side edge portions 114a, 114b are formed in a curved shape along a circle centered on the contact part of the insulating layer OST and the insulating layer 142.

As illustrated in FIG. 11, between the respective adjacent insulating layers 110A arranged in the Z-direction, the interlayer insulating layers 101 of silicon oxide (SiO$_2$) or the like are disposed. The interlayer insulating layer 101 is continuously formed with the interlayer insulating layer 101 disposed in the finger structure FS. The interlayer insulating layers 101 between the plurality of insulating layers 110A constitute a part as the inter-finger structure STb in the contact connection region R$_{C4T}$ together with the plurality of insulating layers 110A.

For example, as illustrated in FIG. 10, a plurality of the contacts C4 are arranged in the X-direction. The contact C4 may include a stacked film of a barrier conductive film, such as titanium nitride (TiN), and a metal film, such as tungsten (W), or the like. For example, as illustrated in FIG. 11, the outer peripheral surface of the contact C4 is surrounded by the respective insulating layers 110A and interlayer insulating layers 101 and is connected to these insulating layers 110A and interlayer insulating layers 101. For example, as illustrated in FIG. 3, the contact C4 extends in the Z-direction, is connected to a wiring m0 in the wiring layer M0 at the upper end, and is connected to a wiring d2 in the wiring layer D2 at the lower end.

For example, as illustrated in FIG. 12, the insulating layer OST extends in the Z-direction. Furthermore, the insulating layer OST extends in the X-direction beside the end portion in the X-direction of the contact connection region $R_{C4T}$, and partially runs in the X-direction through the stacked structure including the plurality of layers L1. The insulating layer OST has a side surface on one side in the X-direction in contact with the plurality of insulating layers 110A and the plurality of interlayer insulating layers 101 arranged in the Z-direction. The insulating layer OST has a side surface on the other side in the X-direction connected to the insulating layer 142, and the side surface on the other side follows the insulating layer 142 and runs in the X-direction through the stacked structure including the plurality of layers L1. While illustration is omitted, both side surfaces in the Y-direction of the insulating layer OST are in contact with the plurality of conductive layers $110_{C4T}$ and the plurality of interlayer insulating layers 101 arranged in the Z-direction, excluding a part connected to the insulating layers 110A and the interlayer insulating layers 101. The insulating layer OST has the lower end connected to the conductive layer 112.

For example, as illustrated in FIG. 10, a length $X_{OST}$ in the X-direction of the insulating layer OST has a size at least equal to or more than a half the width $Y_{WL}$ in the Y-direction of the conductive layer 110 that functions as the word line WL. A width $Y_{OST}$ in the Y-direction of the insulating layer OST is equal to a width $Y_{142}$ (the distance between the two conductive layers 110 mutually adjacent in the Y-direction) in the Y-direction of a configuration in which the conductive layer 141 and a pair made of two insulating layers 142 disposed on the side surfaces in the Y-direction of the conductive layer 141 are combined.

In the example of FIG. 12, a height position of the upper end of the insulating layer OST matches the height position of the upper end of the conductive layer 141 and the insulating layer 142. However, the height position of the upper end of the insulating layer OST may be disposed below the height position of the upper end of the conductive layer 141 and the insulating layer 142. While illustration is omitted, the height position of the upper end of the insulating layer OST is disposed above the height position of the upper end of the impurity region 121 disposed on the upper end of the semiconductor layer 120 and the height position of the upper end of the supporting structure HR.

[Structure in First Hook-Up Region $R_{HU1}$]

For example, as illustrated in FIG. 13, in the first hook-up region $R_{HU1}$, the finger structure FS includes terrace portions of the plurality of conductive layers 110 that function as the drain-side select gate lines SGD. The terrace portion is, for example, a portion that does not overlap with the other conductive layers 110 within the upper surface of the conductive layer 110 viewed from above. In the example of FIG. 13, the terrace portion is disposed in an end portion in the X-direction of the conductive layer 110. Furthermore, in the first hook-up region $R_{HU1}$, a plurality of contacts CC arranged in a matrix and the supporting structures HR disposed at each of the proximity of these contacts CC are disposed corresponding to a plurality of the terrace portions.

The contact CC may include a stacked film of a barrier conductive film, such as titanium nitride (TiN), and a metal film, such as tungsten (W), or the like. The contact CC extends in the Z-direction, is connected to the wiring m0 in the wiring layer M0 at the upper end, and is connected to the conductive layer 110 at the lower end.

[Structure in Second Hook-Up Region $R_{HU2}$]

In the example of FIG. 13, in the second hook-up region $R_{HU2}$, the region positioned at a center in the Y-direction of the finger structure group FSG corresponding to the inter-finger structure STb has a structure including a plurality of contacts C4. Furthermore, a region disposed on one side in the Y-direction with respect to this region and a region disposed on the other side each include a structure $R_{HU2}$ including a plurality of conductive layers $110_{C4T}$. While illustration is omitted, in the second hook-up region $R_{HU2}$ adjacent in the X-direction to the second hook-up region $R_{HU2}$ exemplified in FIG. 13, the finger structure group FSG corresponding to the inter-finger structure STc may have a configuration similar to the configuration exemplified in FIG. 13. Furthermore, in one or both of the second hook-up regions $R_{HU2}$, all of the finger structure groups FSG may have a configuration as exemplified in FIG. 13.

As illustrated in FIG. 3, in the second hook-up region $R_{HU2}$, the finger structure FS includes the terrace portions of the plurality of conductive layers 110 that function as the word lines WL or the source-side select gate line SGS. The second hook-up region $R_{HU2}$ includes a plurality of the contacts CC arranged in the X-direction corresponding to the plurality of terrace portions and the supporting structures HR disposed at each of the proximity of these contacts CC. For example, in any one of the second hook-up regions $R_{HU2}$ adjacent to each other in the X-direction, all of the finger structures FS include a configuration as exemplified in FIG. 13.

As illustrated in FIG. 14, in the second hook-up region $R_{HU2}$, similarly to the configuration in the memory hole region $R_{MH}$, the inter-finger structure STa includes the conductive layer 141 extending in the Z-direction and the insulating layer 142 disposed on a side surface in the Y-direction of the conductive layer 141. The conductive layer 141 and the insulating layer 142 run in the X-direction through the stacked structure including a plurality of layers L1, and extend in the X-direction across the whole region of the second hook-up region $R_{HU2}$. Accordingly, in the second hook-up region $R_{HU2}$, the plurality of layers L1 and the interlayer insulating layer 101 are separated in the Y-direction according to the configuration in the inter-finger structure STa.

For example, as illustrated in FIG. 14, in the second hook-up region $R_{HU2}$, the inter-finger structure STb includes a plurality of the insulating layers 110A disposed in each of the plurality of layers L1, the interlayer insulating layers 101 between these insulating layers 110A, and a plurality of the contacts C4 extending in the Z-direction. Furthermore, as illustrated in FIG. 13, the inter-finger structure STb includes the insulating layer OST of silicon oxide ($SiO_2$) or the like connected to the side edge portion 114c in the X-direction of the insulating layer 110A. Note that, FIG. 13 exemplifies a structure in an end portion on the negative side in the X-direction of the second hook-up region $R_{HU2}$. An end portion on the positive side in the X-direction of the second hook-up region $R_{HU2}$ has a structure in the second hook-up region $R_{HU2}$ exemplified in FIG. 13 being rotated 180° in an XY plane surface.

[Structure of Wiring Layer M0]

For example, as illustrated in FIG. 3, the plurality of wirings m0 included in the wiring layer M0 are electrically connected to at least one of the configuration in the memory cell array layer $L_{MCA}$ and the configuration in the transistor layer $L_{TR}$. For example, these wirings m0 may include a stacked film of a barrier conductive film, such as titanium nitride (TiN), and a metal film, such as copper (Cu), or the like. A part of the plurality of wirings m0 function as the bit lines BL (FIG. 6). For example, as illustrated in FIG. 6, the bit lines BL are arranged in the X-direction and extend in the Y-direction. These bit lines BL are each connected to one semiconductor layer 120 included in each string unit SU.

[Manufacturing Method]

Figure 23:
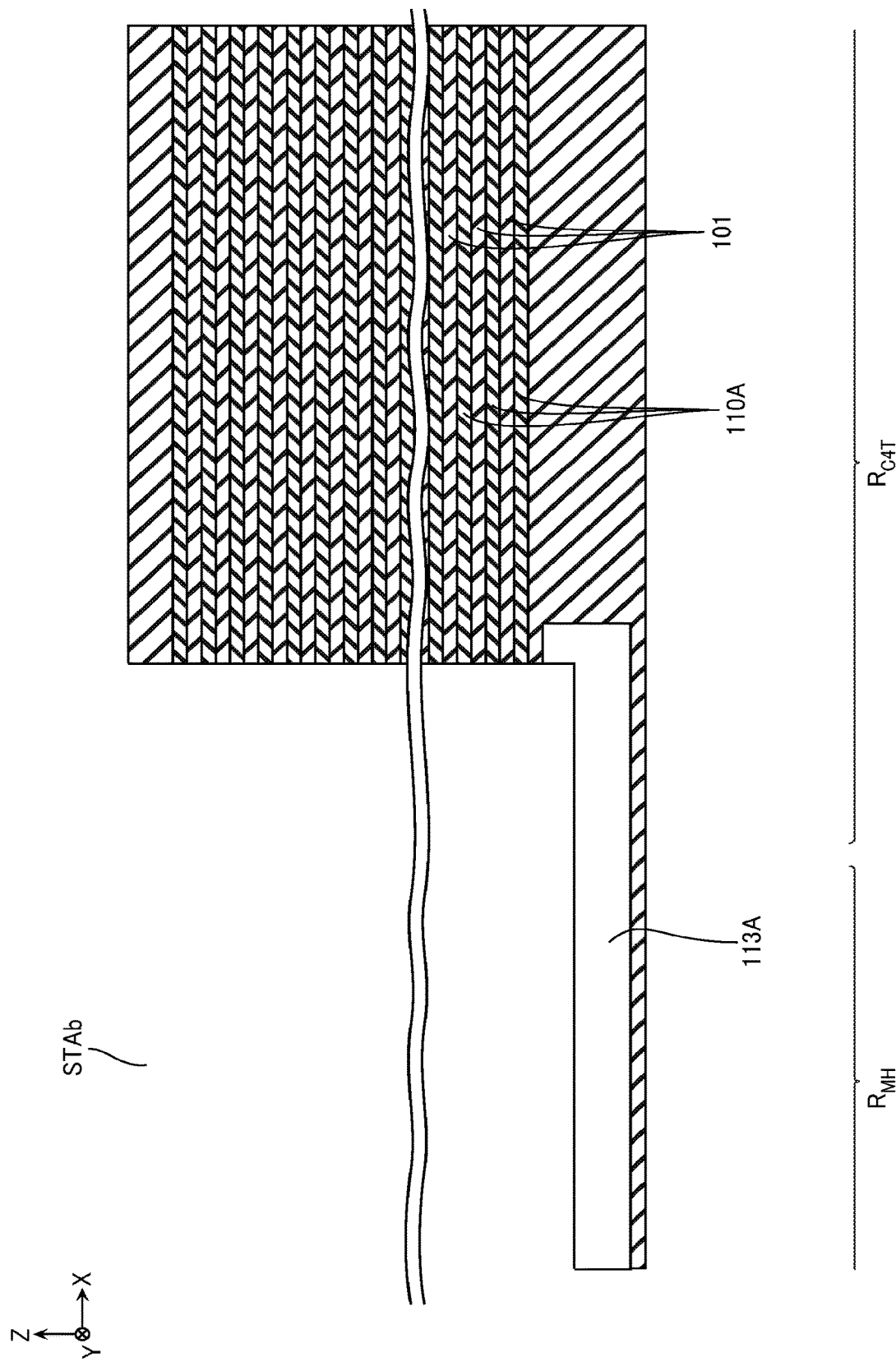
FIG. 23 is a schematic cross-sectional view for describing the same manufacturing method.

Next, with reference to FIG. 15 to FIG. 38, a method for manufacturing the memory die MD is described. FIG. 15, FIG. 16, FIG. 18, FIG. 20, FIG. 26 to FIG. 30, FIG. 34, and FIG. 37 are schematic cross-sectional views for describing the manufacturing method and illustrate the cross-sectional surface corresponding to FIG. 7. FIG. 21, FIG. 24, FIG. 31, FIG. 32, and FIG. 35 are schematic plan views for describing the manufacturing method and illustrate the plane corresponding to FIG. 10. FIG. 17, FIG. 19, FIG. 22, FIG. 33, FIG. 36, and FIG. 38 are schematic cross-sectional views for describing the manufacturing method and illustrate the cross-sectional surface corresponding to FIG. 11. FIG. 23 and FIG. 25 are schematic cross-sectional views for describing the manufacturing method and illustrate the cross-sectional surface corresponding to FIG. 12.

In the manufacture of the memory die MD according to the embodiment, first, the transistor layer $L_{TR}$, the wiring layer D0, the wiring layer D1, and the wiring layer D2 (FIG. 3) are formed on the semiconductor substrate 100. On an upper surface of the wiring layer D2, the interlayer insulating layer 101 is formed.

Figure 15:
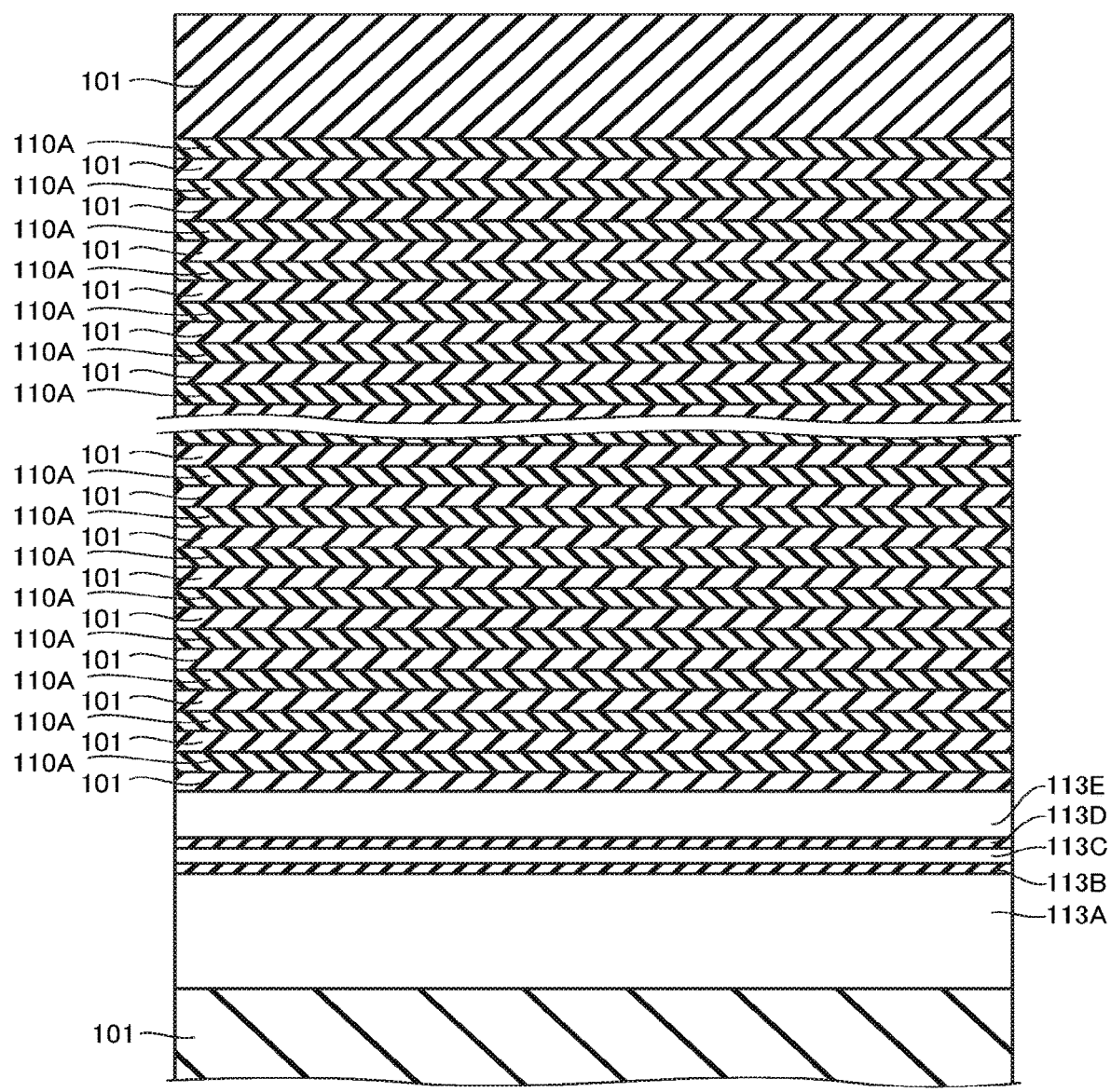
FIG. 15 is a schematic cross-sectional view for describing a manufacturing method of a semiconductor memory device according to the first embodiment.

Next, for example, as illustrated in FIG. 15, on the interlayer insulating layer 101, a semiconductor layer 113A of silicon or the like, a sacrifice layer 113B of silicon oxide or the like, a sacrifice layer 113C of silicon or the like, a sacrifice layer 113D of silicon oxide or the like, and a semiconductor layer 113E of silicon or the like are formed. The plurality of interlayer insulating layers 101 and the plurality of insulating layers 110A are alternately formed. This process is performed by, for example, a method, such as Chemical Vapor Deposition (CVD).

Figure 16:
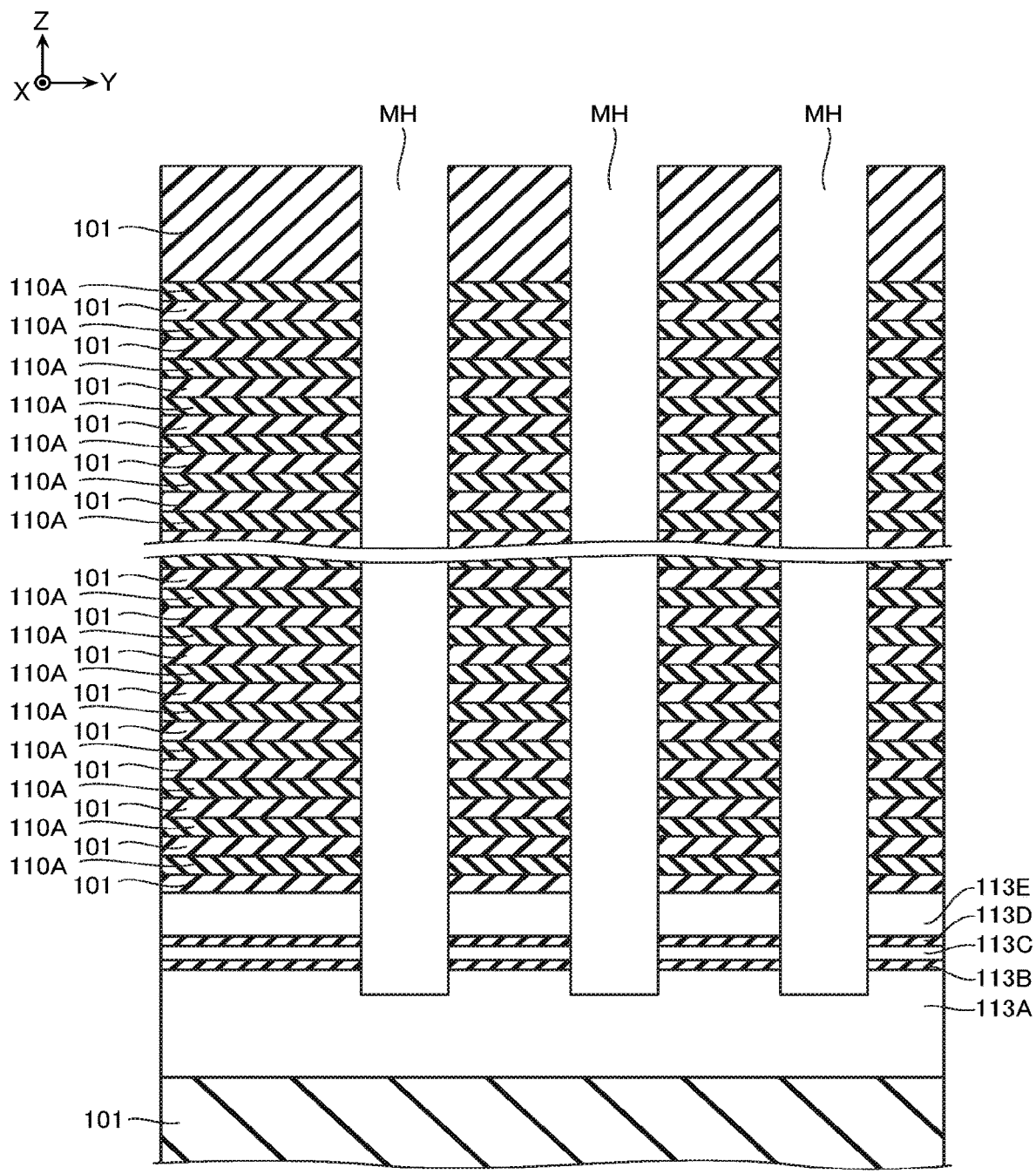
FIG. 16 is a schematic cross-sectional view for describing the same manufacturing method.

Next, for example, as illustrated in FIG. 16, a plurality of memory holes MH are formed at the positions corresponding to the semiconductor layers 120. The memory hole MH is a through hole that extends in the Z-direction, penetrates the plurality of interlayer insulating layers 101 and the plurality of insulating layers 110A, the sacrifice layer 113B, the sacrifice layer 113C, the sacrifice layer 113D, and the semiconductor layer 113E, and causes the upper surface of the semiconductor layer 113A to be exposed. This process is performed by, for example, a method, such as Reactive Ion Etching (RIE).

Figure 17:
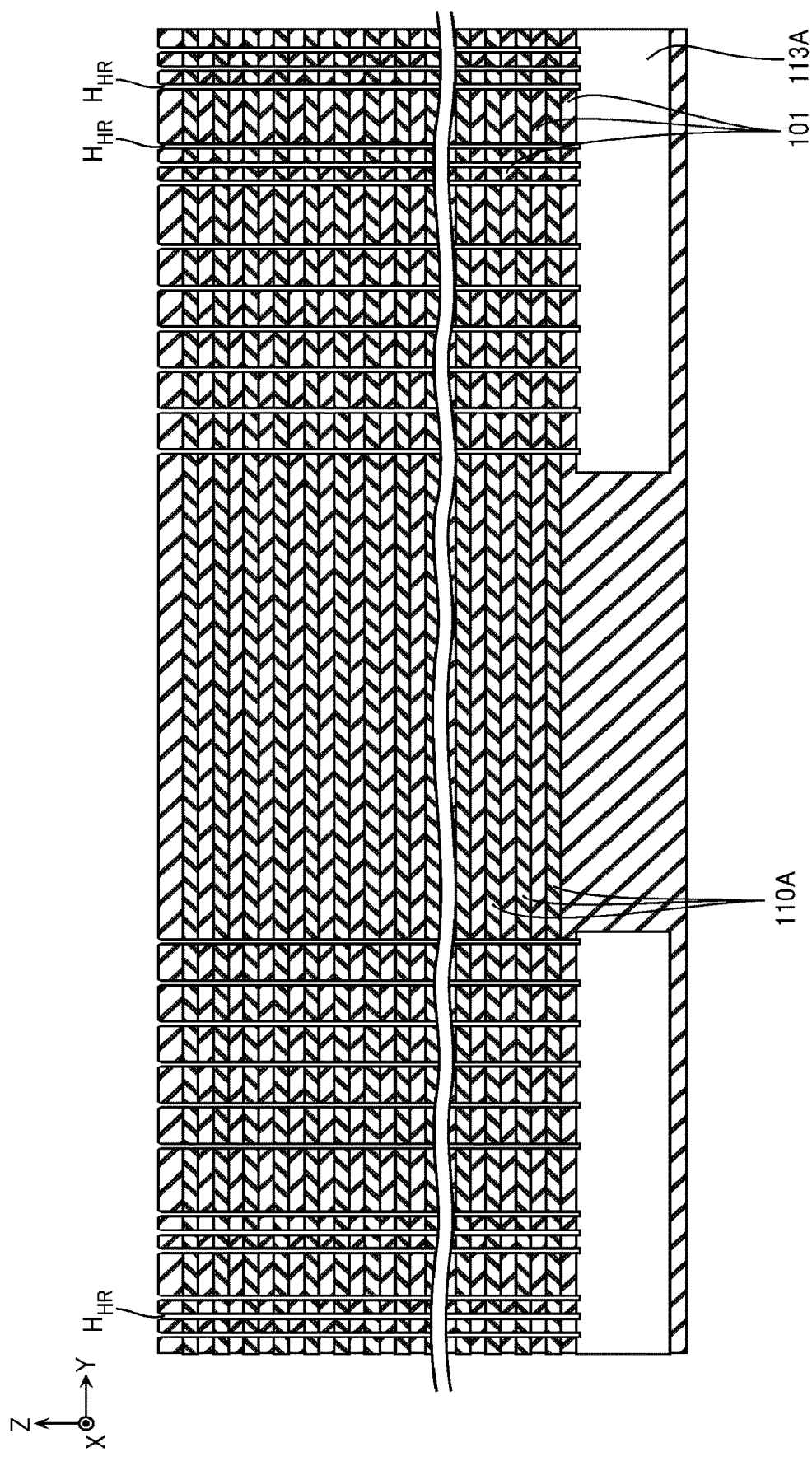
FIG. 17 is a schematic cross-sectional view for describing the same manufacturing method.

For example, as illustrated in FIG. 17, in this process, a plurality of through holes $H_{HR}$ may be formed at the positions corresponding to the supporting structures HR. The through holes $H_{HR}$ are formed similarly to the memory holes MH.

Figure 18:
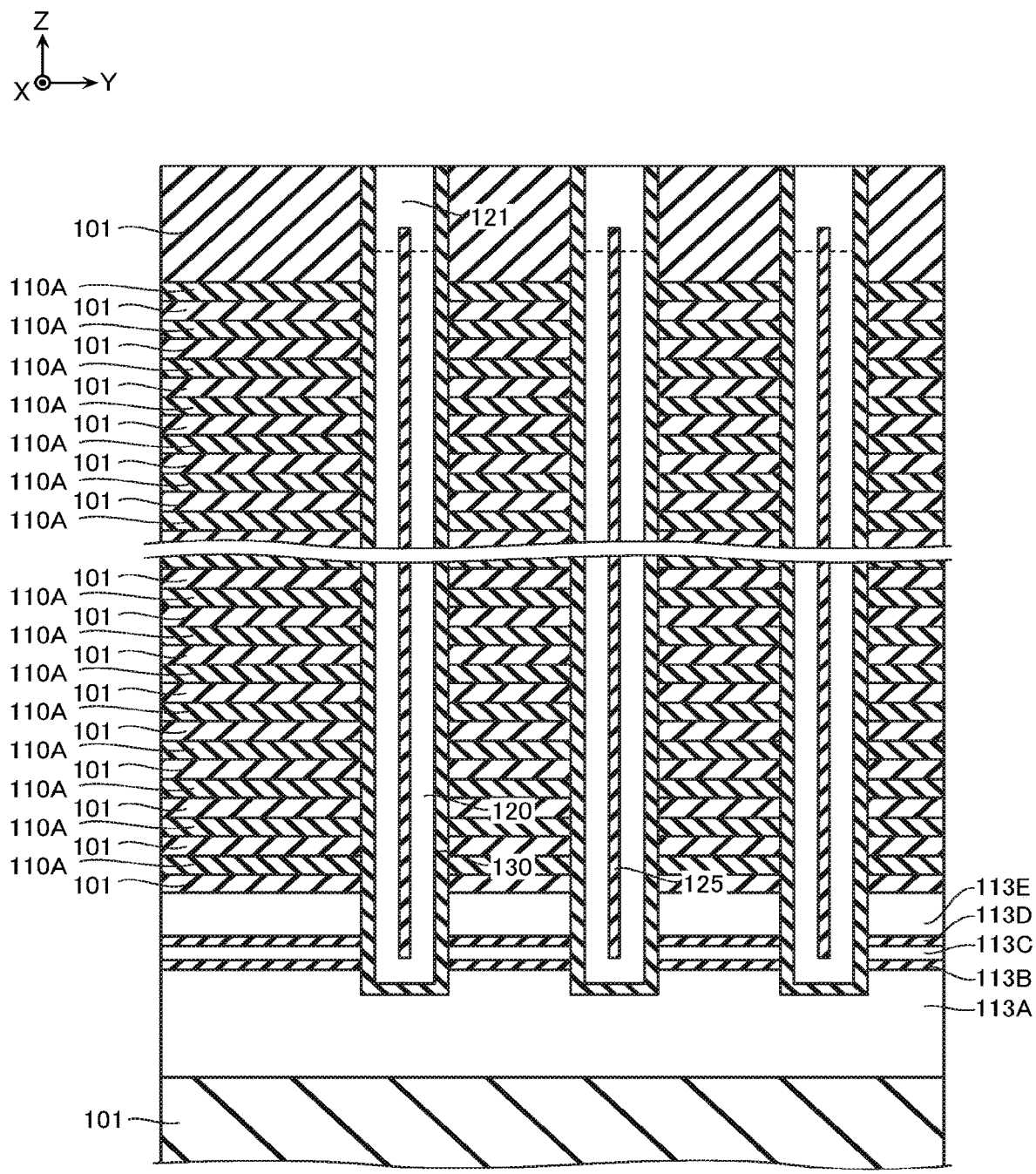
FIG. 18 is a schematic cross-sectional view for describing the same manufacturing method.

Next, for example, as illustrated in FIG. 18, inside the memory hole MH, the gate insulating film 130, the semiconductor layer 120, the insulating layer 125, and the impurity region 121 are formed. In this process, for example, a film is formed by CVD or the like, and an amorphous silicon film is formed inside the memory hole MH. For example, by an annealing process or the like, a crystalline structure of this amorphous silicon film is modified.

Figure 19:
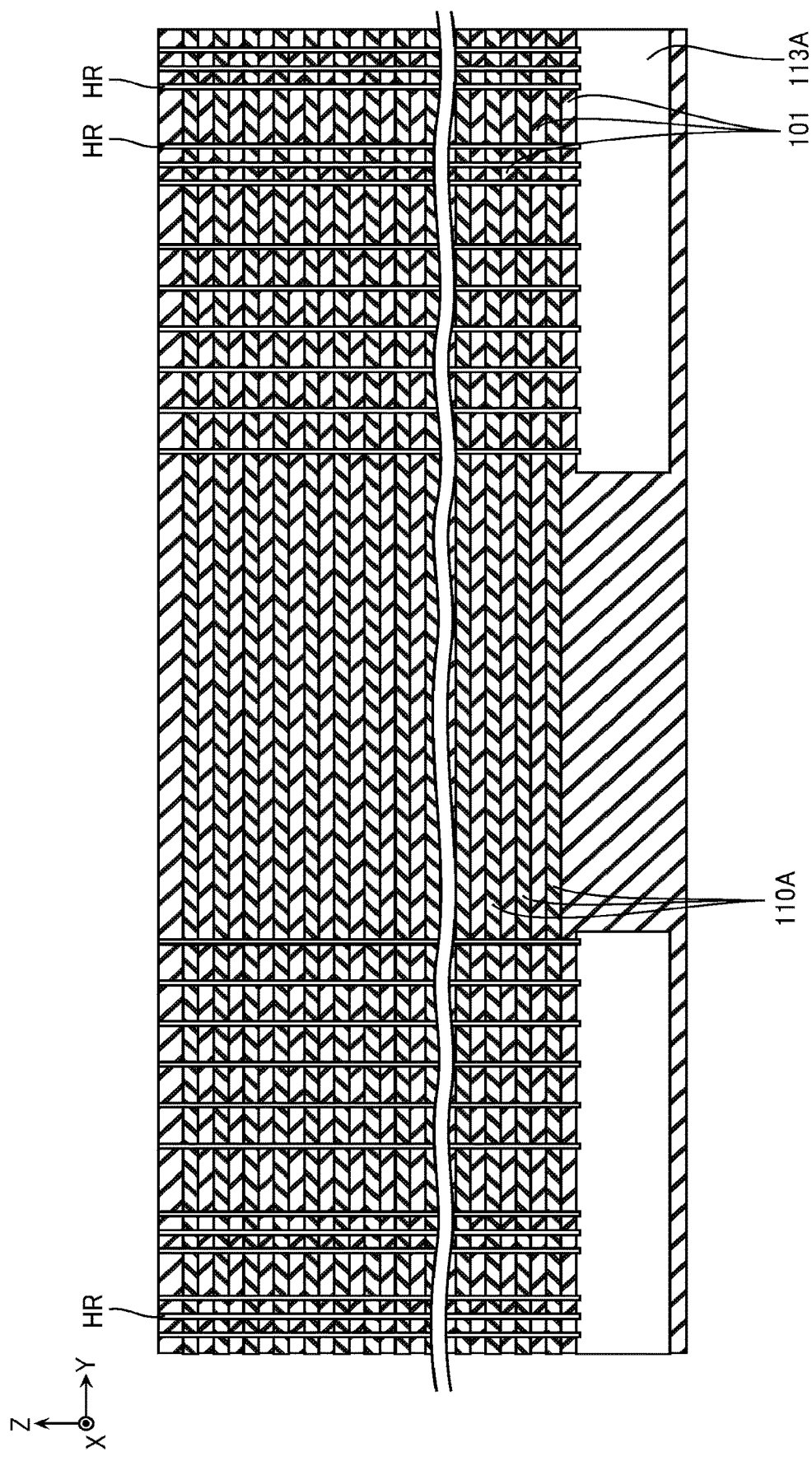
FIG. 19 is a schematic cross-sectional view for describing the same manufacturing method.
Figure 20:
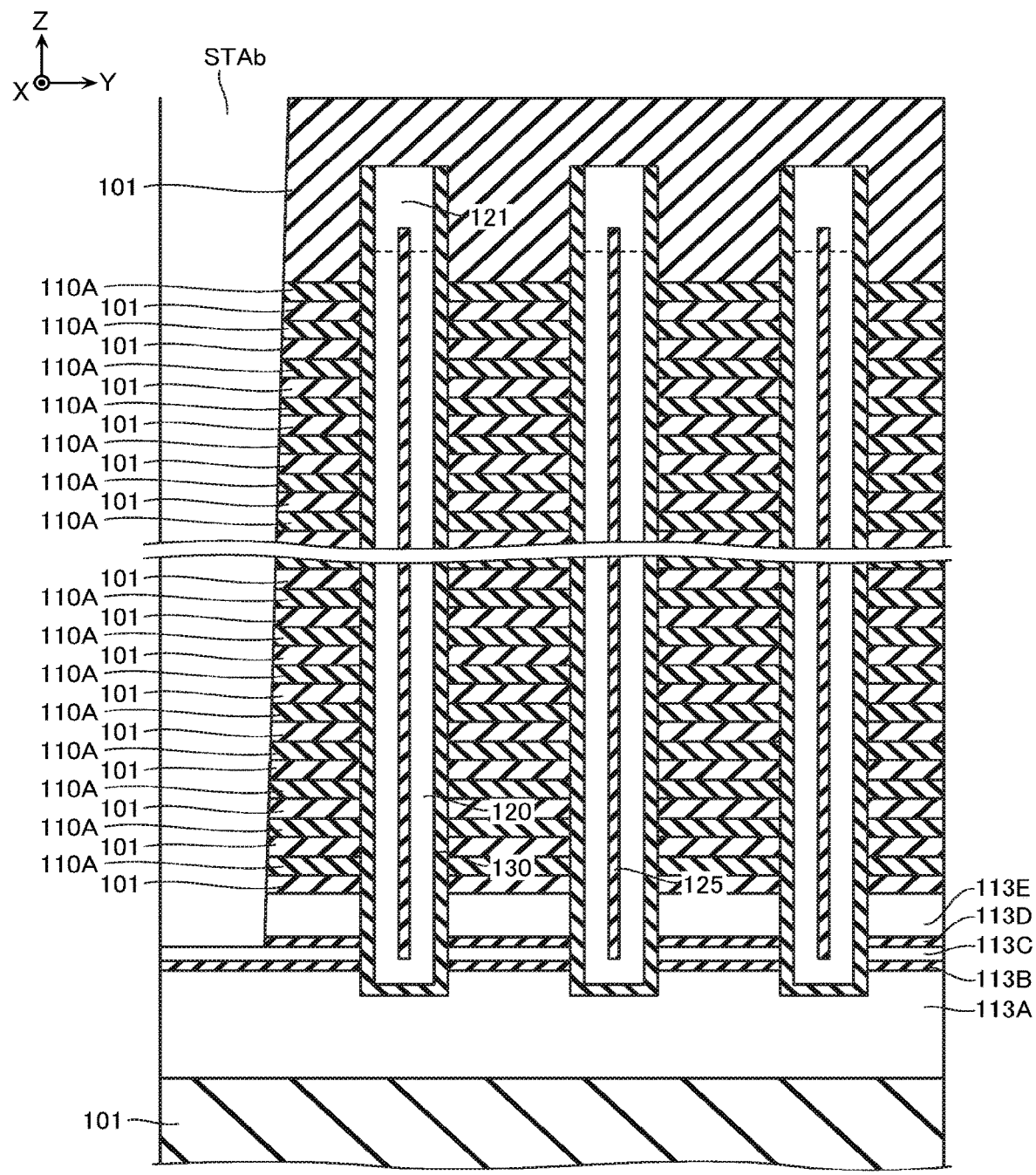
FIG. 20 is a schematic cross-sectional view for describing the same manufacturing method.
Figure 21:
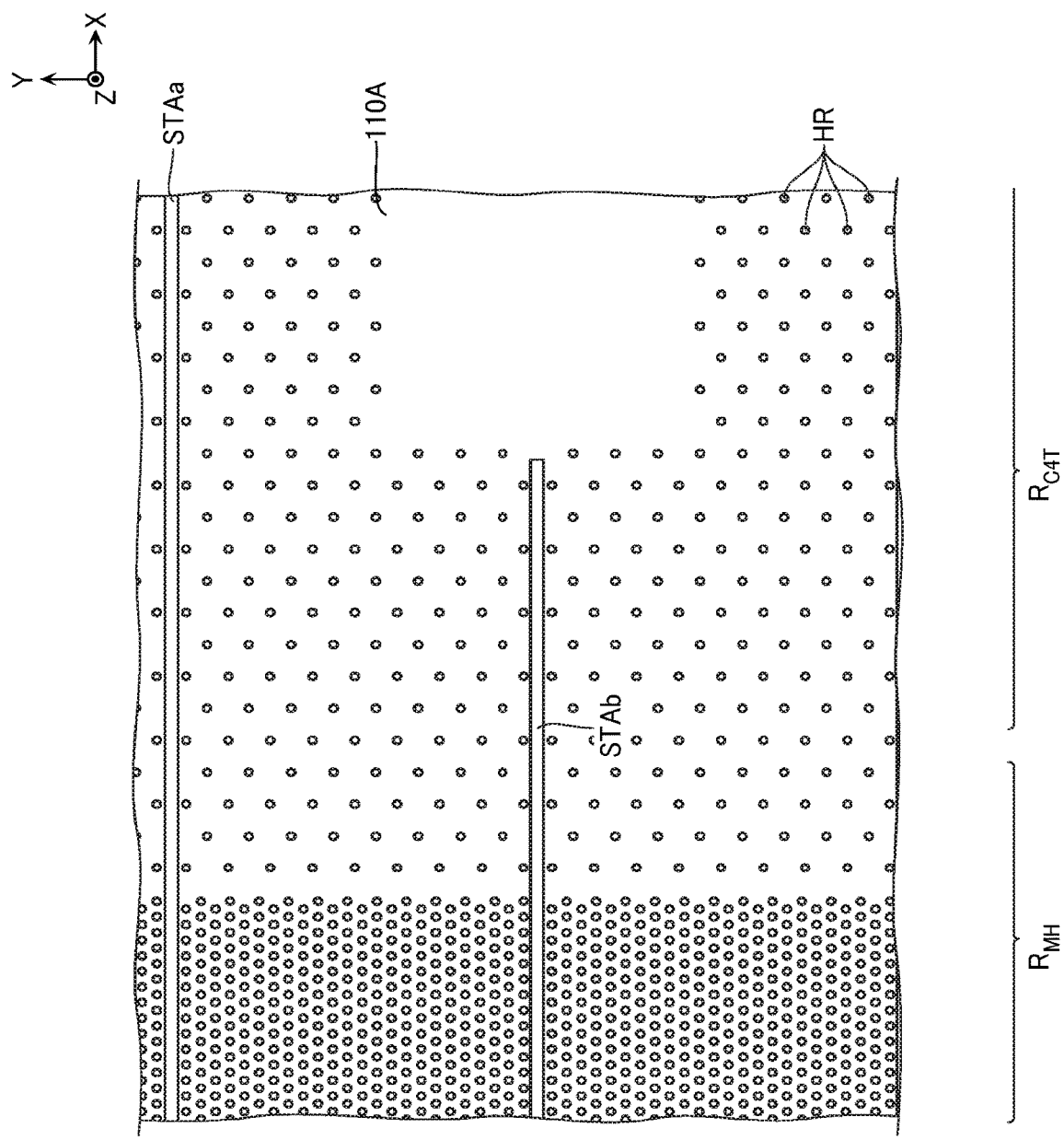
FIG. 21 is a schematic plan view for describing the same manufacturing method.
Figure 22:
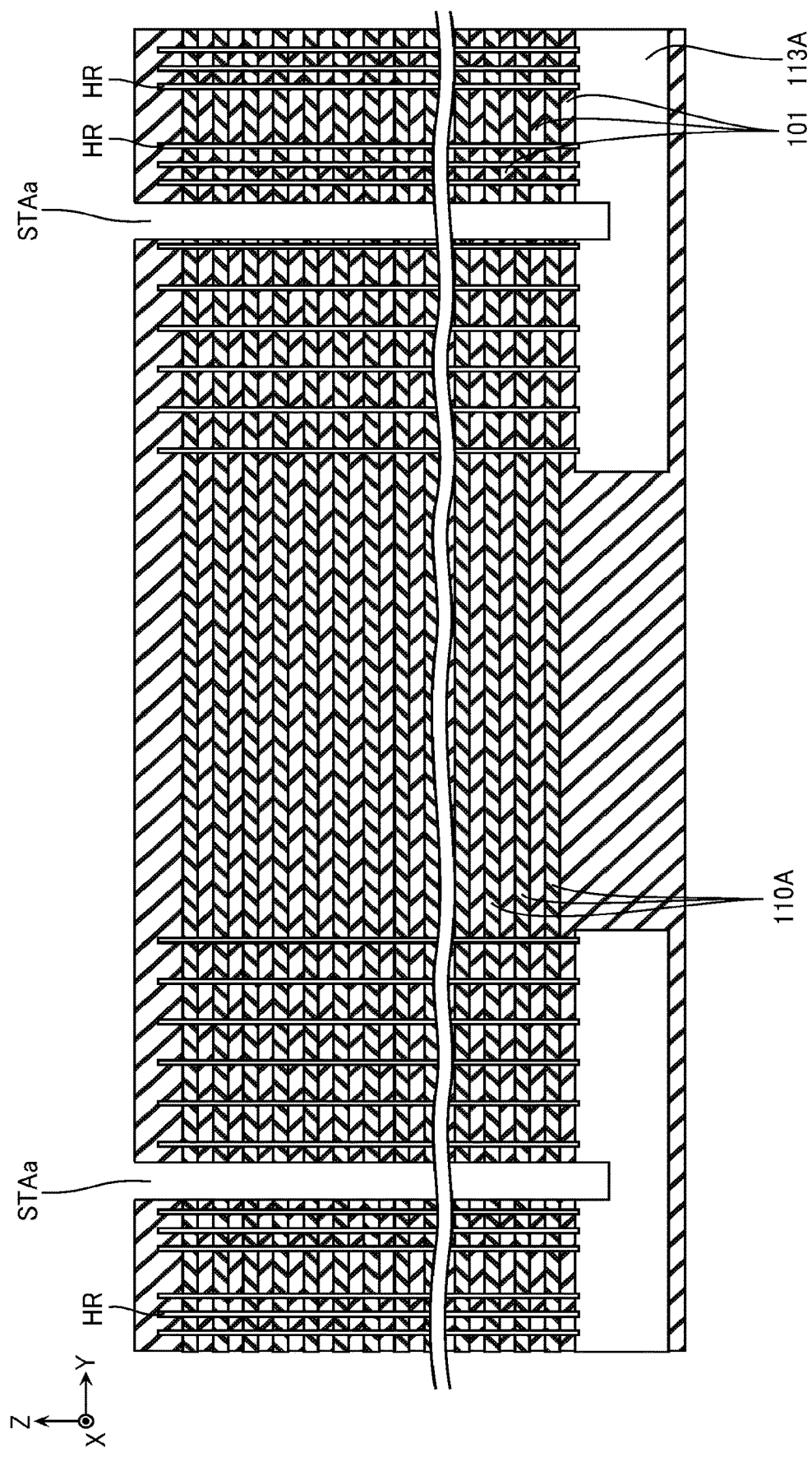
FIG. 22 is a schematic cross-sectional view for describing the same manufacturing method.

For example, as illustrated in FIG. 19, in this process, inside the through hole $H_{HR}$, the supporting structure HR may be formed. In this case, the supporting structure HR may have structures similar to those of the gate insulating film 130, the semiconductor layer 120, the insulating layer 125, and the impurity region 121.

Next, for example, as illustrated in FIG. 20 to FIG. 23, a trench STAa is formed in the position corresponding to the inter-finger structure STa. Furthermore, a trench STAb is formed at the position corresponding to a part of the inter-finger structure STb. While illustration is omitted, a trench is formed also in the position corresponding to a part of the inter-finger structure STc. These trenches STAa, STAb, and the like extend in the Z-direction and the X-direction, at least partially separate the plurality of interlayer insulating layers 101 and the plurality of insulating layers 110A, the semiconductor layer 113E, and the sacrifice layer 113D in the Y-direction, and cause the upper surface of the sacrifice layer 113C to be exposed. This process is performed by, for example, a method, such as RIE. Note that, in the following description, the trenches STAa, STAb and the like may be referred to as a trench STA.

Figure 24:
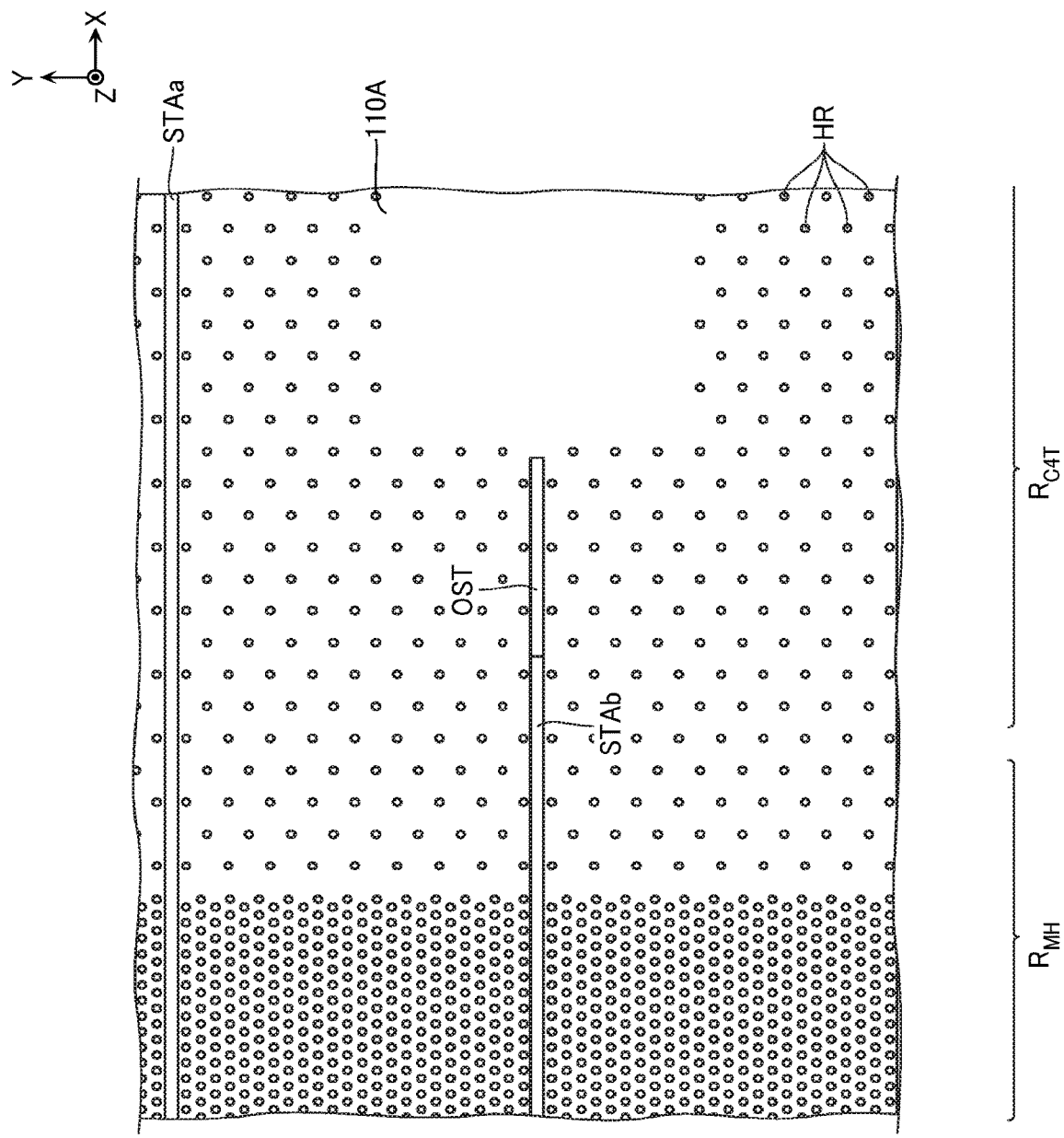
FIG. 24 is a schematic plan view for describing the same manufacturing method.
Figure 25:
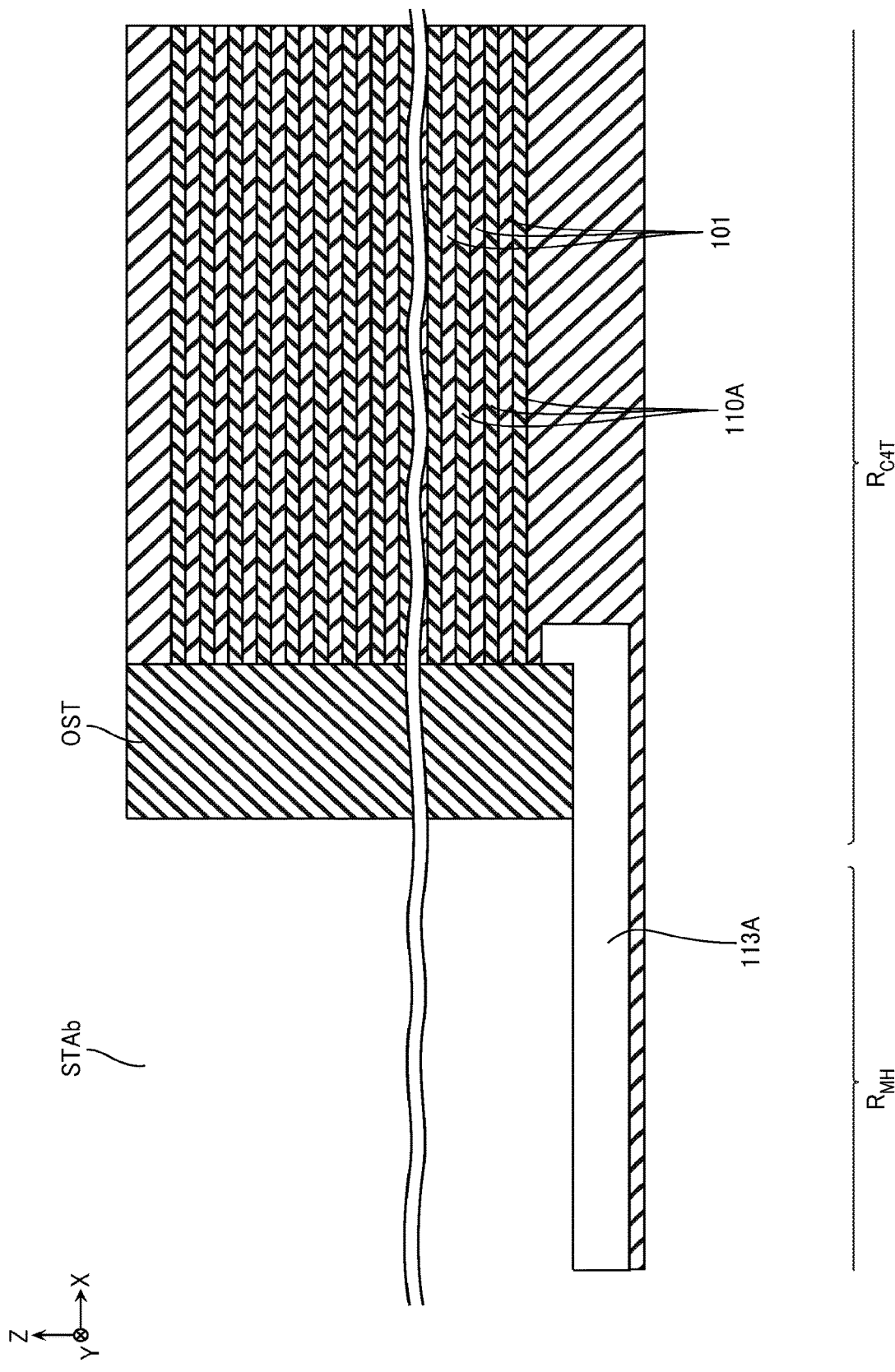
FIG. 25 is a schematic cross-sectional view for describing the same manufacturing method.

Next, for example, as illustrated in FIG. 24 and FIG. 25, the insulating layer OST is formed in the trench STAb. This process is performed by, for example, a method, such as photolithography and CVD.

Figure 26:
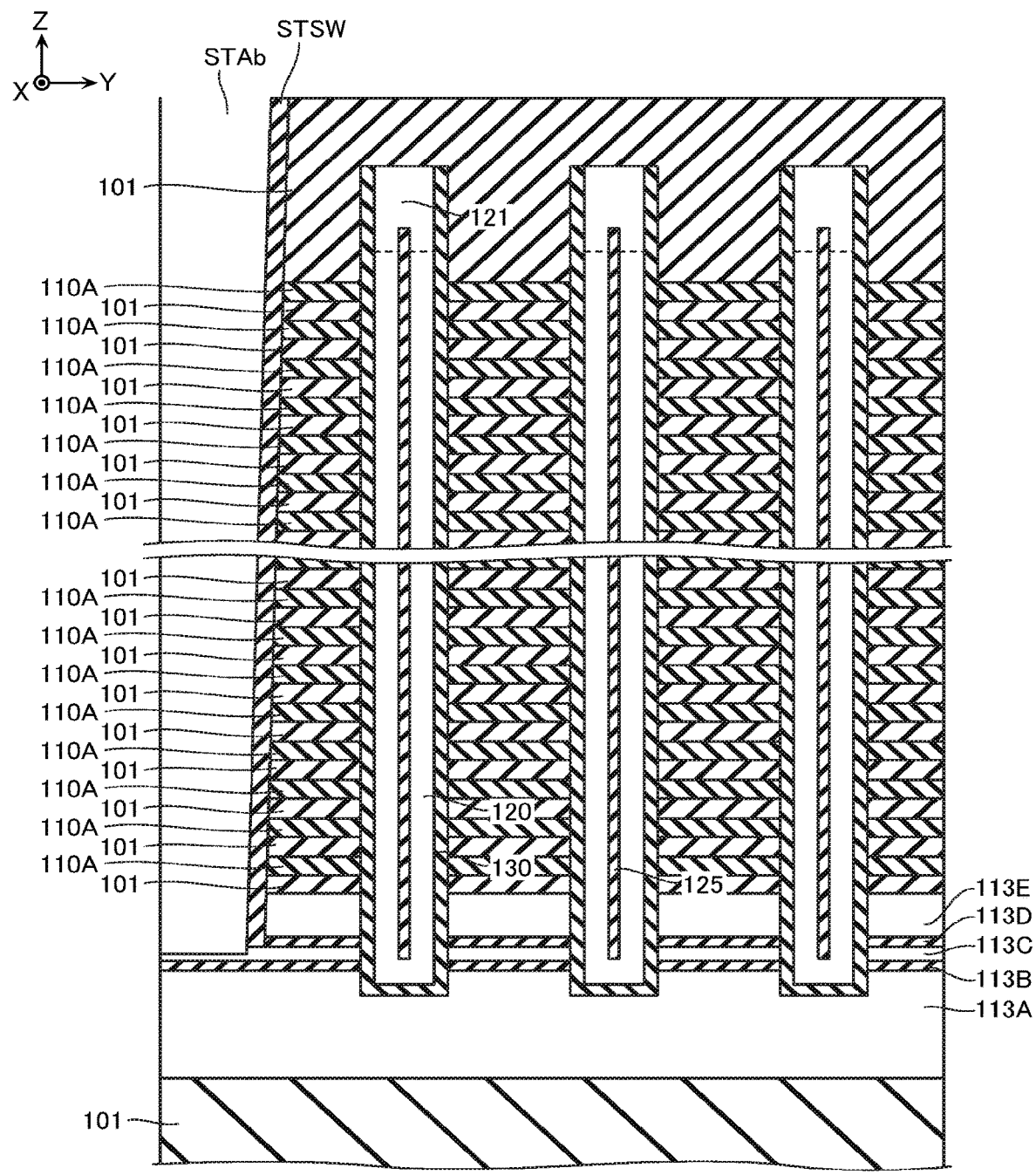
FIG. 26 is a schematic cross-sectional view for describing the same manufacturing method.

Next, for example, as illustrated in FIG. 26, a protective film STSW of silicon nitride or the like is formed on the side surface in the Y-direction of the trench STA. In this process, for example, insulating films of silicon nitride or the like are formed on the side surface in the Y-direction and the bottom surface of the trench STA by a method, such as CVD. A part of the insulating film covering the bottom surface of the trench STA is removed by a method, such as RIE.

Figure 27:
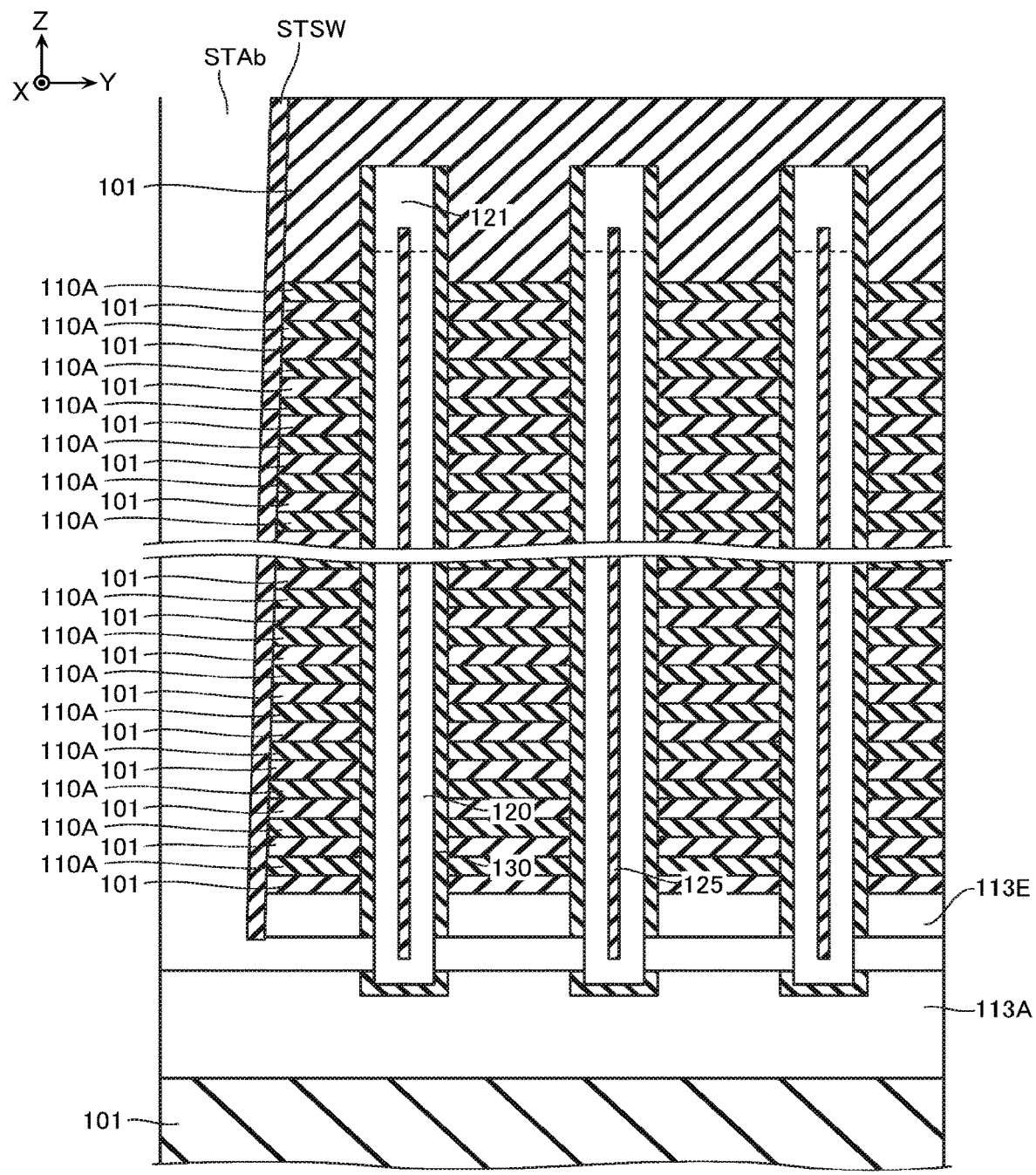
FIG. 27 is a schematic cross-sectional view for describing the same manufacturing method.

Next, for example, as illustrated in FIG. 27, the sacrifice layer 113B, the sacrifice layer 113C, the sacrifice layer 113D, and a part of the gate insulating films 130 are removed to cause a part of the semiconductor layers 120 to be exposed. This process is performed by, for example, a method, such as wet etching.

Figure 28:
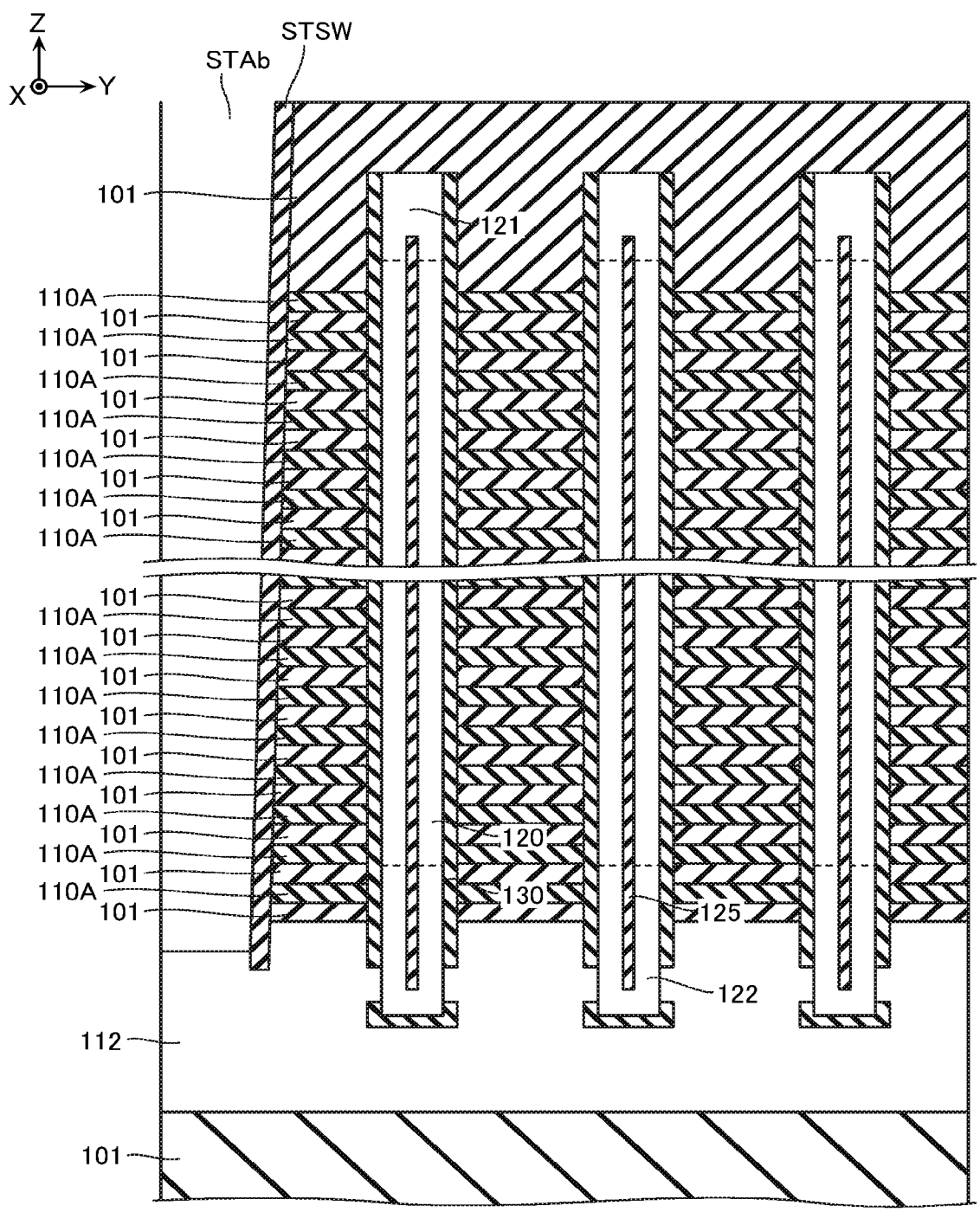
FIG. 28 is a schematic cross-sectional view for describing the same manufacturing method.

Next, for example, as illustrated in FIG. 28, the conductive layer 112 and the impurity region 122 are formed. This process is performed by, for example, a method, such as epitaxial growth.

Figure 29:
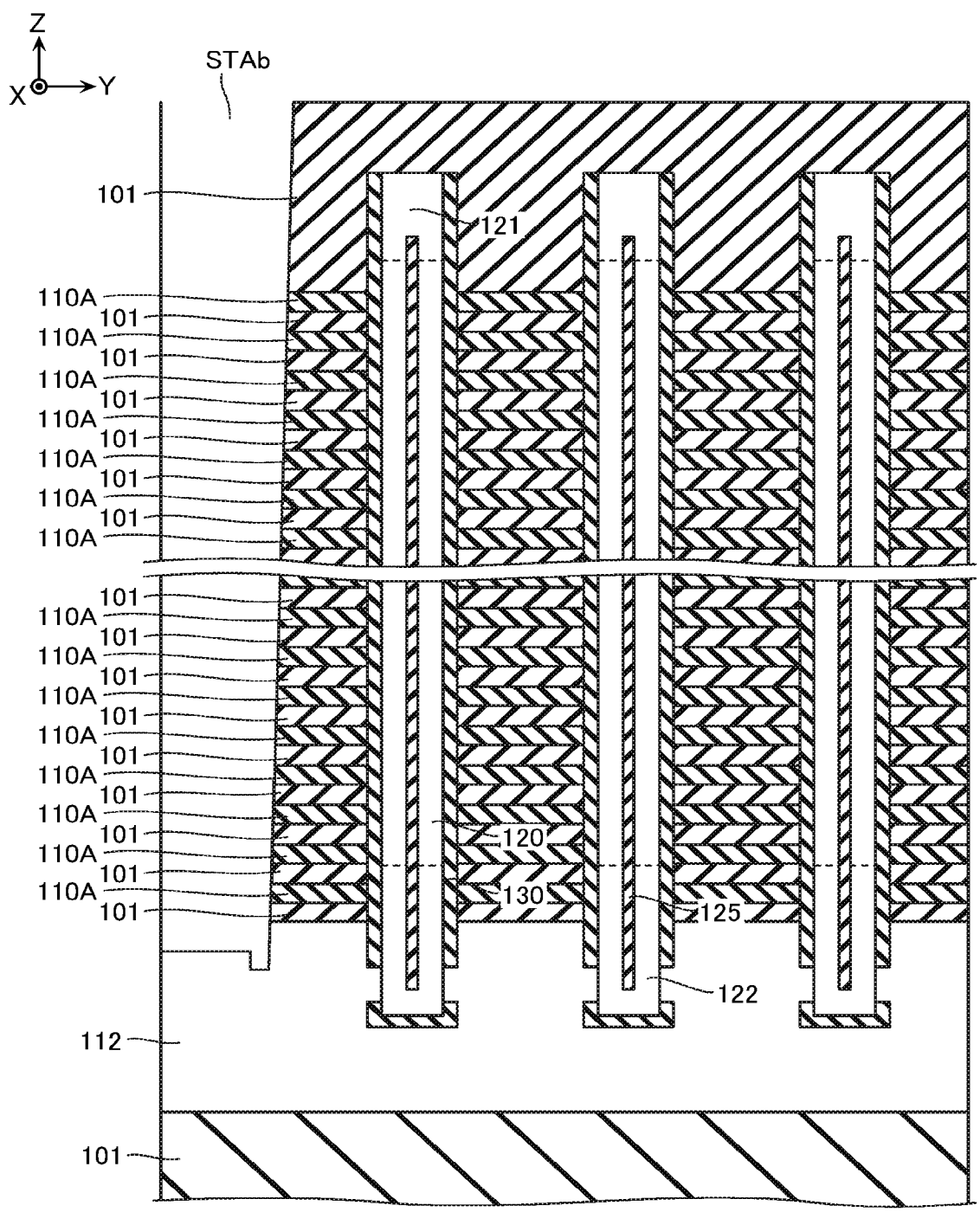
FIG. 29 is a schematic cross-sectional view for describing the same manufacturing method.
Figure 30:
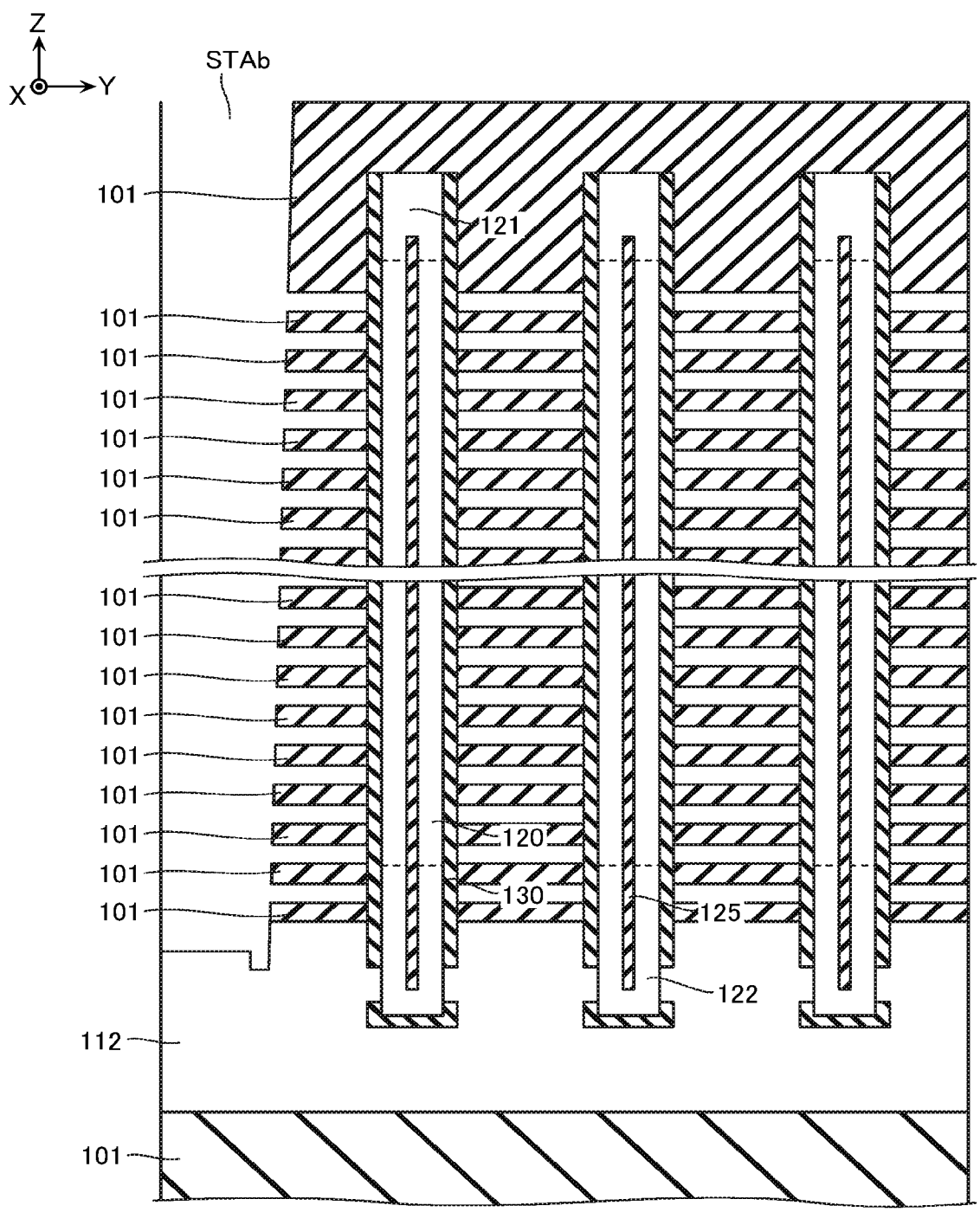
FIG. 30 is a schematic cross-sectional view for describing the same manufacturing method.

Next, for example, as illustrated in FIG. 29, the protective film STSW is removed. This process is performed by, for example, a method, such as wet etching.

Next, for example, as illustrated in FIG. 30 to FIG. 33, the insulating layers 110A are removed via the trench STA. Thus, a hollow structure including the plurality of interlayer insulating layers 101 arranged in the Z-direction, a structure inside the memory holes MH (the semiconductor layer 120, the gate insulating film 130, and the insulating layer 125) and the supporting structures HR supporting these interlayer insulating layers 101 are formed. This process is performed by, for example, a method, such as wet etching.

Figure 31:
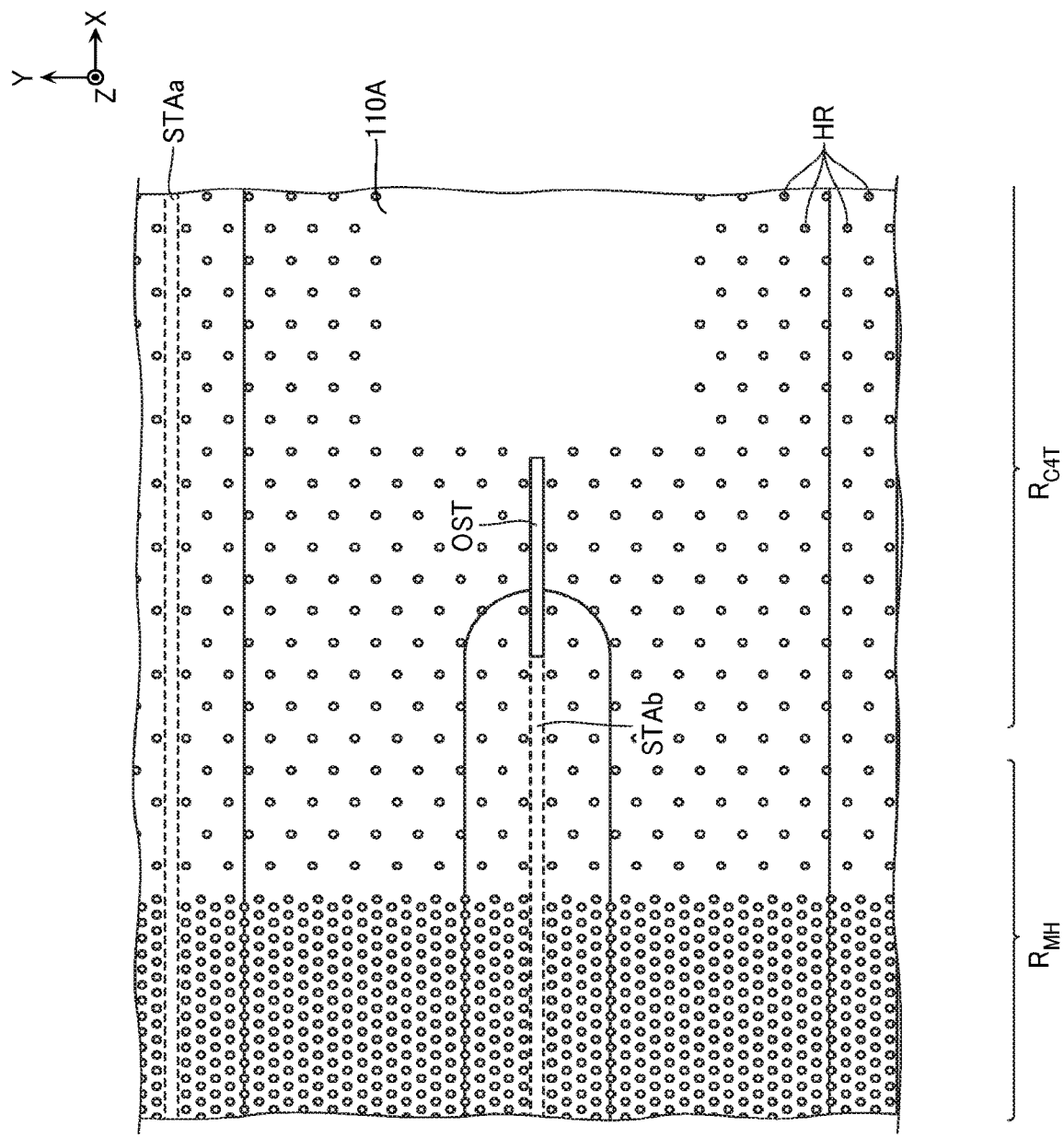
FIG. 31 is a schematic plan view for describing the same manufacturing method.
Figure 32:
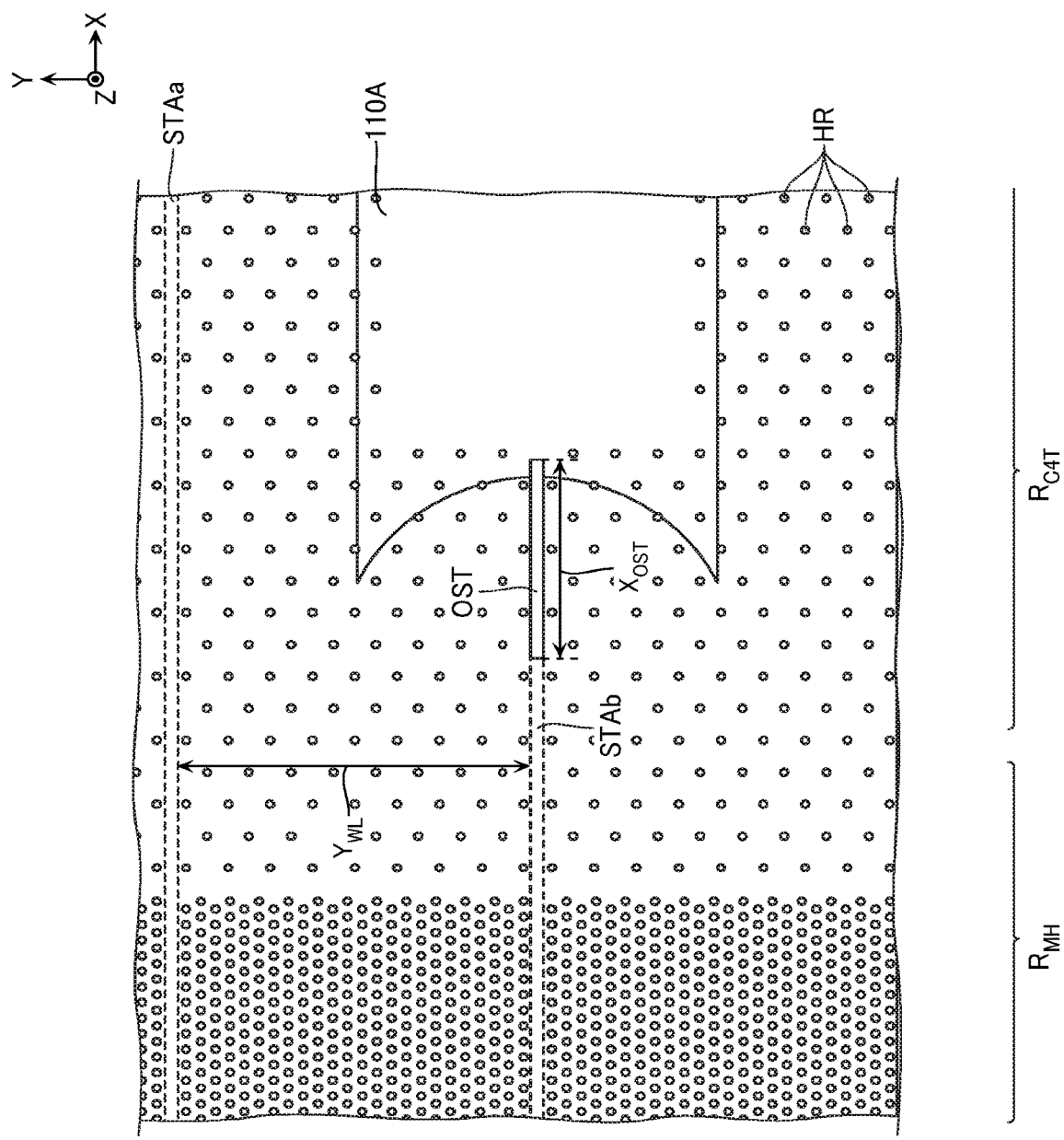
FIG. 32 is a schematic plan view for describing the same manufacturing method.
Figure 33:
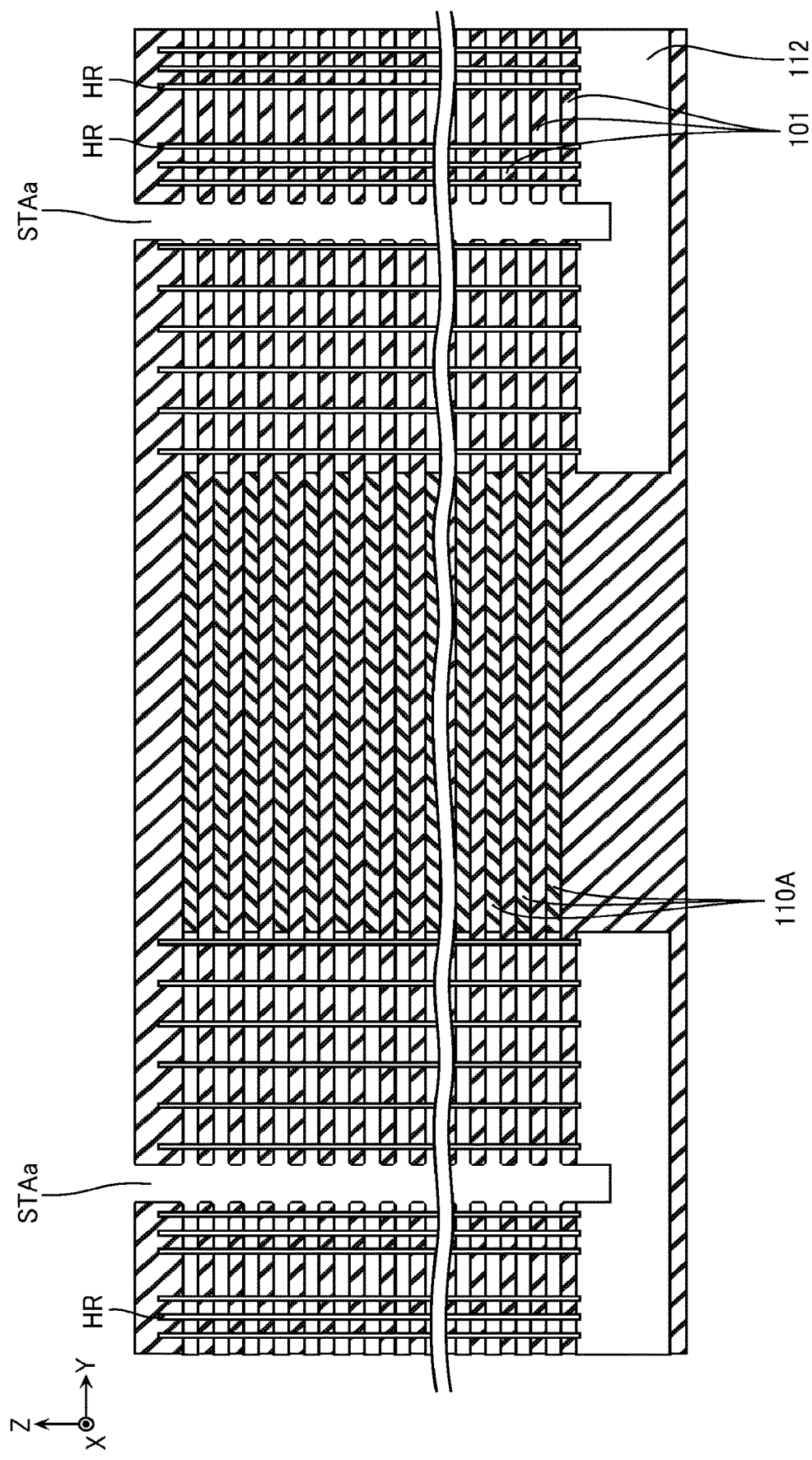
FIG. 33 is a schematic cross-sectional view for describing the same manufacturing method.

For example, as illustrated in FIG. 31 and FIG. 32, in this process, the insulating layers 110A are removed in the region where a distance from the trench STA is smaller than a length at least equal to or more than a half the width $Y_{WL}$ (FIG. 6). As described above, the length $X_{OST}$ in the X-direction of the insulating layer OST has a size at least equal to or more than a half the width $Y_{WL}$ (FIG. 6) in the Y-direction of the conductive layer 110 that functions as the word line WL. Therefore, for example, as illustrated in FIG. 32, after this process ends, the insulating layer 110A remains on one end in the X-direction of the insulating layer OST.

Figure 34:
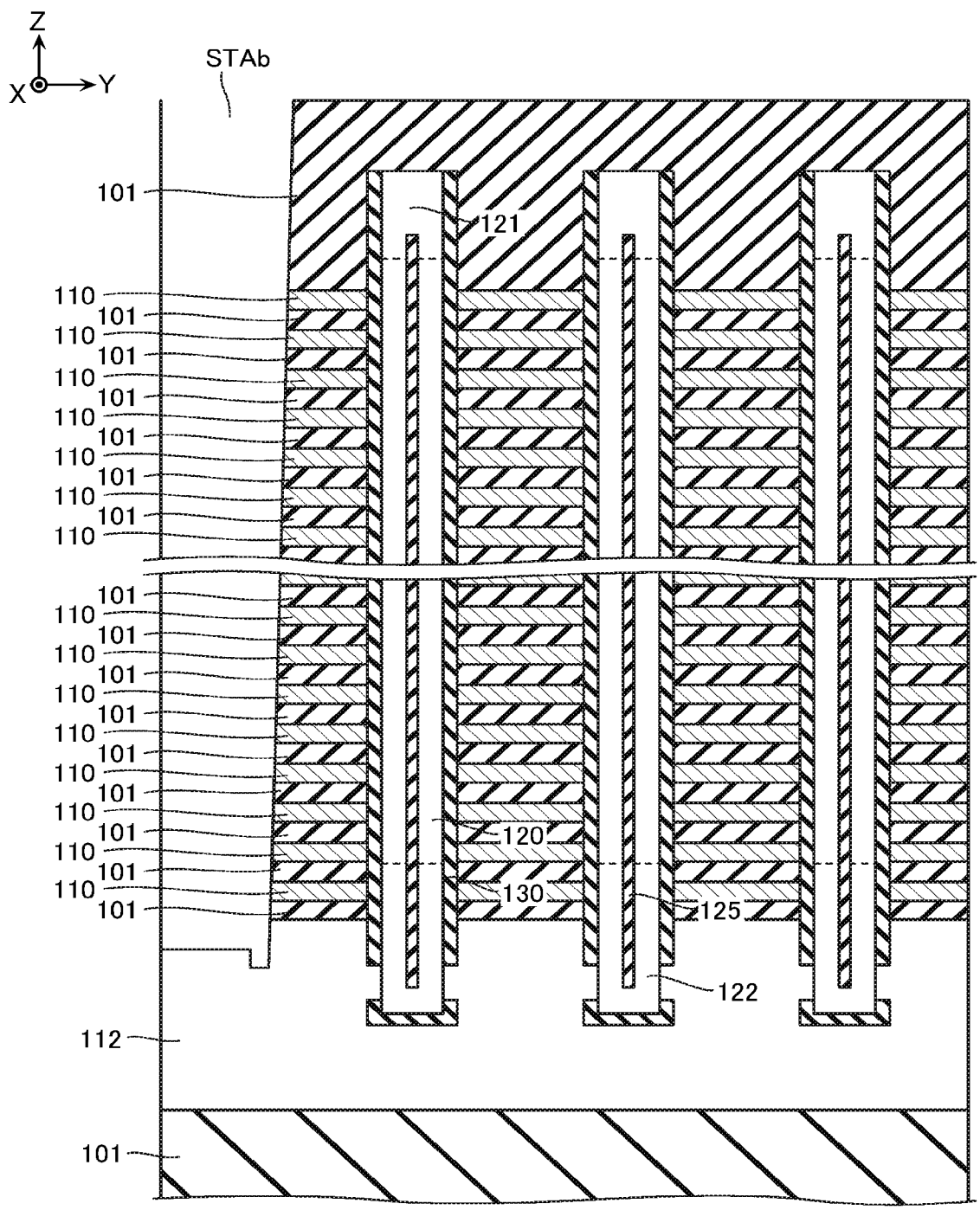
FIG. 34 is a schematic cross-sectional view for describing the same manufacturing method.
Figure 35:
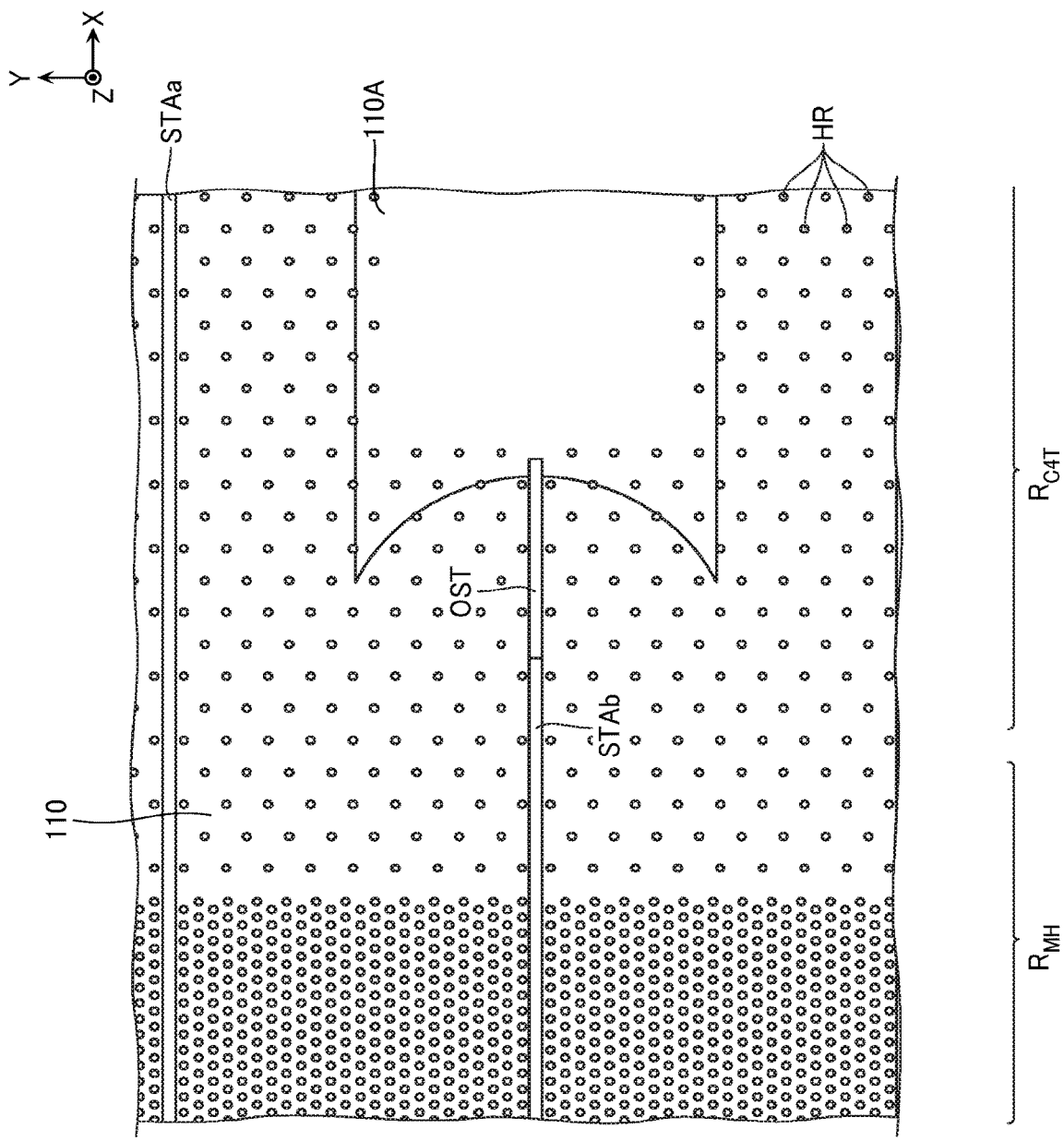
FIG. 35 is a schematic plan view for describing the same manufacturing method.
Figure 36:
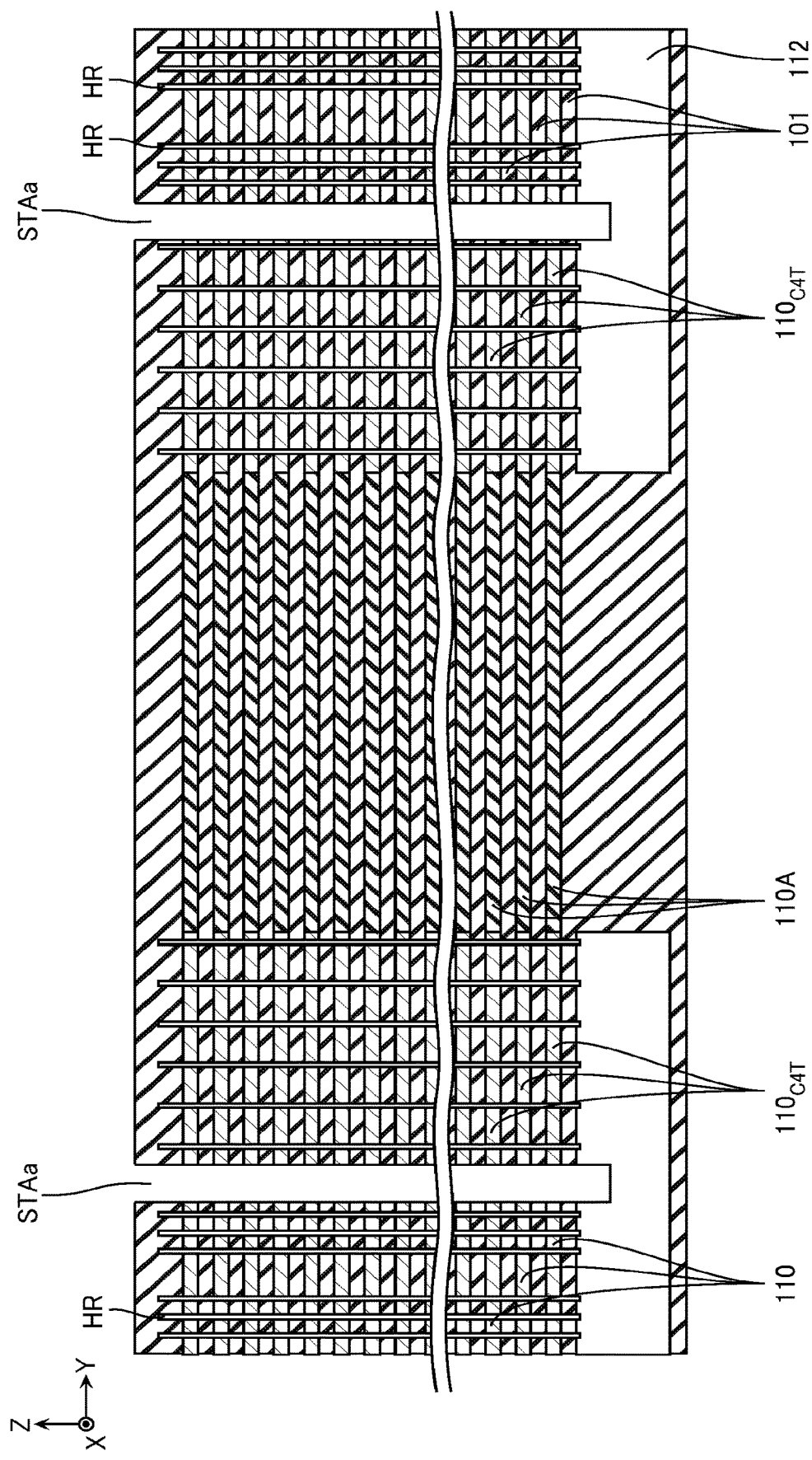
FIG. 36 is a schematic cross-sectional view for describing the same manufacturing method.

Next, for example, as illustrated in FIG. 34 to FIG. 36, the conductive layers 110 are formed. This process is performed by, for example, a method, such as CVD.

Figure 37:
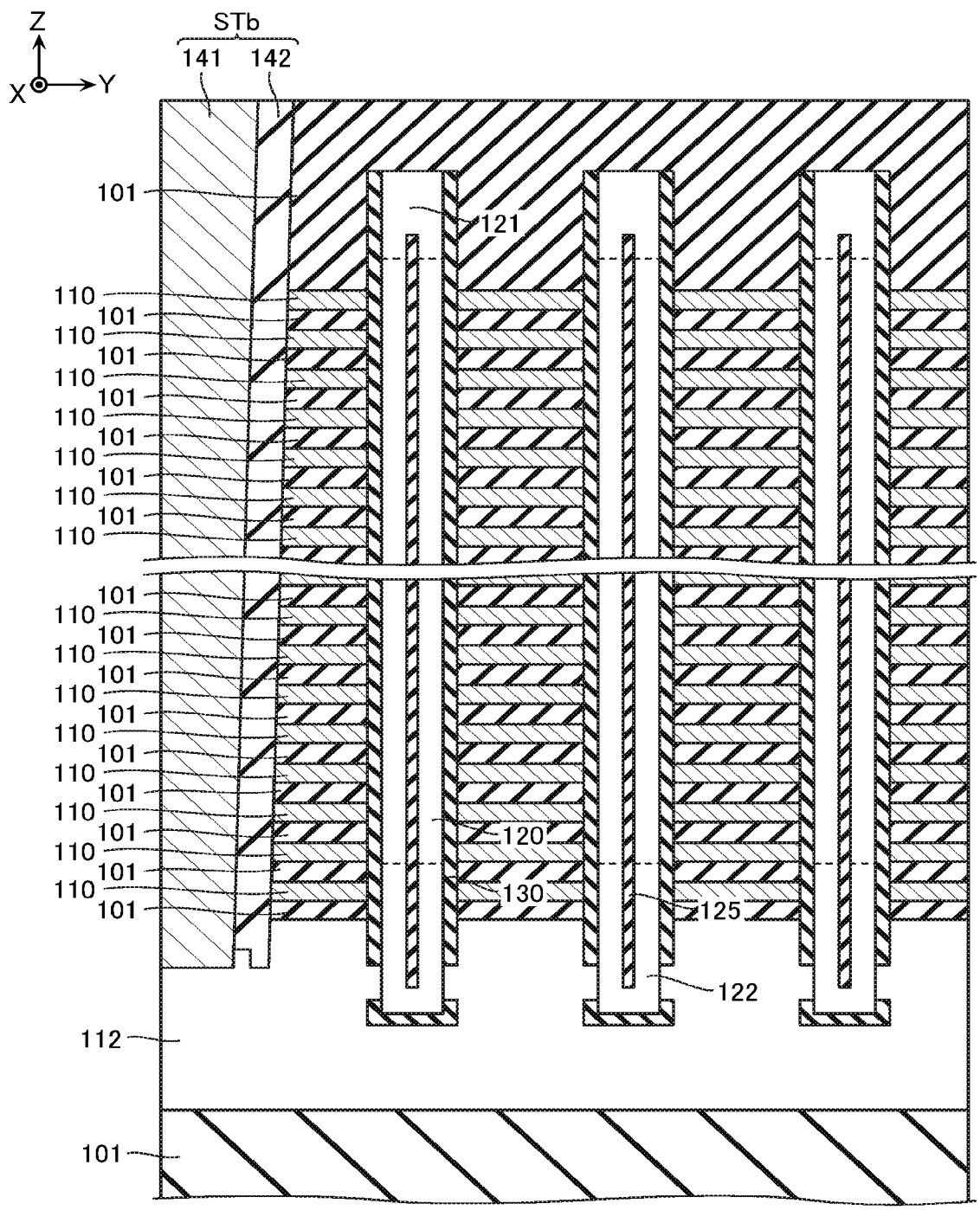
FIG. 37 is a schematic cross-sectional view for describing the same manufacturing method.
Figure 38:
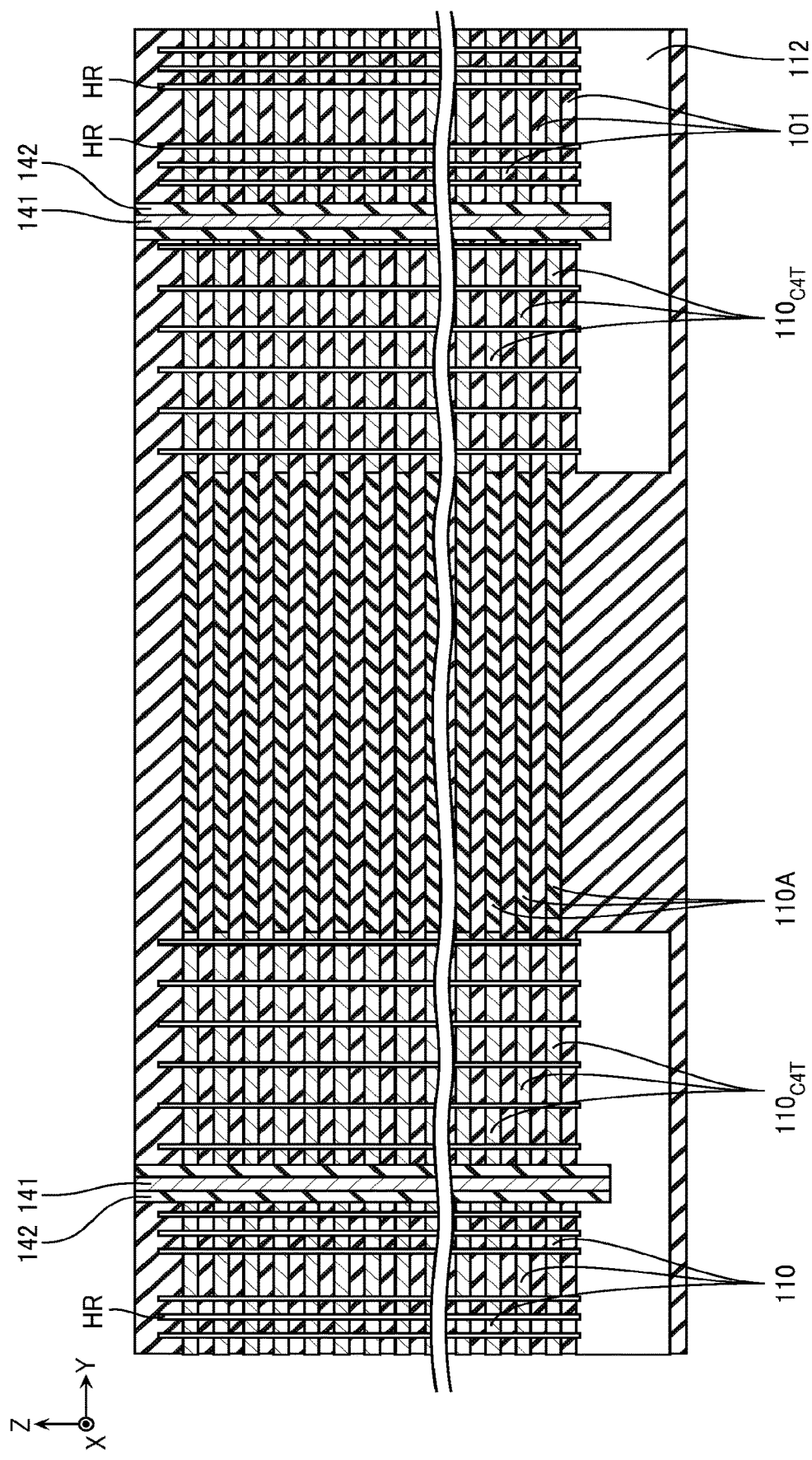
FIG. 38 is a schematic cross-sectional view for describing the same manufacturing method.

Next, for example, as illustrated in FIG. 37 and FIG. 38, the insulating layer 142 and the conductive layer 141 are formed inside the trench STA. This process is performed by, for example, a method, such as CVD and RIE. The inside of the trench STA may be filled with the insulating layer 142 without forming the conductive layer 141 inside the trench STA.

Subsequently, the memory die MD is formed by forming the contacts CC, the contacts C4, wiring or the like and by separating a wafer by dicing.

Comparative Example

Figure 39:
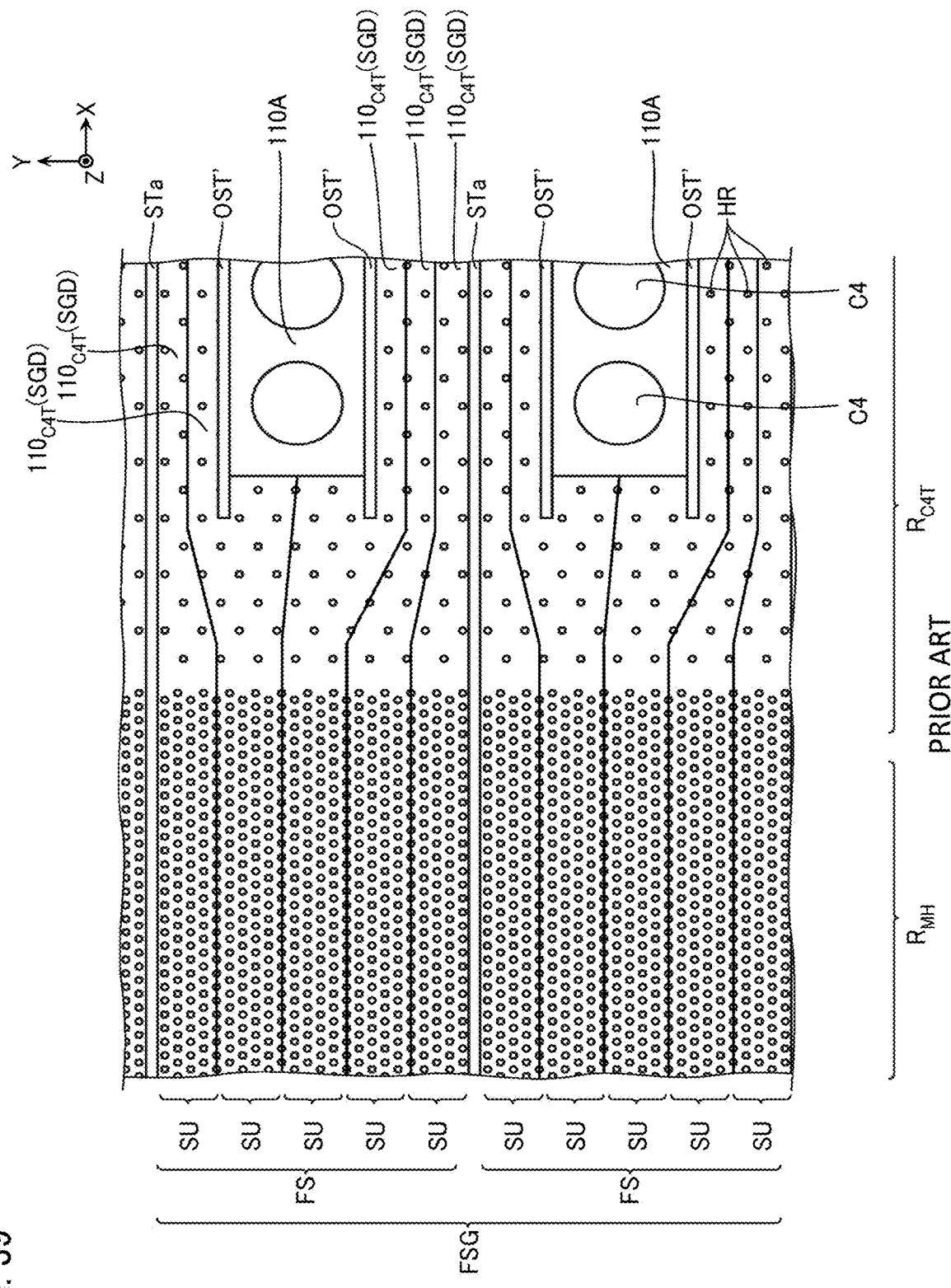
FIG. 39 is a schematic plan view illustrating a part of a configuration of a semiconductor memory device according to a comparative example.
Figure 40:
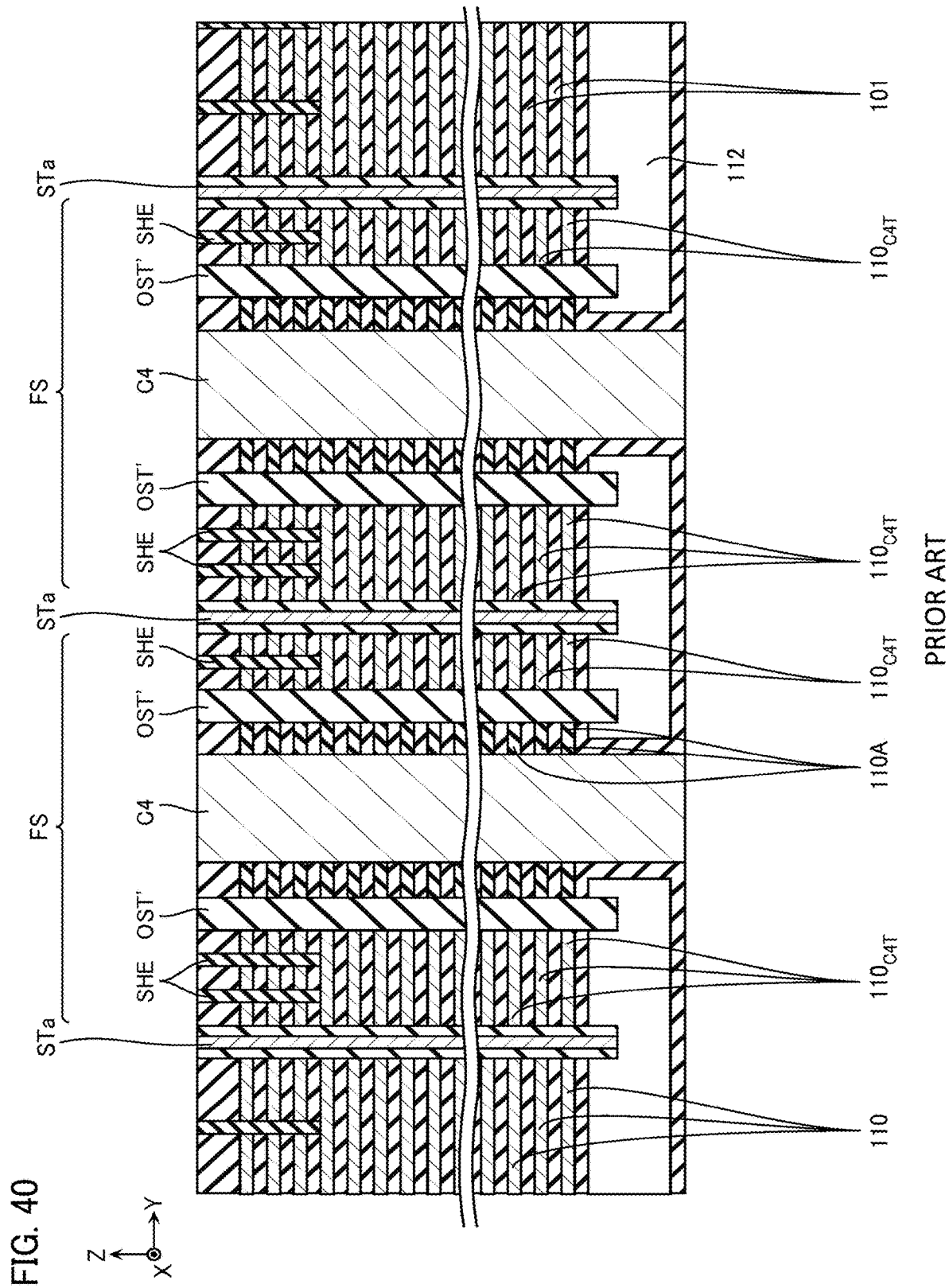
FIG. 40 is a schematic cross-sectional view of a part of the configuration of the same semiconductor memory device.

Next, with reference to FIG. 39 and FIG. 40, a configuration of a semiconductor memory device according to the comparative example is described. FIG. 39 is a schematic plan view illustrating a part of the configuration of the semiconductor memory device according to the comparative example. FIG. 40 is a schematic cross-sectional view illustrating a part of the configuration of the semiconductor memory device according to the comparative example.

In the semiconductor memory device according to the comparative example, the insulating layers 110A and the contacts C4 are disposed not in the inter-finger structure ST but in the finger structure FS. The semiconductor memory device according to the comparative example does not include the insulating layers OST, but instead, includes insulating layers OST'. The insulating layer OST' is disposed between the side surfaces in the Y-direction of the insulating layers 110A and the side surfaces in the Y-direction of the conductive layers $110_{C4T}$ and extends in the X-direction along these insulating layers 110A and the conductive layers $110_{C4T}$. In the semiconductor memory device according to the comparative example, the side surface in the Y-direction of the insulating layer 110A is connected to the insulating layer OST', not to the conductive layer 110. The side surface in the X-direction of the insulating layer 110A is not in contact with the insulating layer OST'.

Next, with reference to FIG. 41 to FIG. 44, a method for manufacturing the semiconductor memory device according to the comparative example is described. FIG. 41 to FIG. 44 are schematic cross-sectional views for describing the manufacturing method and illustrate the cross-sectional surface corresponding to FIG. 40.

Figure 41:
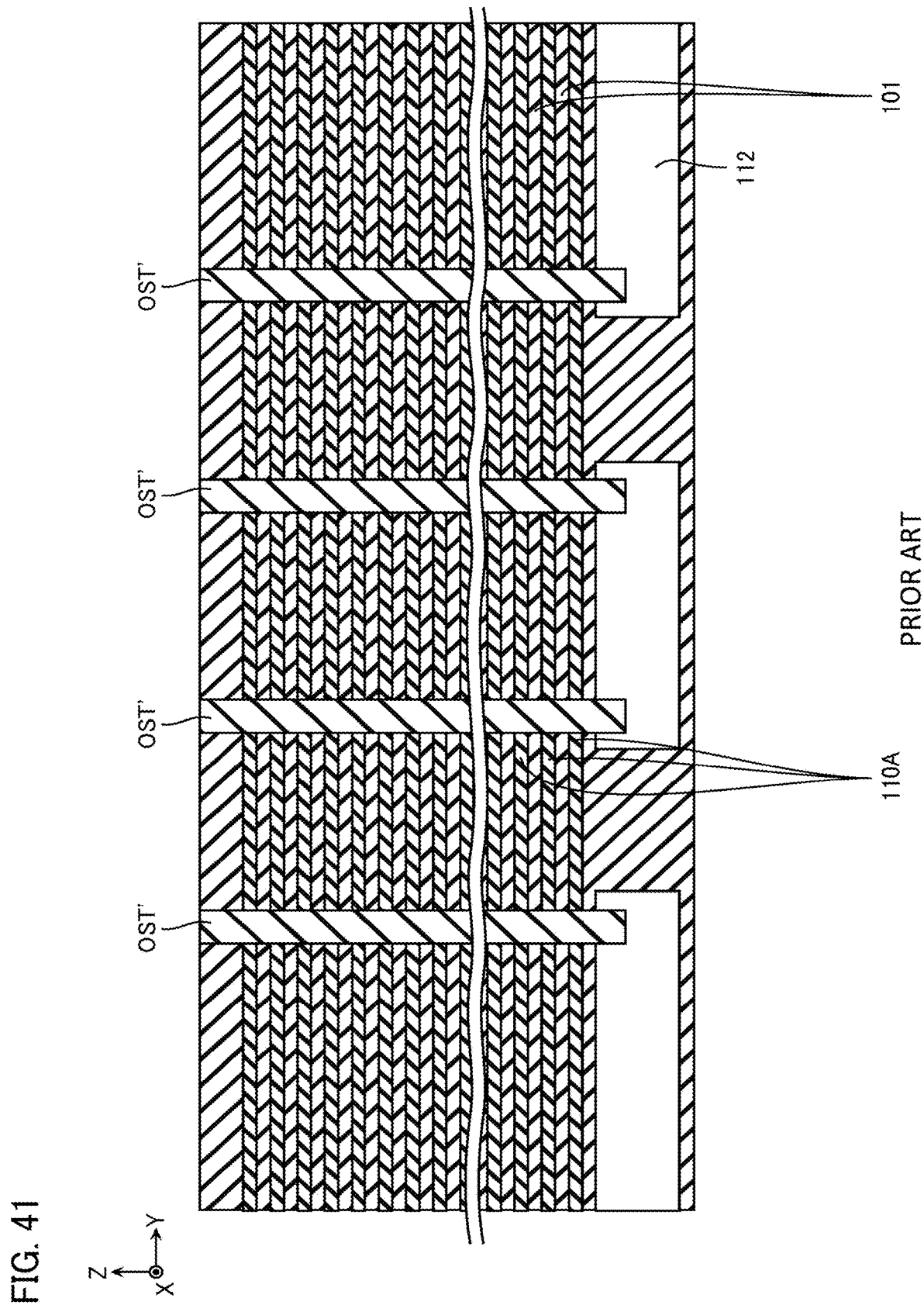
FIG. 41 is a schematic cross-sectional view for describing a manufacturing method of the same semiconductor memory device.

In the manufacture of the semiconductor memory device according to the comparative example, after the semiconductor layers 120, the gate insulating films 130, and the supporting structures HR are manufactured, for example, as illustrated in FIG. 41, the insulating layers OST' are formed. This process is performed by, for example, a method, such as RIE and CVD.

Figure 42:
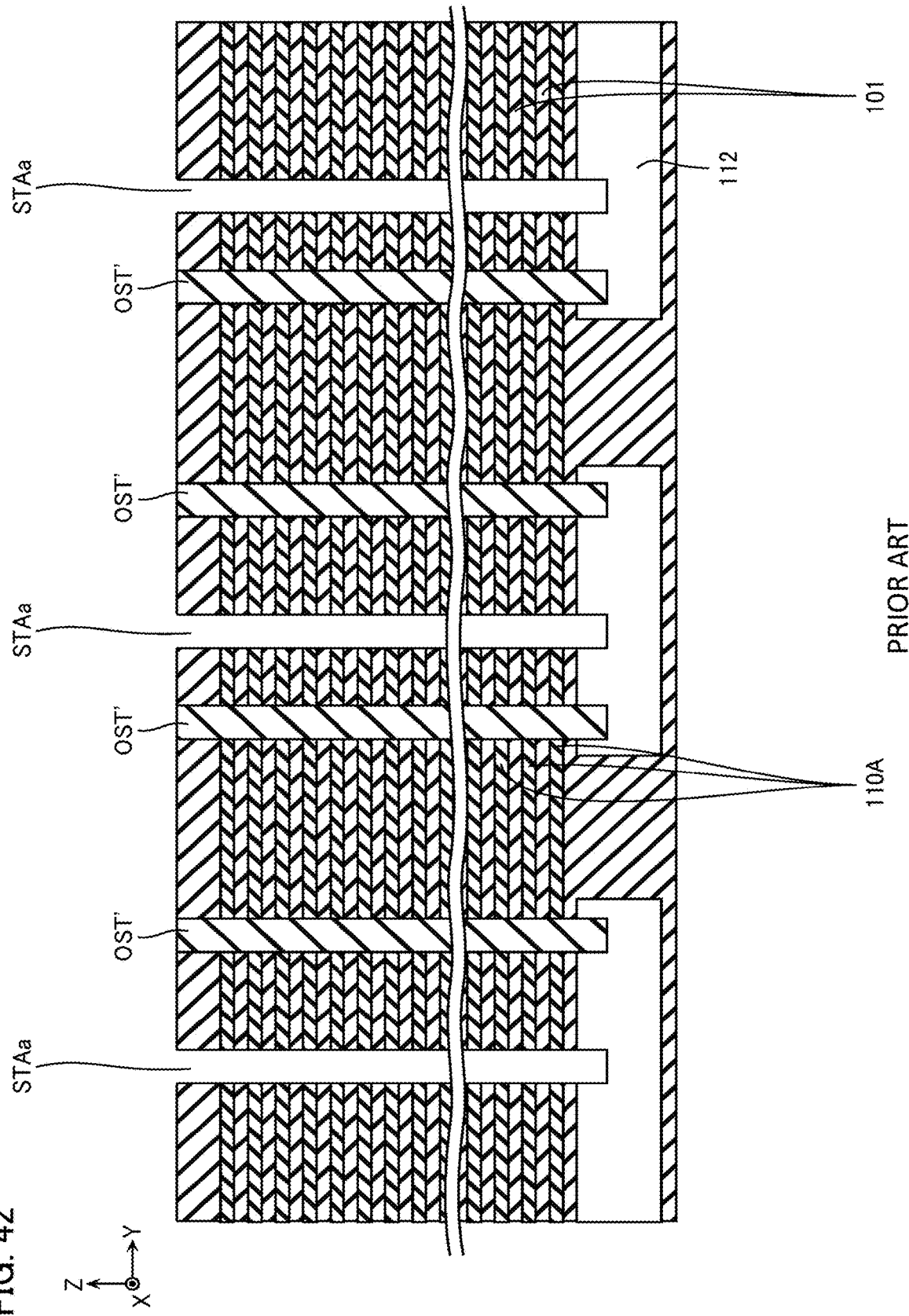
FIG. 42 is a schematic cross-sectional view for describing the same manufacturing method.

Next, for example, as illustrated in FIG. 42, a trench STAa is formed at the position corresponding to the inter-finger structure ST. This process is performed by, for example, a method, such as RIE.

Figure 43:
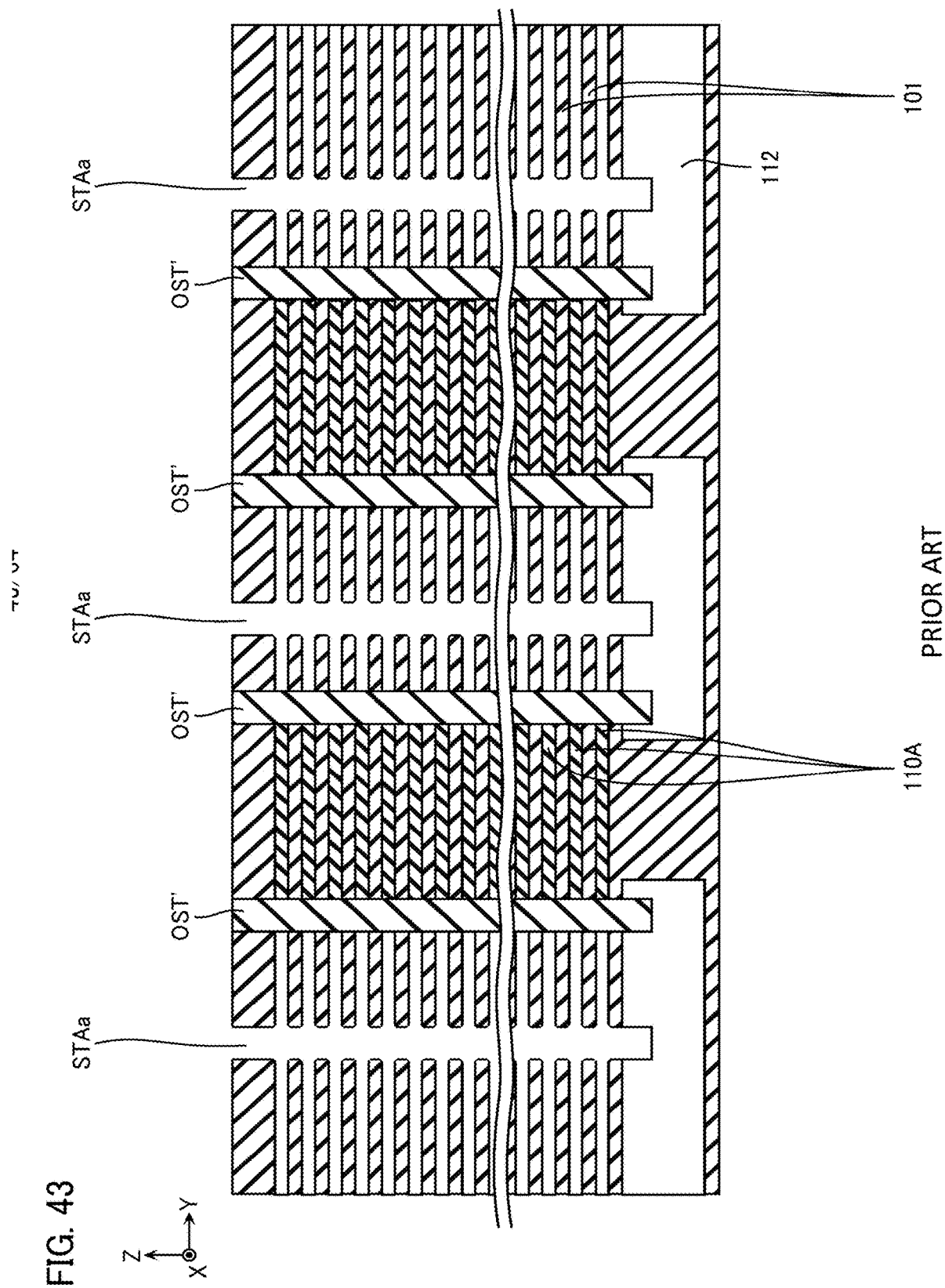
FIG. 43 is a schematic cross-sectional view for describing the same manufacturing method.

Next, for example, as illustrated in FIG. 43, the insulating layers 110A are removed via the trench STAa. This process is performed by, for example, a method, such as wet etching.

Figure 44:
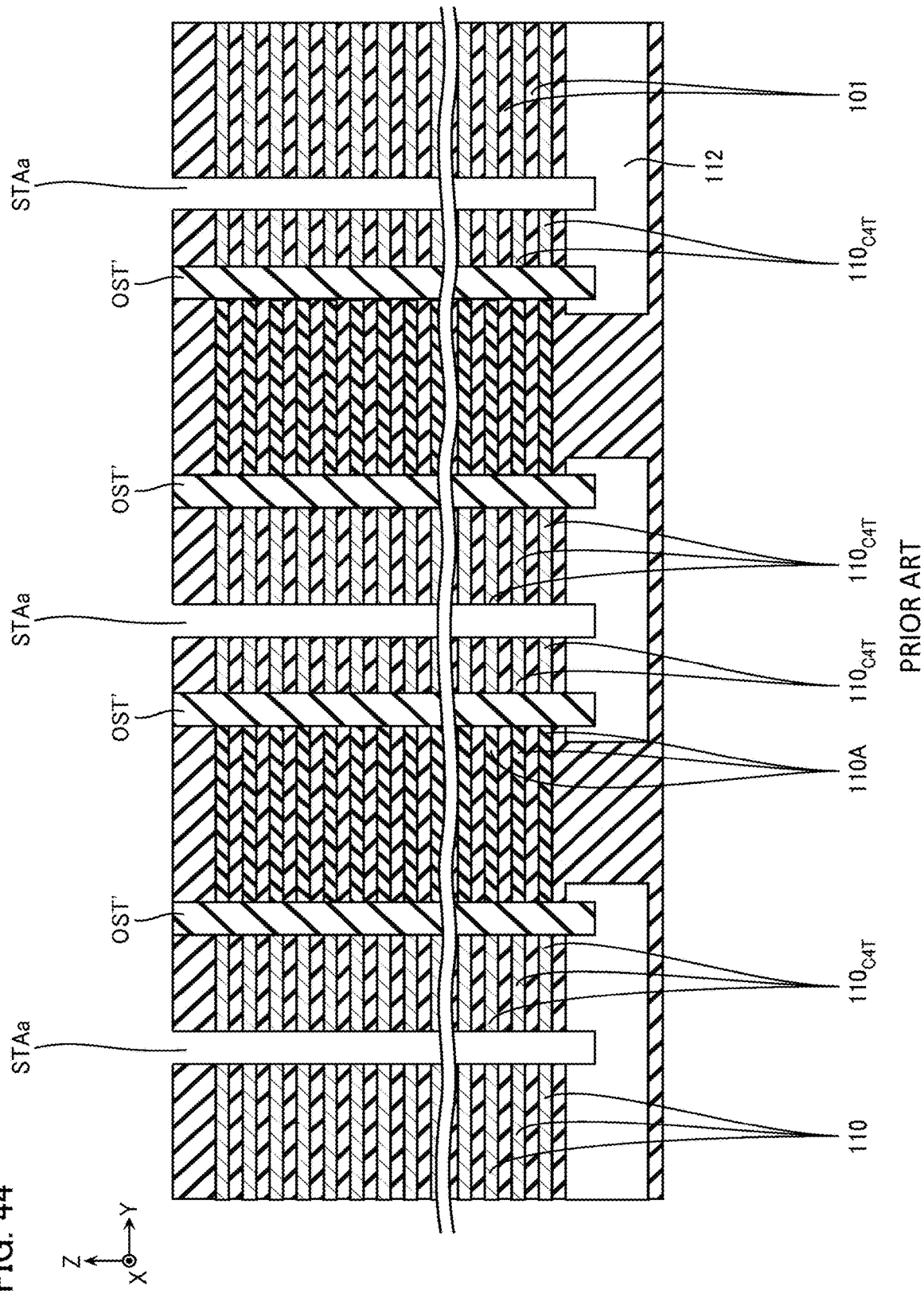
FIG. 44 is a schematic cross-sectional view for describing the same manufacturing method.

Next, for example, as illustrated in FIG. 44, the conductive layers 110 are formed. This process is performed by, for example, a method, such as CVD.

[Effect]

In the manufacturing processes of the semiconductor memory device according to the comparative example, in the process described with reference to FIG. 44, compressive stress may be generated in the conductive layers 110 due to thermal shrinkage or the like of the conductive layers 110. In the manufacturing processes of the semiconductor memory device according to the comparative example, at the time of performing the process described with reference to FIG. 44, the plurality of interlayer insulating layers 101 arranged in the Z-direction are separated in the Y-direction by the insulating layers OST' and the trenches STAa in a range narrower than the width in the Y-direction of the finger structure FS. In such a case, the compressive stress of the conductive layers 110 cannot be preferably absorbed, and a deformation may occur in the entire stacked structure including the plurality of conductive layers 110.

On the other hand, in the manufacturing processes of the semiconductor memory device according to the first embodiment, at the time of performing the process described with reference to FIG. 34 to FIG. 36, the plurality of interlayer insulating layers 101 arranged in the Z-direction are continuously formed across a region corresponding to two finger structures FS and one inter-finger structure STb disposed between the two finger structures FS. In such a case, the compressive stress of the conductive layers 110 can be preferably absorbed, and the occurrence of the deformation as described above can be preferably reduced. Thus, the semiconductor memory device is preferably manufacturable.

Second Embodiment

Figure 45:
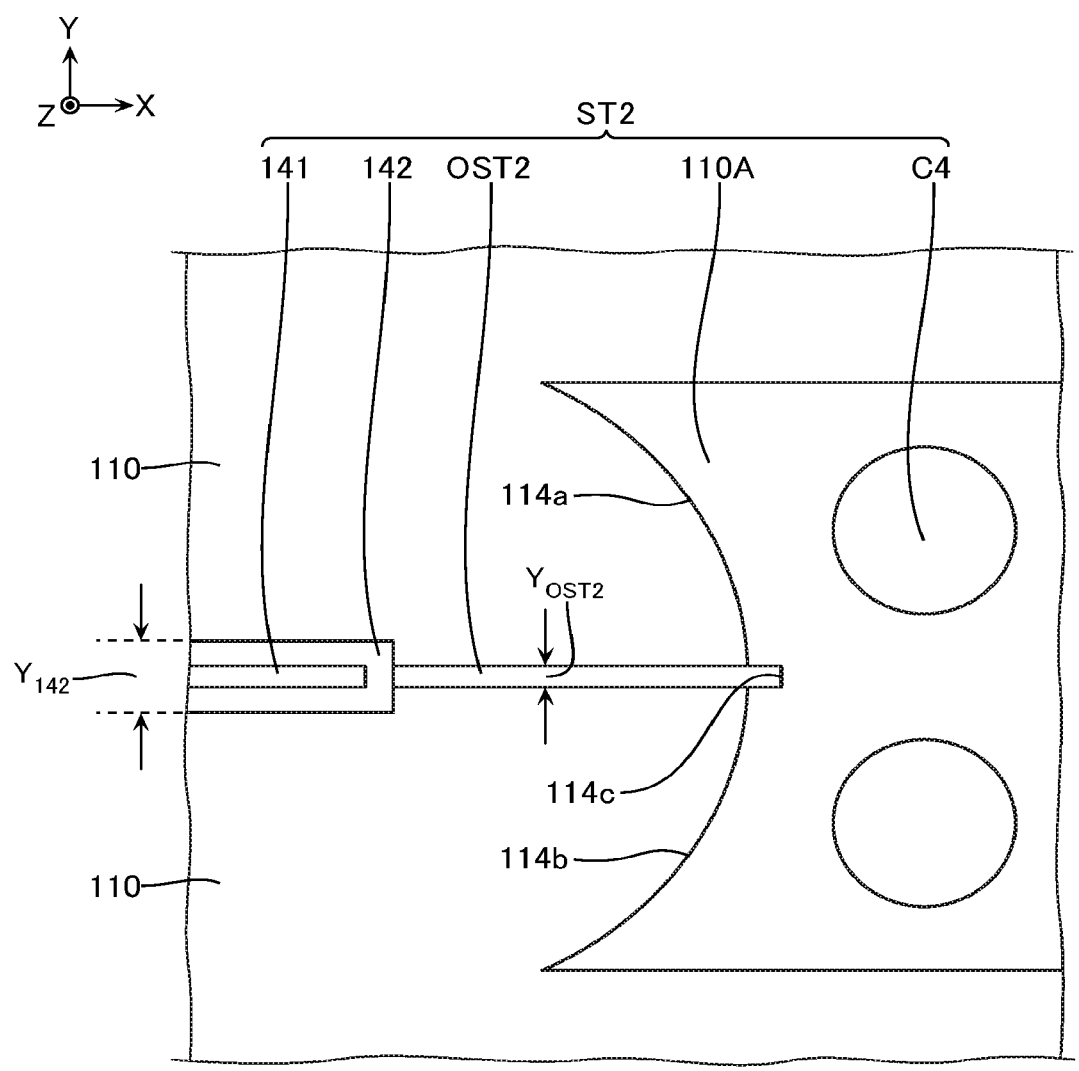
FIG. 45 is a schematic plan view illustrating a part of a configuration of a semiconductor memory device according to a second embodiment.

Next, with reference to FIG. 45, a semiconductor memory device according to the second embodiment is described. FIG. 45 is a schematic plan view for describing the semiconductor memory device. In FIG. 45, illustration of the supporting structures HR is omitted.

The semiconductor memory device according to the second embodiment is basically configured similarly to the semiconductor memory device according to the first embodiment. However, as illustrated in FIG. 45, the semiconductor memory device according to the second embodiment includes an inter-finger structure ST2 instead of the inter-finger structures STb, STc. The inter-finger structure ST2 is basically configured similarly to the inter-finger structures STb, STc. However, the inter-finger structure ST2 includes an insulating layer OST2 instead of the insulating layer OST. The insulating layer OST2 is basically configured similarly to the insulating layer OST. However, a width $Y_{OST2}$ in the Y-direction of the insulating layer OST2 is smaller than the width $Y_{142}$ in the Y-direction of the configuration in which the conductive layer 141 and the pair made of two insulating layers 142 disposed on both side surfaces in the Y-direction of this conductive layer 141 are combined.

Next, with reference to FIG. 46 to FIG. 50, a method for manufacturing the semiconductor memory device according to the second embodiment is described. FIG. 46 to FIG. 50 are schematic plan views for describing the manufacturing method and illustrate the plane corresponding to FIG. 45. In FIG. 46 to FIG. 50, illustration of the supporting structures HR is omitted.

For example, among the manufacturing processes included in the manufacturing method of the semiconductor memory device according to the first embodiment, up to the process described with reference to FIG. 18 and FIG. 19 is performed in the manufacturing method of the semiconductor memory device according to the second embodiment.

Figure 46:
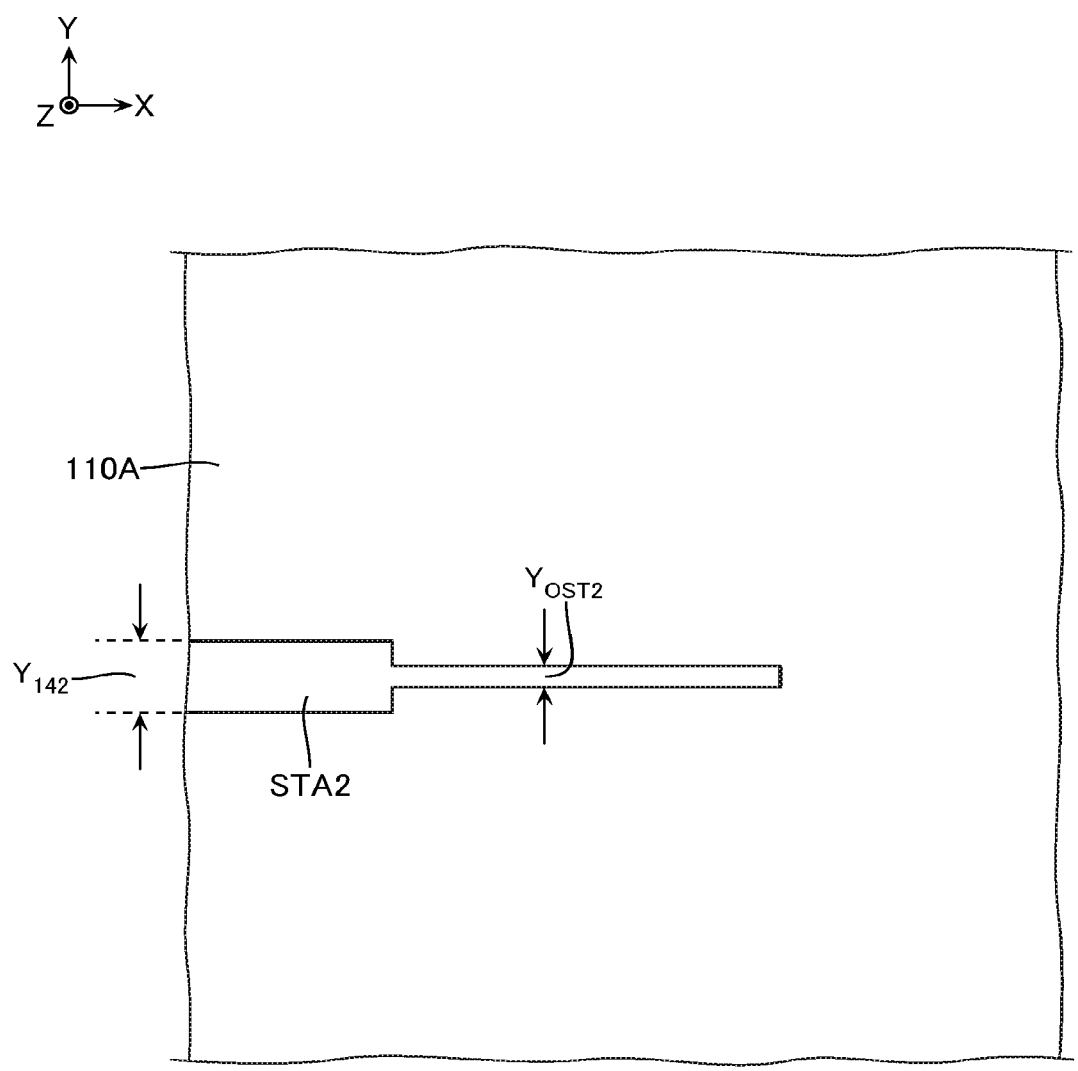
FIG. 46 is a schematic plan view for describing a manufacturing method of the same semiconductor memory device.

Next, for example, as illustrated in FIG. 46, a trench STA2 is formed at the position corresponding to the conductive layer 141 and the insulating layer OST2. The trench STA2 is basically formed similarly to the trench STA. However, as illustrated in FIG. 46, in the trench STA2, the width $Y_{OST2}$ in the Y-direction of the part corresponding to the insulating layer OST2 is smaller than the width $Y_{142}$ in the Y-direction of the part corresponding to the conductive layer 141 and insulating layer 142. This process is performed by, for example, a method, such as RIE.

Figure 47:
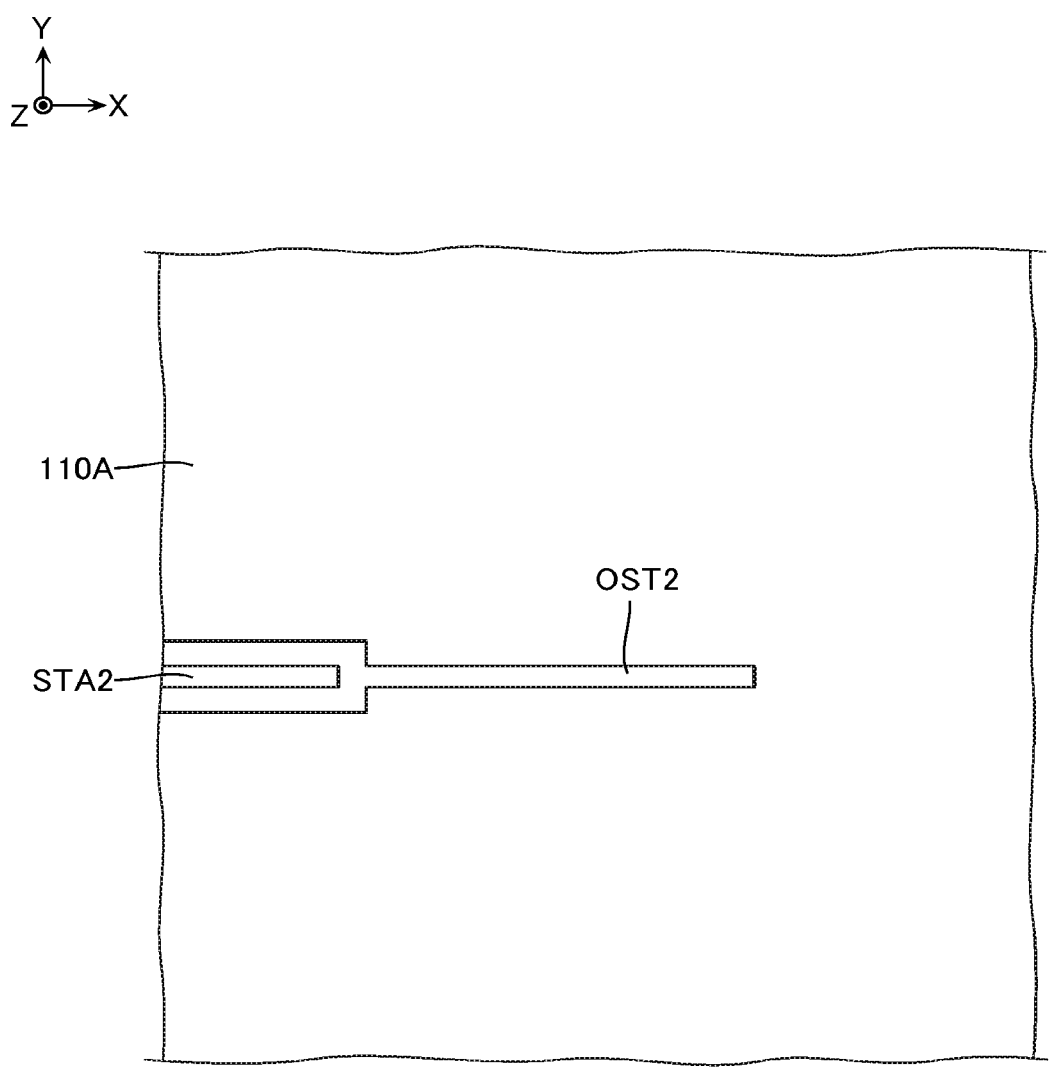
FIG. 47 is a schematic plan view for describing the same manufacturing method.

Next, for example, as illustrated in FIG. 47, the insulating layer OST2 is formed inside the trench STA2. In this process, inside the trench STA2, an insulating layer of silicon oxide ($SiO_2$) or the like is formed. At this time, the film thickness of this insulating layer is adjusted to be thick to the extent that the space inside the trench STA2 is embedded by the insulating layer at the position corresponding to the insulating layer OST2. The film thickness of this insulating layer is adjusted to be thin to the extent that the space inside the trench STA2 is not embedded by the insulating layer at the position corresponding to the conductive layer 141. This process is performed by, for example, a method, such as CVD.

Figure 48:
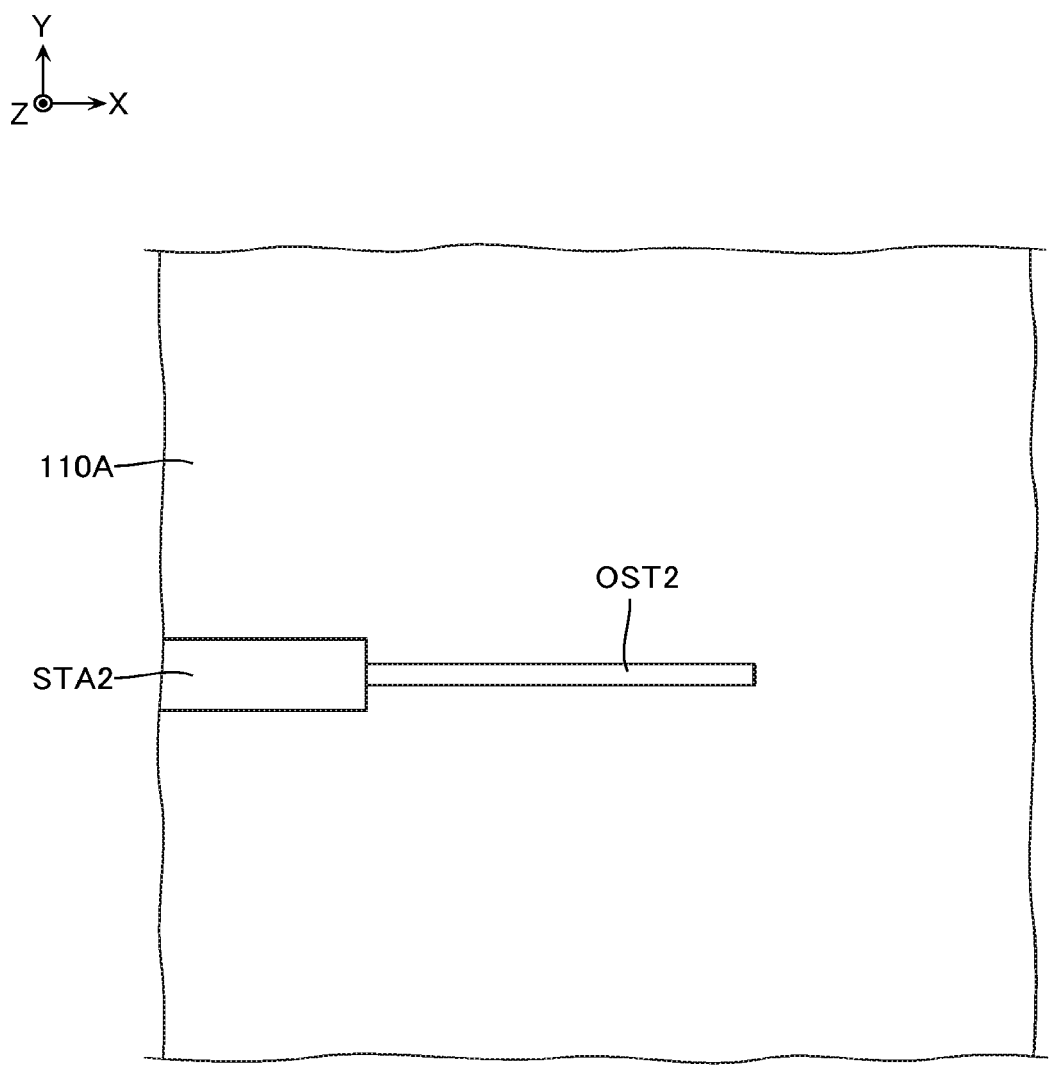
FIG. 48 is a schematic plan view for describing the same manufacturing method.

Next, for example, as illustrated in FIG. 48, a part of the insulating layer formed in the process described with reference to FIG. 47 is removed. This process is performed by, for example, a method, such as wet etching.

Next, the processes described with reference to FIG. 26 to FIG. 29 are performed.

Figure 49:
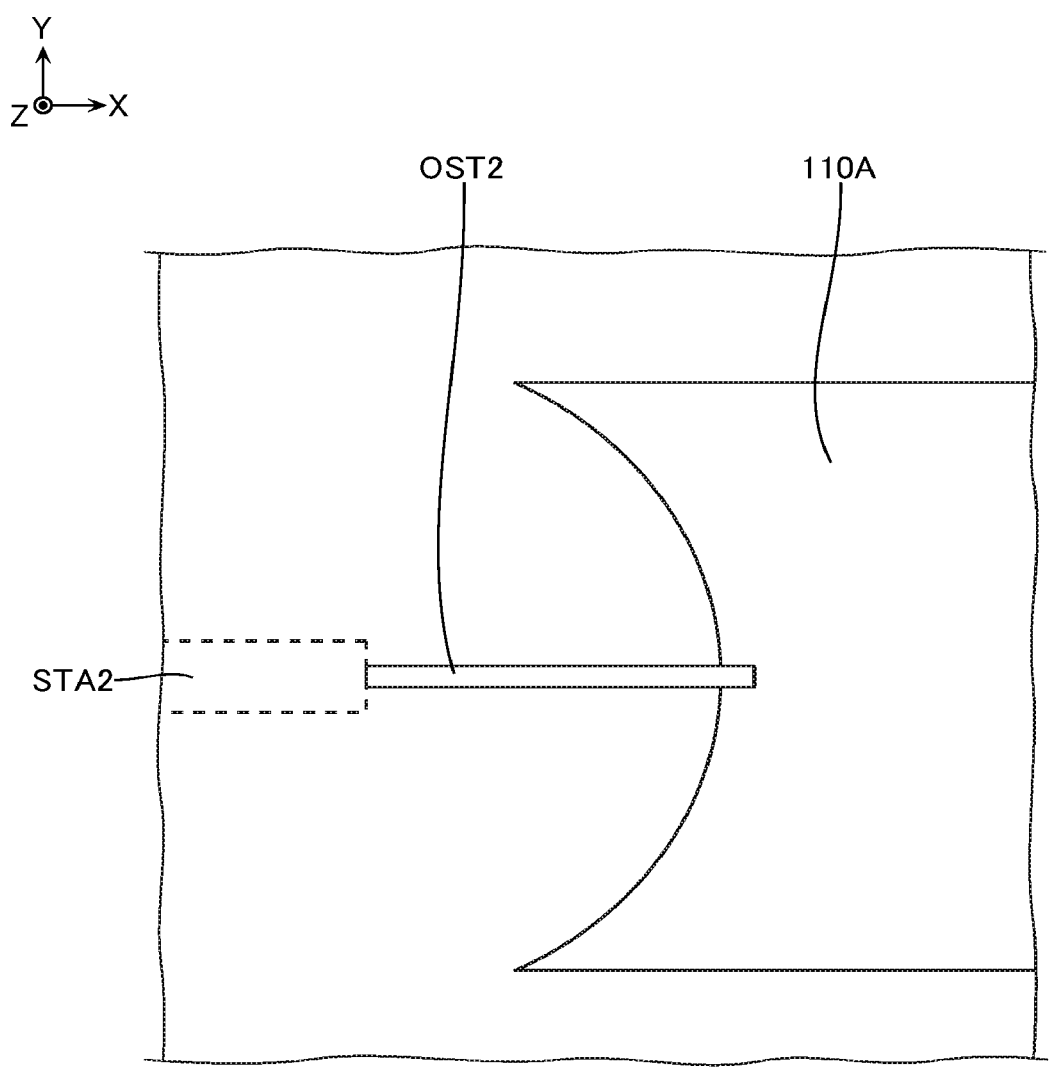
FIG. 49 is a schematic plan view for describing the same manufacturing method.

Next, for example, as illustrated in FIG. 49, the insulating layers 110A are removed via the trench STA2. This process is performed, for example, similarly to the process described with reference to FIG. 30 to FIG. 33.

Figure 50:
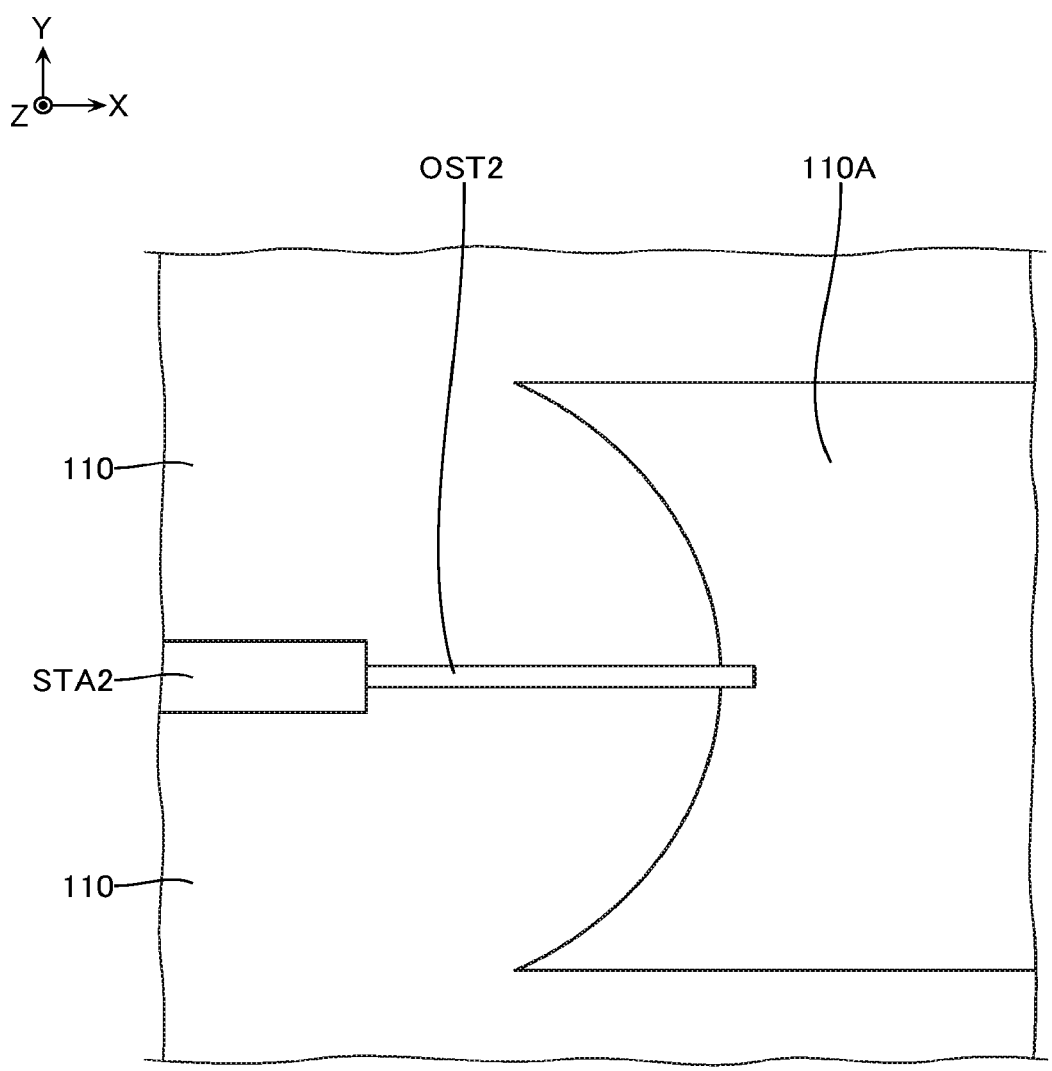
FIG. 50 is a schematic plan view for describing the same manufacturing method.

Next, for example, as illustrated in FIG. 50, the conductive layers 110 are formed. This process is performed, for example, similarly to the process described with reference to FIG. 34 to FIG. 36.

Subsequently, among the manufacturing processes included in the manufacturing method of the semiconductor memory device according to the first embodiment, the process after the process described with reference to FIG. 37 and FIG. 38 is performed.

[Effect]

With the manufacturing method of the semiconductor memory device according to the second embodiment, the insulating layer OST2 can be easily formed. Therefore, compared with the manufacturing method of the semiconductor memory device according to the first embodiment, the number of manufacturing processes can be reduced.

Third Embodiment

Figure 51:
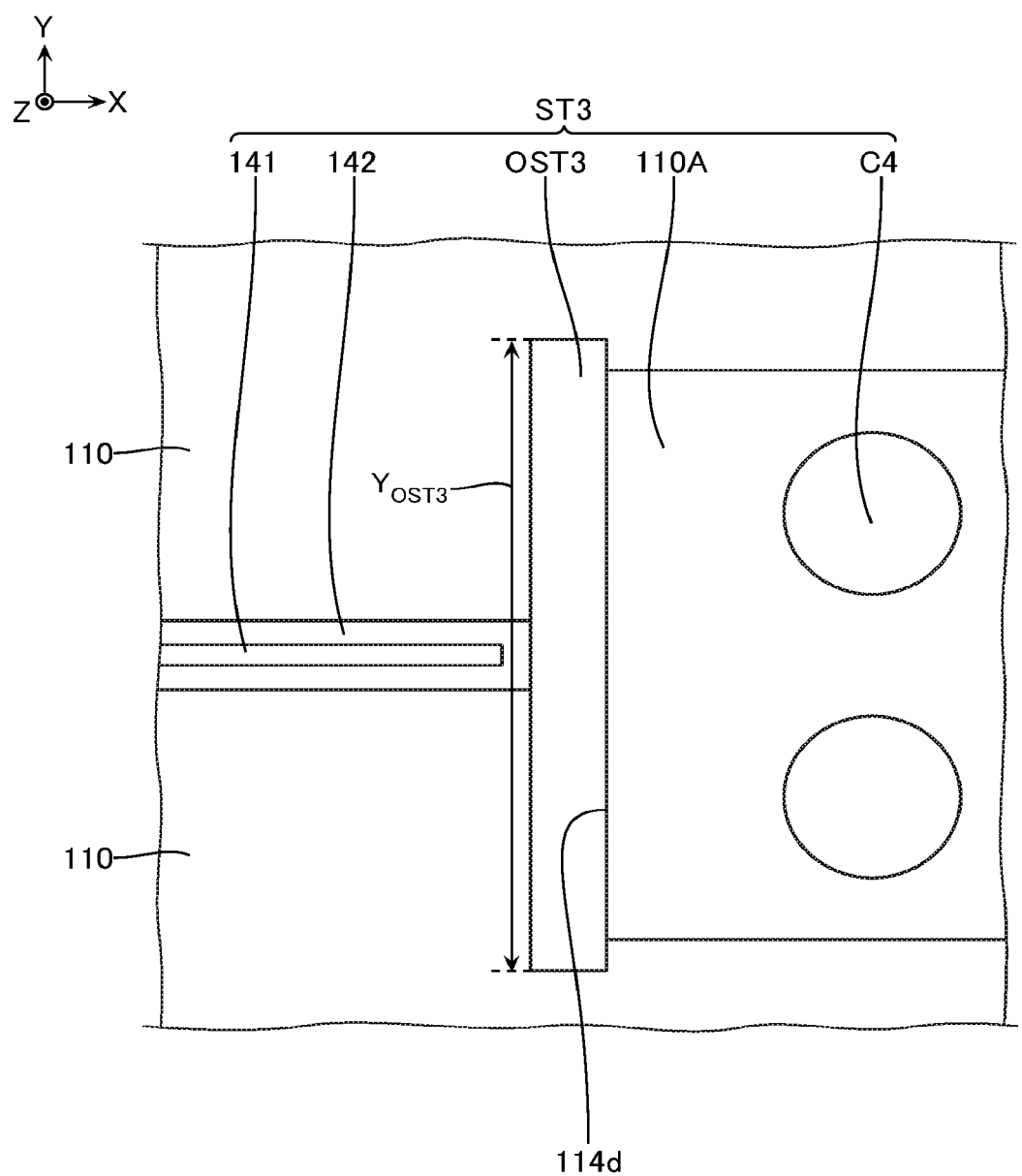
FIG. 51 is a schematic plan view illustrating a part of a configuration of a semiconductor memory device according to a third embodiment.

Next, with reference to FIG. 51, a semiconductor memory device according to the third embodiment is described. FIG. 51 is a schematic plan view for describing the semiconductor memory device. In FIG. 51, illustration of the supporting structures HR is omitted.

The semiconductor memory device according to the third embodiment is basically configured similarly to the semiconductor memory device according to the first embodiment. However, as illustrated in FIG. 51, the semiconductor memory device according to the third embodiment includes inter-finger structures ST3 instead of the inter-finger structures STb, STc. The inter-finger structure ST3 is basically configured similarly to the inter-finger structures STb, STc. However, the inter-finger structure ST3 includes an insulating layer OST3 instead of the insulating layer OST. The insulating layer OST3 is basically configured similarly to the insulating layer OST. However, the insulating layer OST3 extends not in the X-direction but in the Y-direction. Furthermore, as illustrated in FIG. 51, a side surface in the X-direction of the insulating layer 110A according to the third embodiment includes a side edge portion 114d extending in the Y-direction. The side edge portion 114d is in contact with the insulating layer OST3.

A width $Y_{OST3}$ in the Y-direction of the insulating layer OST3 is at least smaller than a size twice the width $Y_{WL}$ (FIG. 6) in the Y-direction of the conductive layer 110 that functions as the word line WL.

Figure 52:
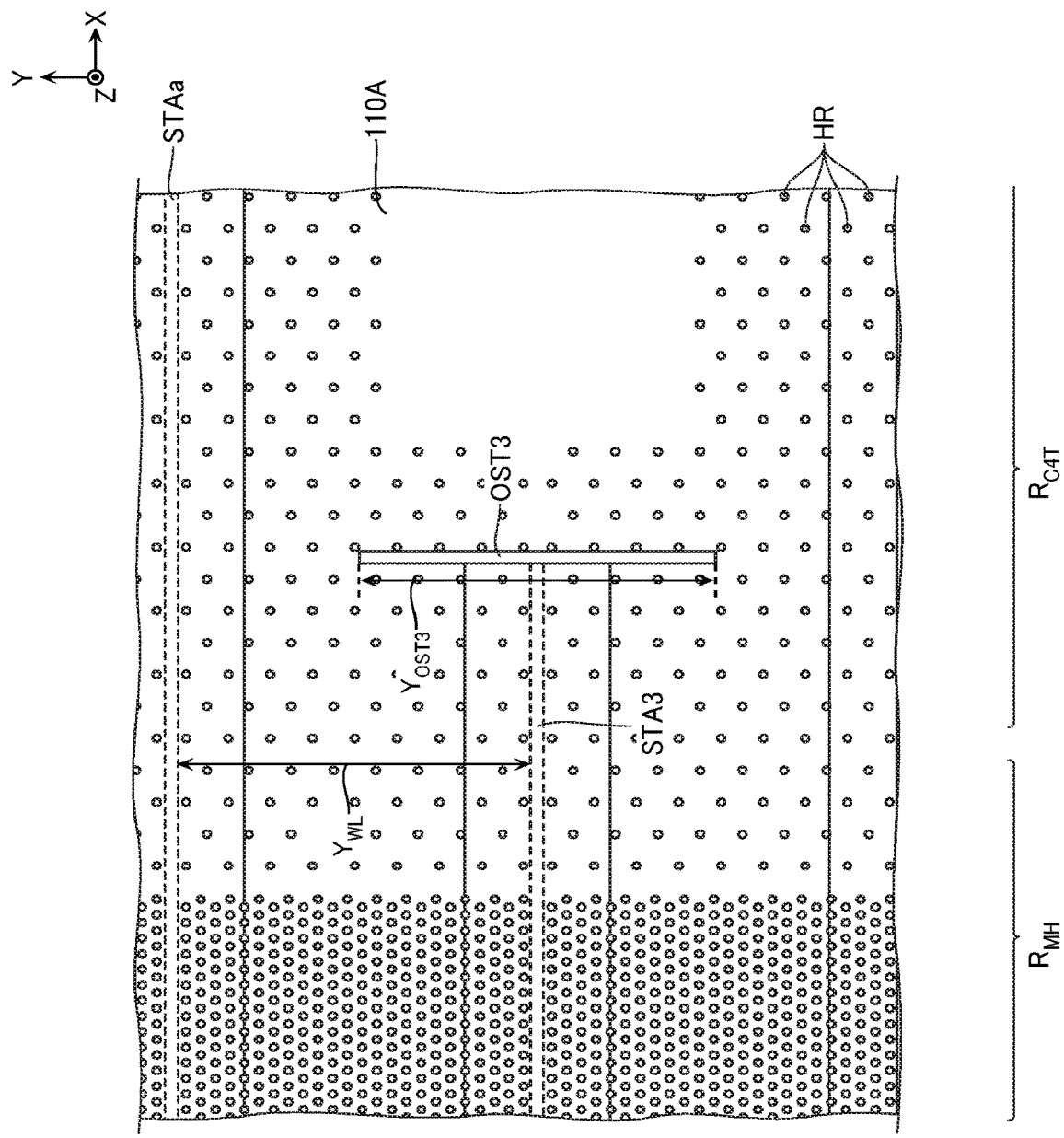
FIG. 52 is a schematic plan view for describing a manufacturing method of the same semiconductor memory device.
Figure 53:
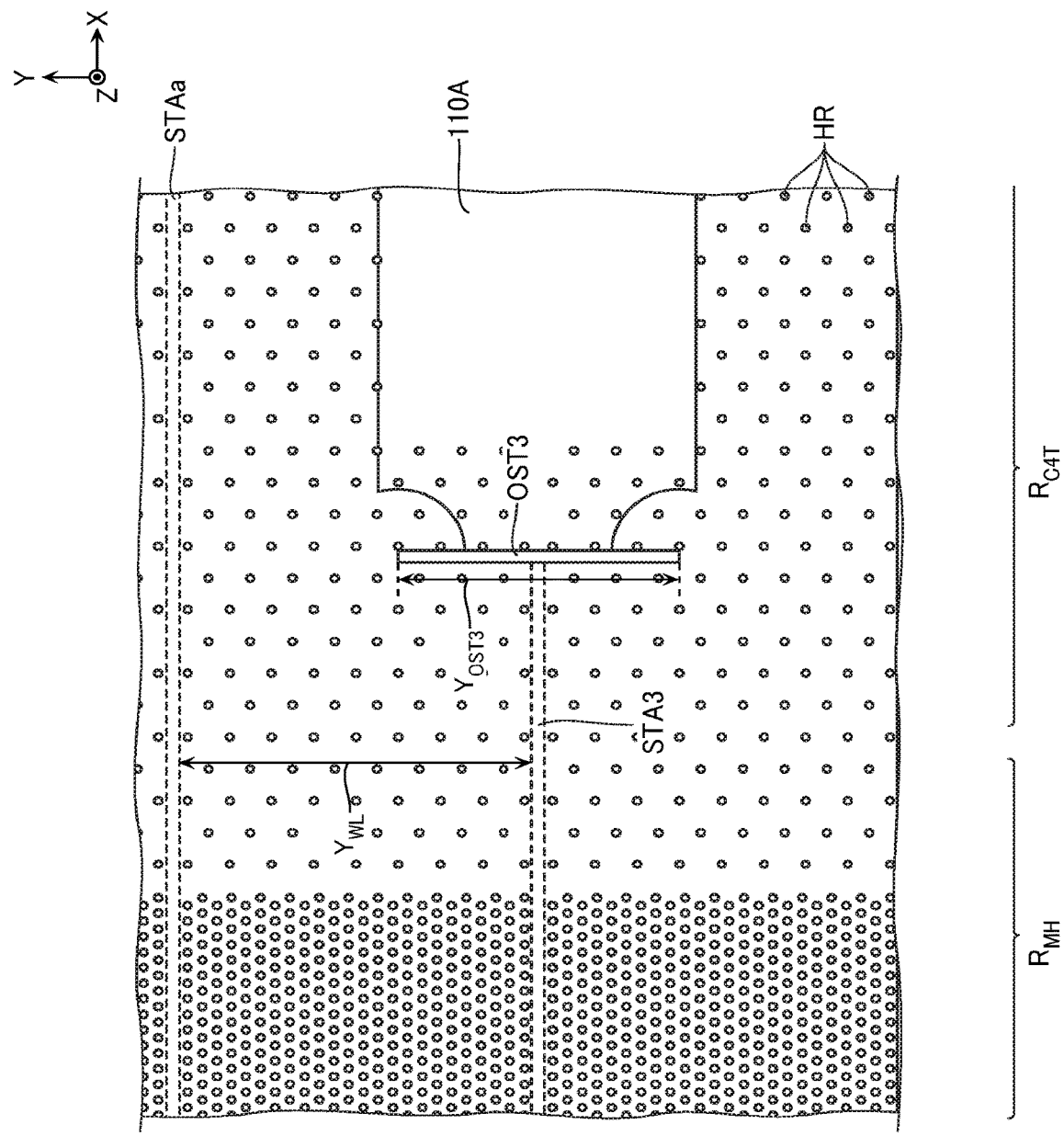
FIG. 53 is a schematic plan view for describing the manufacturing method of the same semiconductor memory device.

Next, with reference to FIG. 52 and FIG. 53, a method for manufacturing the semiconductor memory device according to the third embodiment is described. FIG. 52 and FIG. 53 are schematic plan views for describing the manufacturing method. In FIG. 52 and FIG. 53, a trench STA3 is exemplified. The trench STA3 is basically formed similarly to the trench STA. However, as illustrated in FIG. 52 and FIG. 53, the trench STA3 includes a portion corresponding to the insulating layer OST3, instead of the portion corresponding to the insulating layer OST.

In the process described with reference to FIG. 31 and FIG. 32, the insulating layers 110A are removed in the region where a distance from the trench STA is smaller than a length at least equal to or more than a half the width $Y_{WL}$ (FIG. 6). Therefore, as illustrated in FIG. 52, when the width $Y_{OST3}$ in the Y-direction of the insulating layer OST3 has a size equal to or more than the width $Y_{WL}$ (FIG. 6) in the Y-direction of the conductive layer 110, for example, invasion of a liquid etchant supplied from the trench STA positioned corresponding to the conductive layer 141 into the region on the contacts C4 side with respect to the insulating layer OST3 can be reduced.

When the width $Y_{OST3}$ Y in the Y-direction of the insulating layer OST3 has a size smaller than the width $Y_{WL}$ (FIG. 6) in the Y-direction of the conductive layer 110 and equal to or more than a half the $Y_{WL}$, for example, as illustrated in FIG. 53, a liquid etchant supplied from the trench STA positioned corresponding to the conductive layer 141 is considered to invade into the region on the contacts C4 side with respect to the insulating layer OST3. However, even in this case, a short circuit of the conductive layers 110 between the finger structures FS can be prevented.

When the width $Y_{OST3}$ in the Y-direction of the insulating layer OST3 is smaller than the size of a half the width $Y_{WL}$ (FIG. 6) in the Y-direction of the conductive layer 110, in the process described with reference to FIG. 31 and FIG. 32, a short circuit of the conductive layers 110 between the finger structures FS may occur.

Therefore, the width $Y_{OST3}$ in the Y-direction of the insulating layer OST3 preferably has a size equal to or more than a half the width $Y_{WL}$, and more preferably has a size equal to or more than the width $Y_{WL}$.

[Effect]

With the semiconductor memory device according to the third embodiment, an effect similar to that of the semiconductor memory device according to the first embodiment can be provided. Furthermore, the insulating layer OST3 according to the third embodiment has a smaller width in the X-direction compared with the insulating layer OST according to the first embodiment. Accordingly, with the semiconductor memory device according to the third embodiment, areas of the contact connection region $R_{C4T}$ and the second hook-up region $R_{HU2}$ can be reduced, thereby ensuring high integration of the semiconductor memory device.

Fourth Embodiment

Figure 54:
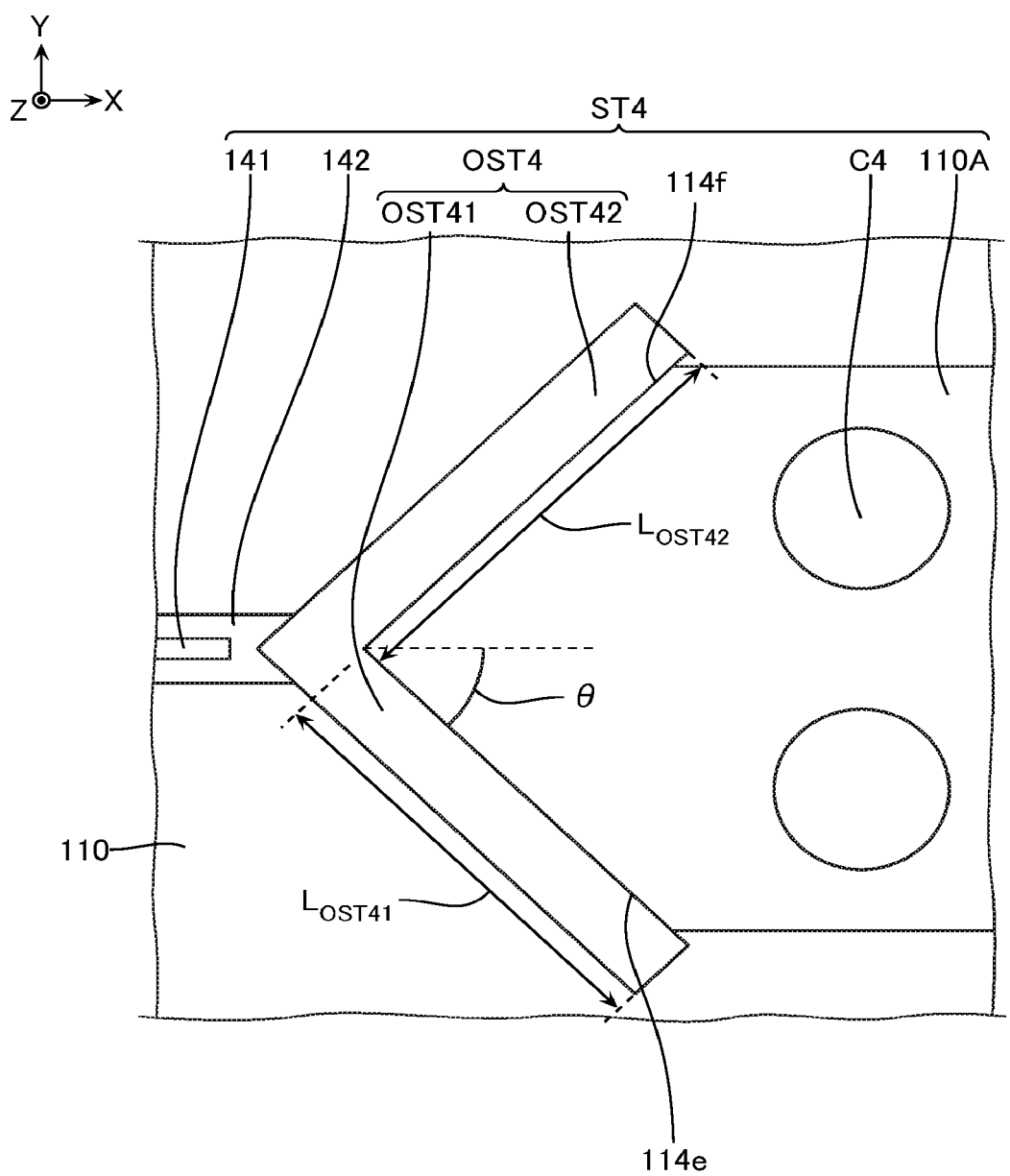
FIG. 54 is a schematic plan view illustrating a part of a configuration of a semiconductor memory device according to a fourth embodiment.

Next, with reference to FIG. 54, a semiconductor memory device according to the fourth embodiment is described.

FIG. 54 is a schematic plan view for describing the semiconductor memory device. In FIG. 54, illustration of the supporting structures HR is omitted.

The semiconductor memory device according to the fourth embodiment is basically configured similarly to the semiconductor memory device according to the first embodiment. However, as illustrated in FIG. 54, the semiconductor memory device according to the fourth embodiment includes inter-finger structures ST4 instead of the inter-finger structures STb, STc. The inter-finger structure ST4 is basically configured similarly to the inter-finger structures STb and STc. However, the inter-finger structure ST4 includes an insulating layer OST4 instead of the insulating layer OST. The insulating layer OST4 is basically configured similarly to the insulating layer OST. However, the insulating layer OST4 includes a first part OST41 and a second part OST42 that extend not in the X-direction but in directions between the X-direction and the Y-direction (directions oblique to the X-direction and to the Y-direction in FIG. 54). Extending directions of the first part OST41 and the second part OST42 may be, for example, directions having an angular difference of 45° with respect to the X-direction and the Y-direction. The extending directions of the first part OST41 and the second part OST42 intersect with one another. One end portions of the first part OST41 and the second part OST42 are connected to the insulating layer 142. Furthermore, one end portions of the first part OST41 and the second part OST42 are mutually connected. Furthermore, the other end portions of the first part OST41 and the second part OST42 are disposed farther from the memory hole region $R_{MH}$ adjacent on the negative side in the X-direction with respect to a structure exemplified in FIG. 54, than one end portions thereof in the X-direction.

The first part OST41 and the second part OST42 extend in the directions between the X-direction and the Y-direction (directions oblique to the X-direction and to the Y-direction in FIG. 54). Therefore, for example, when the angular difference of the first part OST41 and the second part OST42 with respect to the X-direction is set to θ, θ is larger than 0° and smaller than 90°.

When lengths in the extending directions of the first part OST41 and the second part OST42 are set to $L_{OST41}$ and $L_{OST42}$, $L_{OST41} \sin θ$ and $L_{OST42} \sin θ$ are at least smaller than the width $Y_{WL}$ (FIG. 6) in the Y-direction of the conductive layer 110 that functions as the word line WL.

It is preferred that the lengths $L_{OST41}$, $L_{OST42}$ have sizes that allow $L_{OST41}(1+\sin θ)$ and $L_{OST42}(1+\sin θ)$ to have the size equal to or more than a half the width $Y_{WL}$ (FIG. 6). It is more preferred that the lengths $L_{OST41}$, $L_{OST42}$ have the size equal to or more than a half the width $Y_{WL}$ (FIG. 6).

Furthermore, as illustrated in FIG. 54, a side surface in the X-direction of the insulating layer 110A according to the fourth embodiment includes a side edge portion 114e in contact with the first part OST41 described above and a side edge portion 114f in contact with the second part OST42 described above. The side edge portions 114e, 114f each extend in an extending direction of the first part OST41 and the second part OST42.

Figure 55:
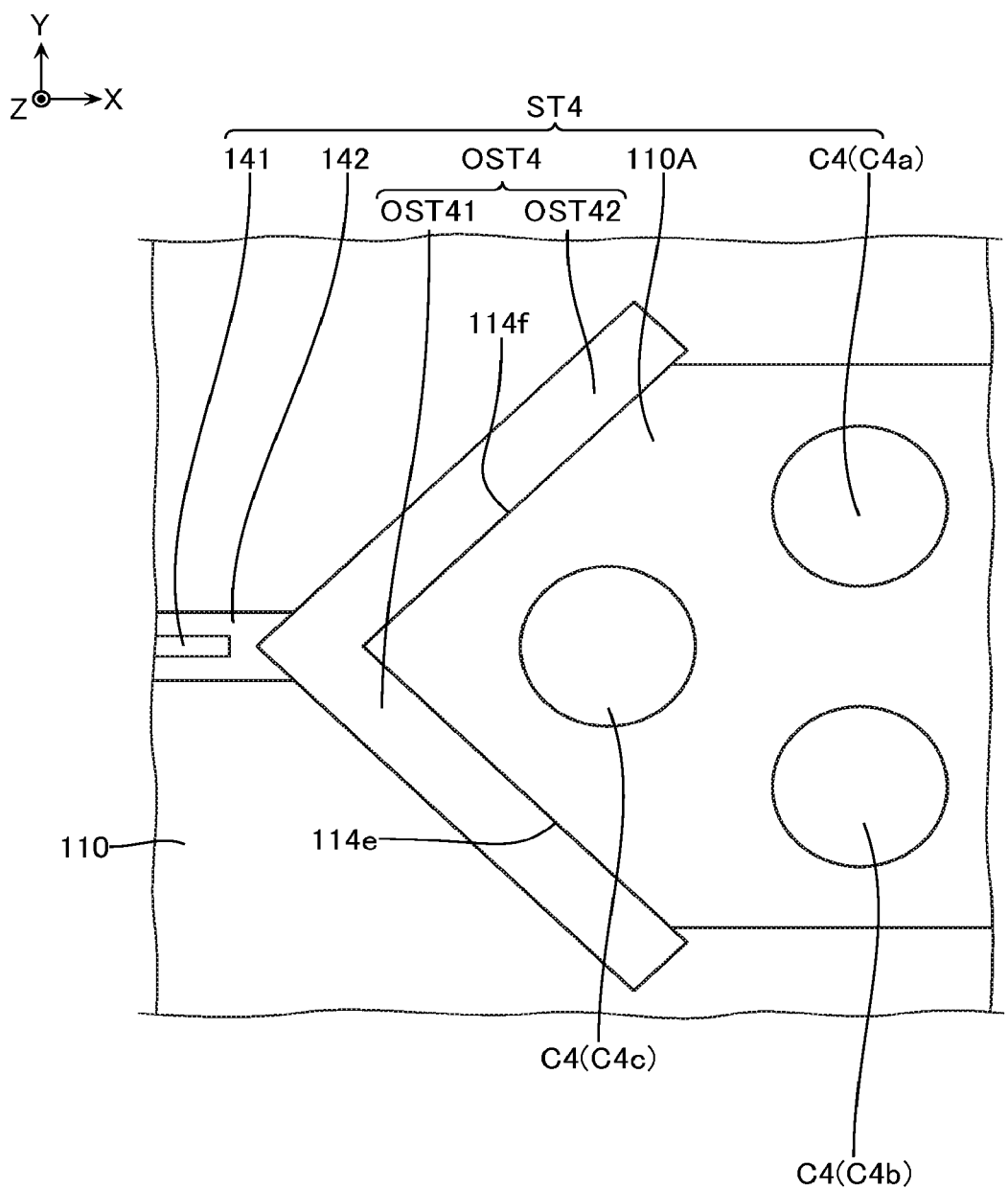
FIG. 55 is a schematic plan view illustrating a part of another exemplary configuration of the semiconductor memory device according to the fourth embodiment.

In the semiconductor memory device according to the fourth embodiment, for example, as illustrated in FIG. 55, the contact C4 may be further arranged at the proximity of the first part OST41 and the second part OST42. In this case, this contact C4 may be different in the position in the Y-direction from the other contacts C4. For example, FIG. 55 exemplifies three contacts C4a, C4b, C4c as an example. The contacts C4a, C4b are arranged in the Y-direction. The contact C4c is disposed between these two contacts C4a, C4b and the insulating layer OST4 in the X-direction. On an XY cross-sectional surface exemplified in FIG. 55, the position in the Y-direction of the center of the contact C4c is disposed between the position in the Y-direction of the center of the contact C4a and the position in the Y-direction of the center of the contact C4b. The centers of the contacts C4a, C4b, C4c may be, for example, the centers of gravity on an image of the contacts C4a, C4b, C4c on the XY cross-sectional surface as exemplified in FIG. 55. On such an XY cross-sectional surface, circles may be applied to the outlines of the contacts C4a, C4b, C4c, and the centers of the circles may be set to the centers of the contacts C4a, C4b, C4c.

[Effect]

With the semiconductor memory device according to the fourth embodiment, an effect similar to that of the semiconductor memory device according to the first embodiment can be provided. Furthermore, the insulating layer OST4 according to the fourth embodiment has a smaller width in the X-direction compared with the insulating layer OST according to the first embodiment. Accordingly, with the semiconductor memory device according to the fourth embodiment, areas of the contact connection region $R_{C4T}$ and the second hook-up region $R_{HU2}$ can be reduced, thereby ensuring high integration of the semiconductor memory device.

Other Embodiments

Figure 57:
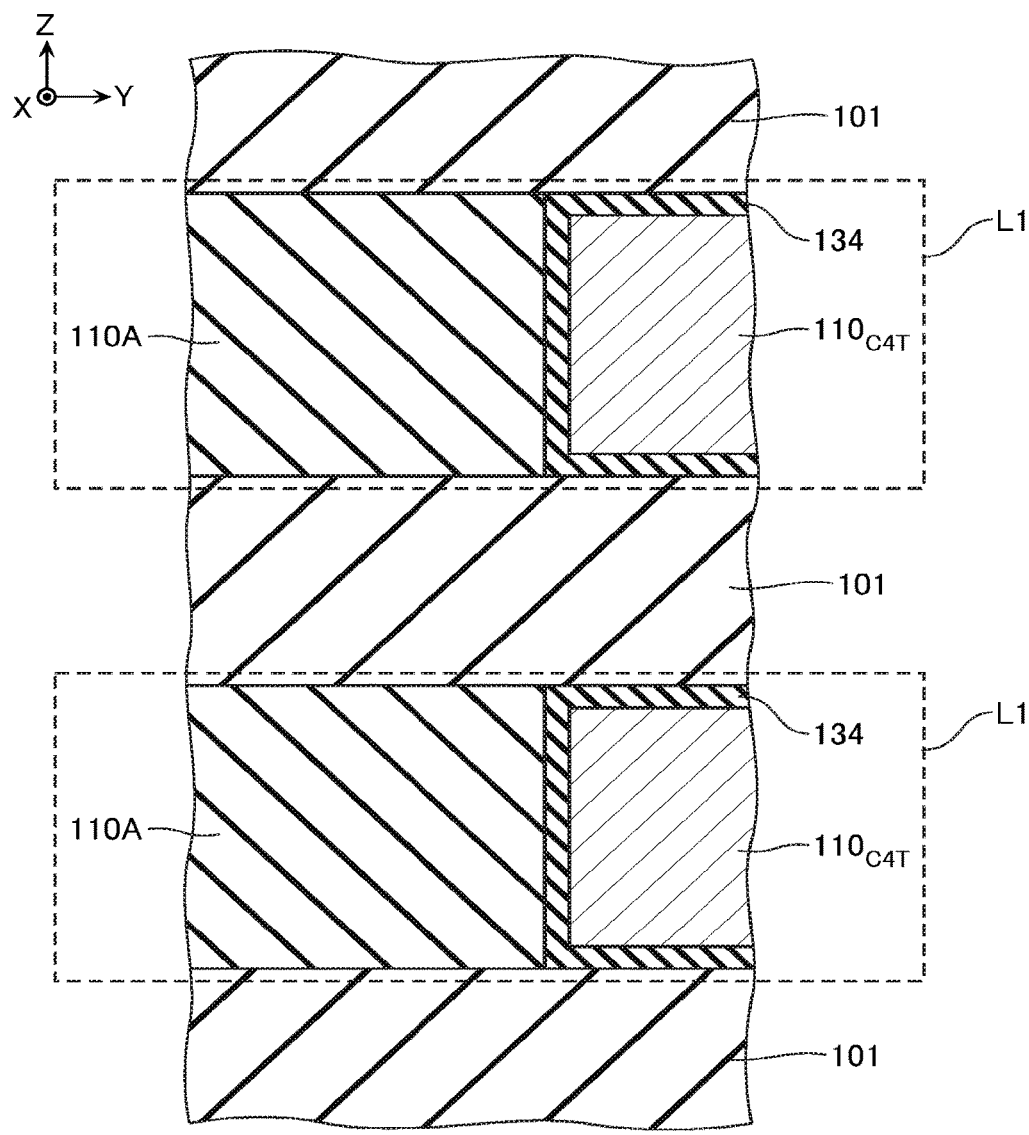
FIG. 57 is a schematic cross-sectional view illustrating a part of a configuration of a semiconductor memory device according to another embodiment.
Figure 58:
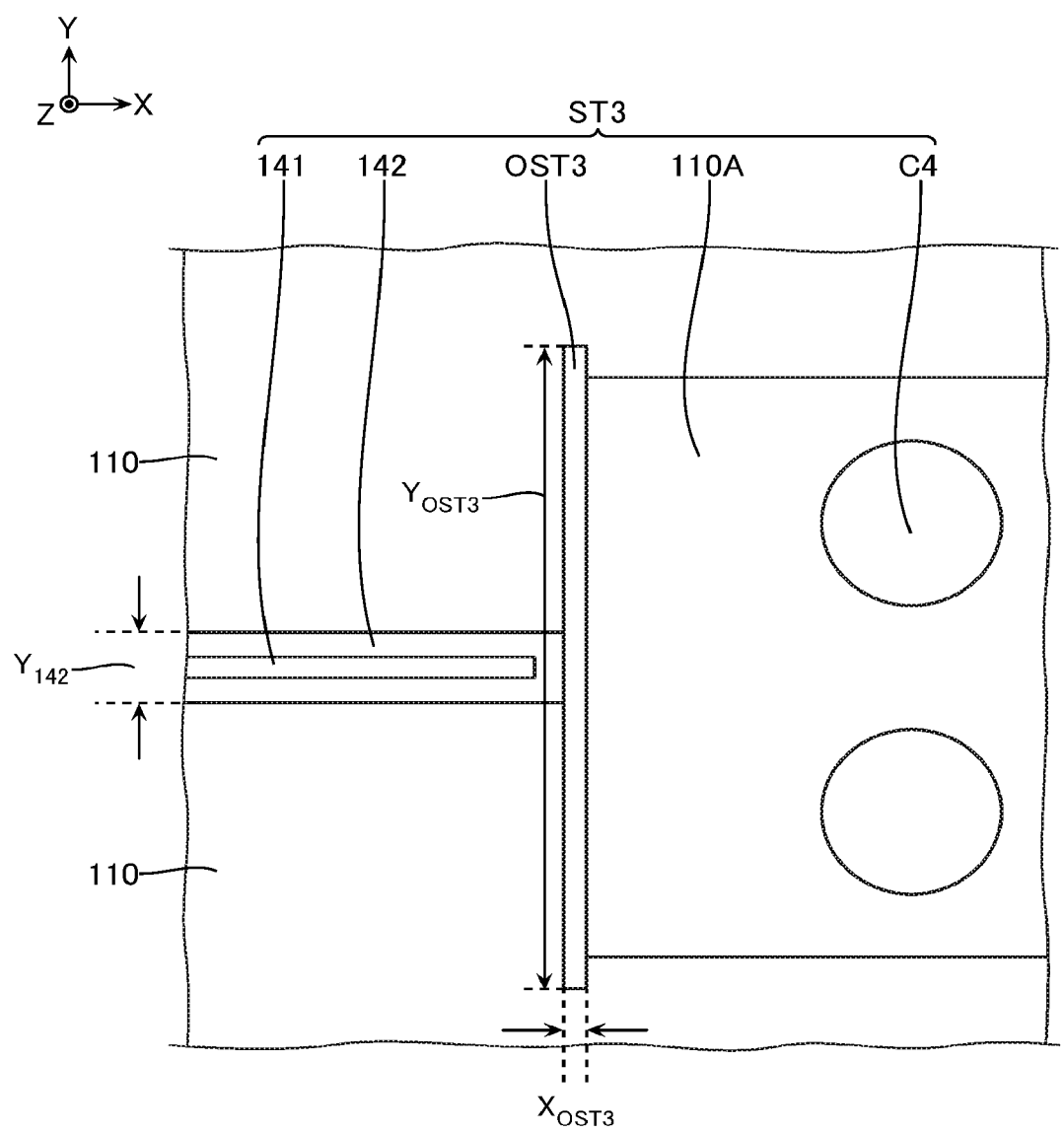
FIG. 58 is a schematic plan view illustrating a part of a configuration of a semiconductor memory device according to another embodiment.
Figure 59:
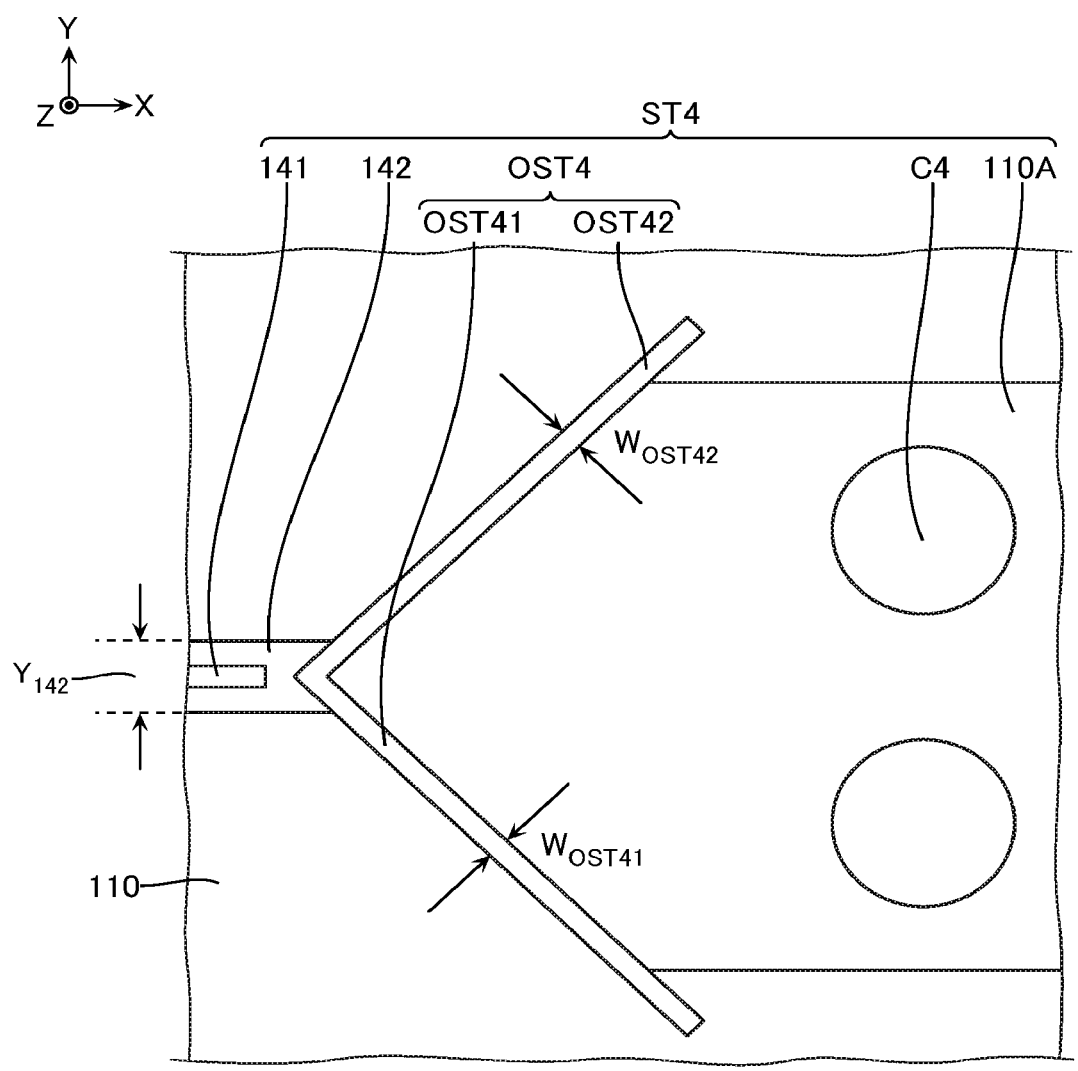
FIG. 59 is a schematic plan view illustrating a part of a configuration of a semiconductor memory device according to another embodiment.
Figure 60:
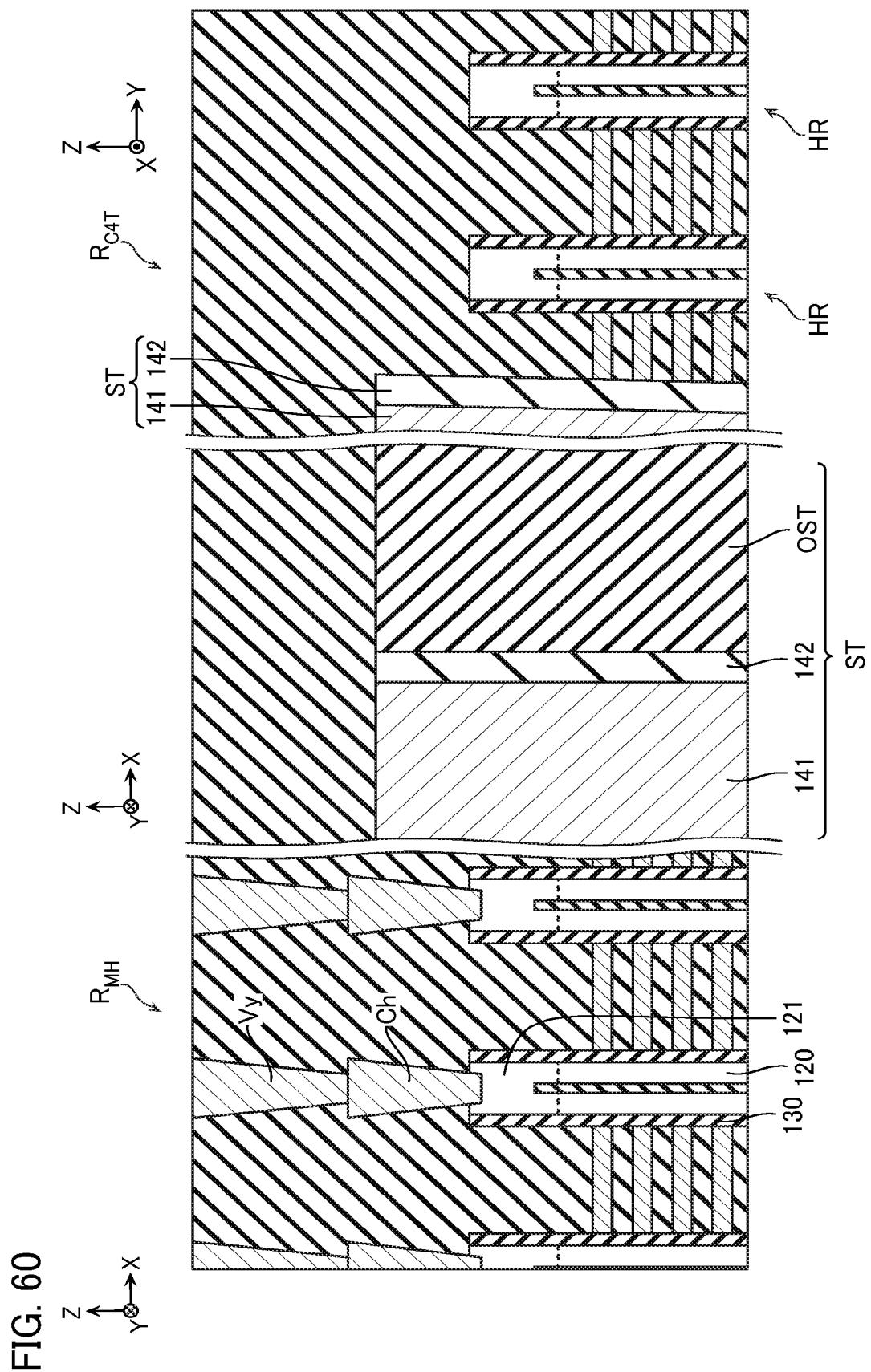
FIG. 60 is a schematic cross-sectional view illustrating a part of a configuration of a semiconductor memory device according to the first embodiment.
Figure 61:
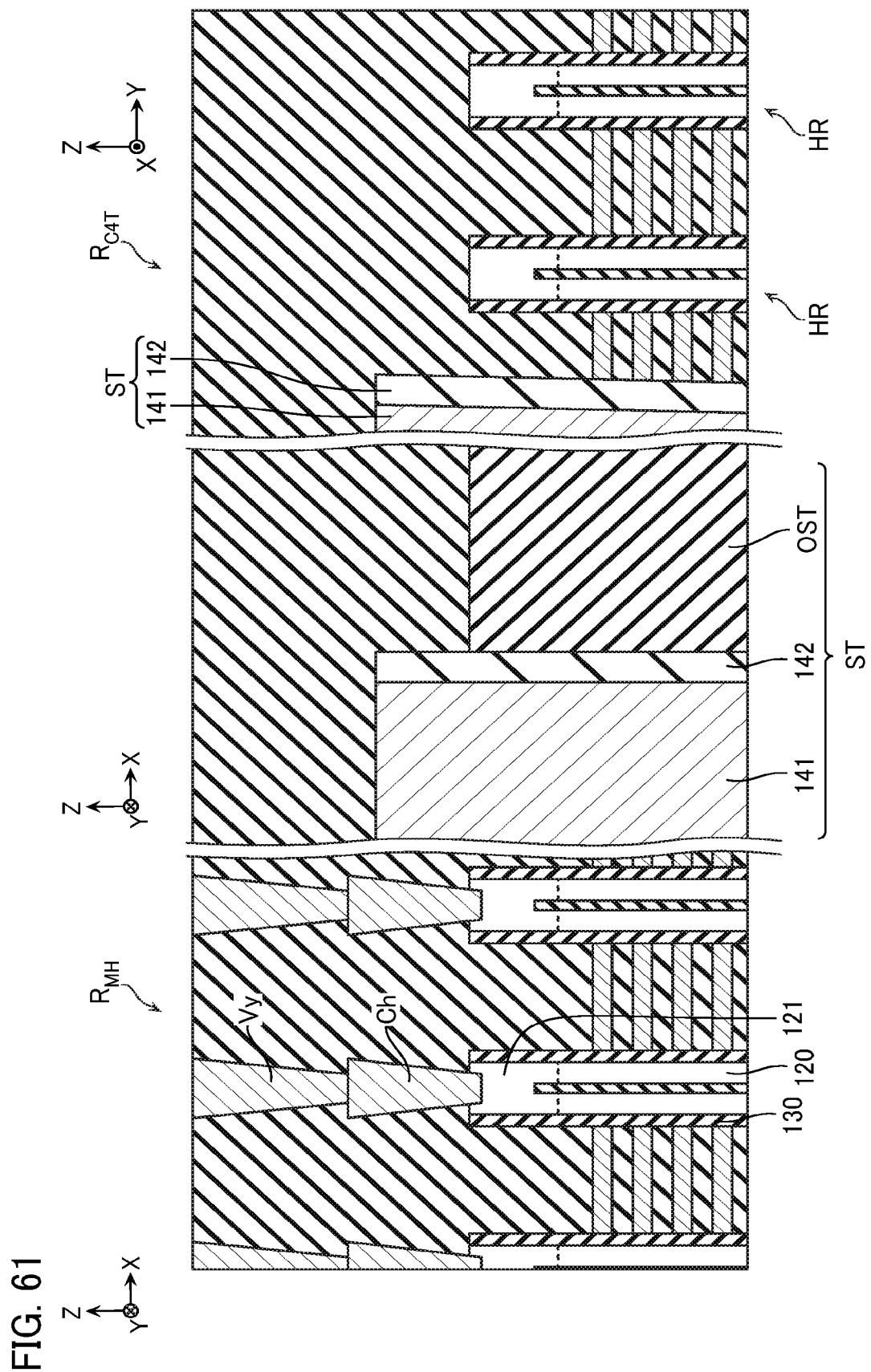
FIG. 61 is a schematic cross-sectional view illustrating a part of a configuration of a semiconductor memory device according to another embodiment.
Figure 62:
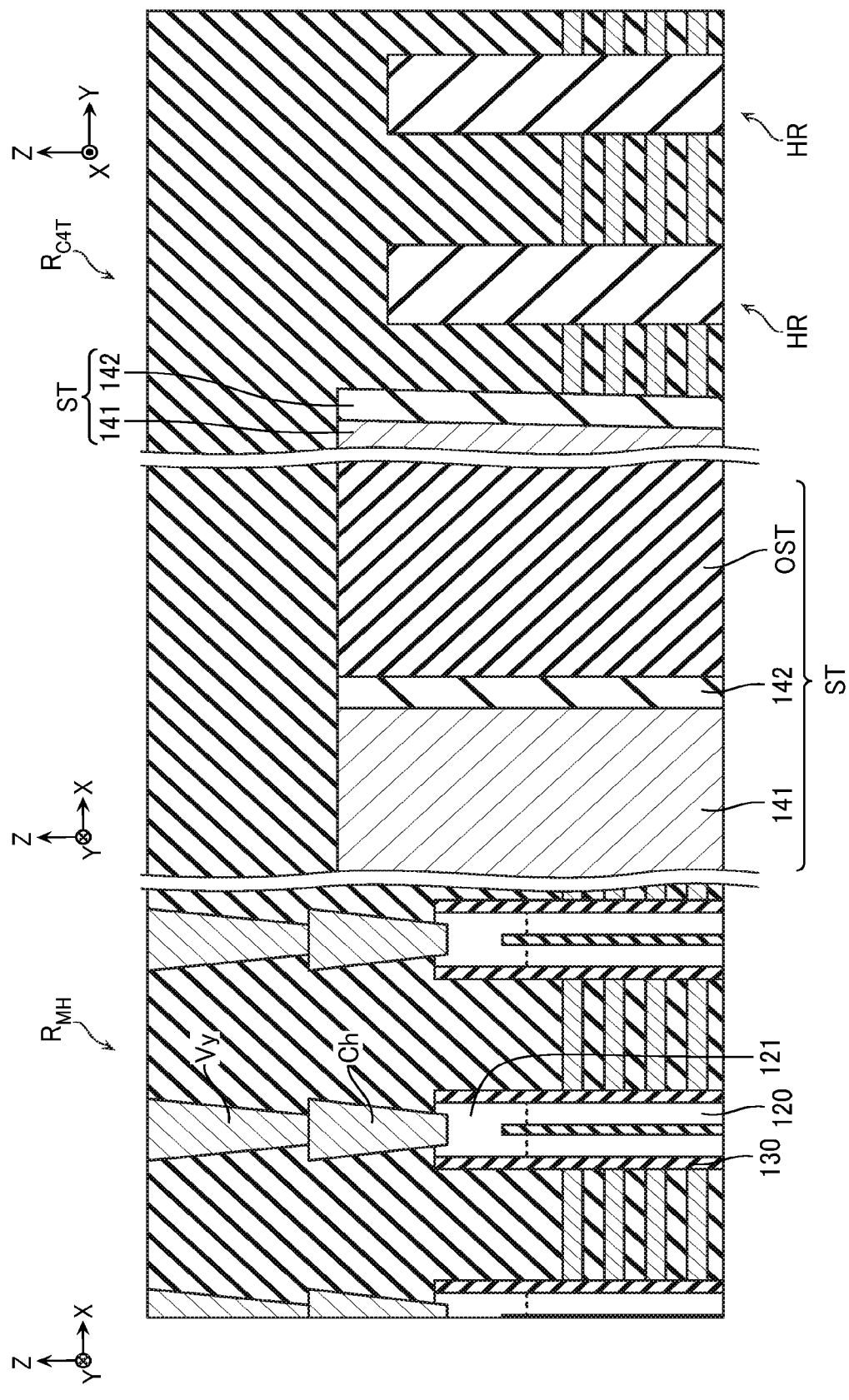
FIG. 62 is a schematic cross-sectional view illustrating a part of a configuration of a semiconductor memory device according to another embodiment.
Figure 63:
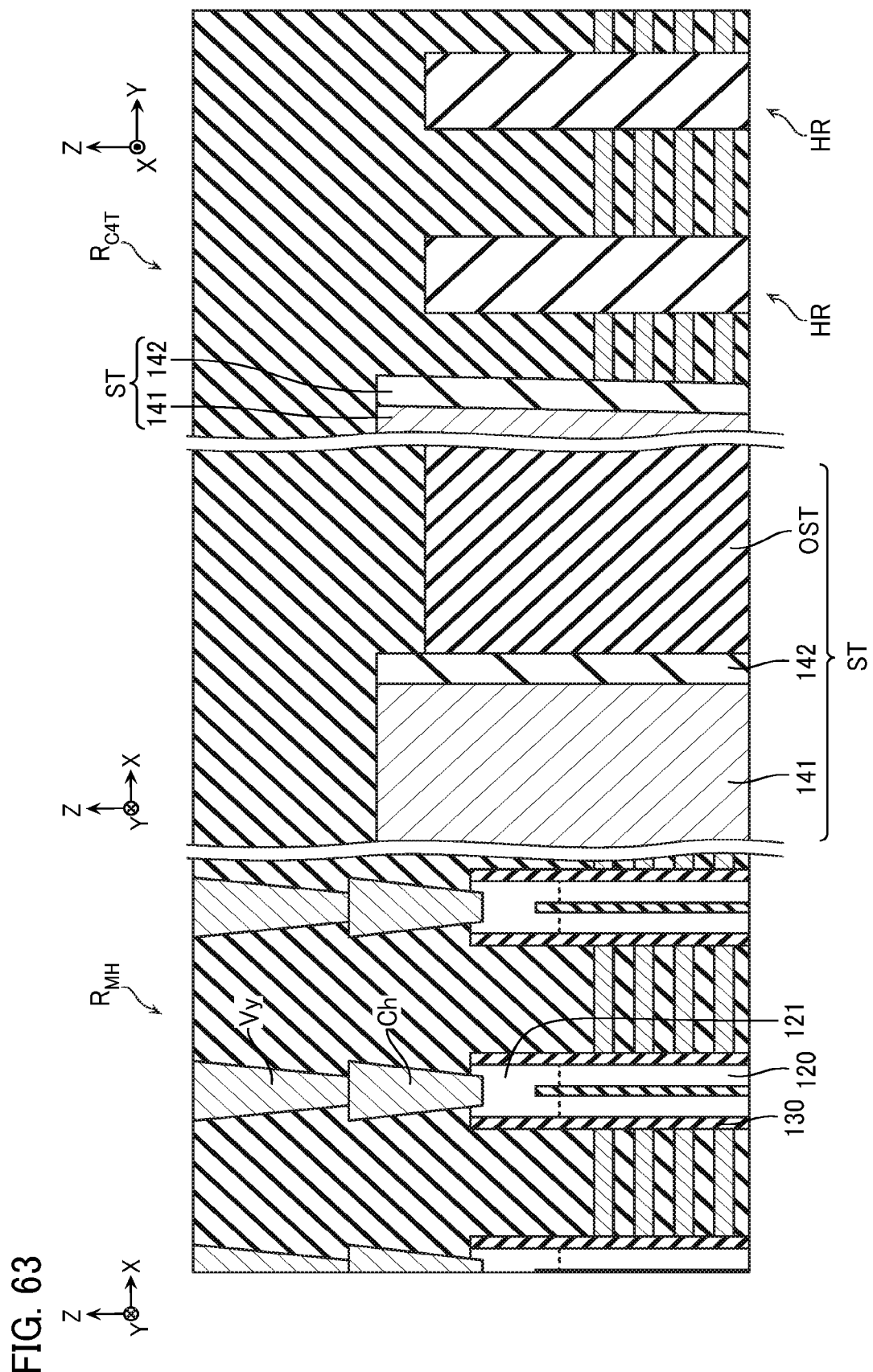
FIG. 63 is a schematic cross-sectional view illustrating a part of a configuration of a semiconductor memory device according to another embodiment.
Figure 64:
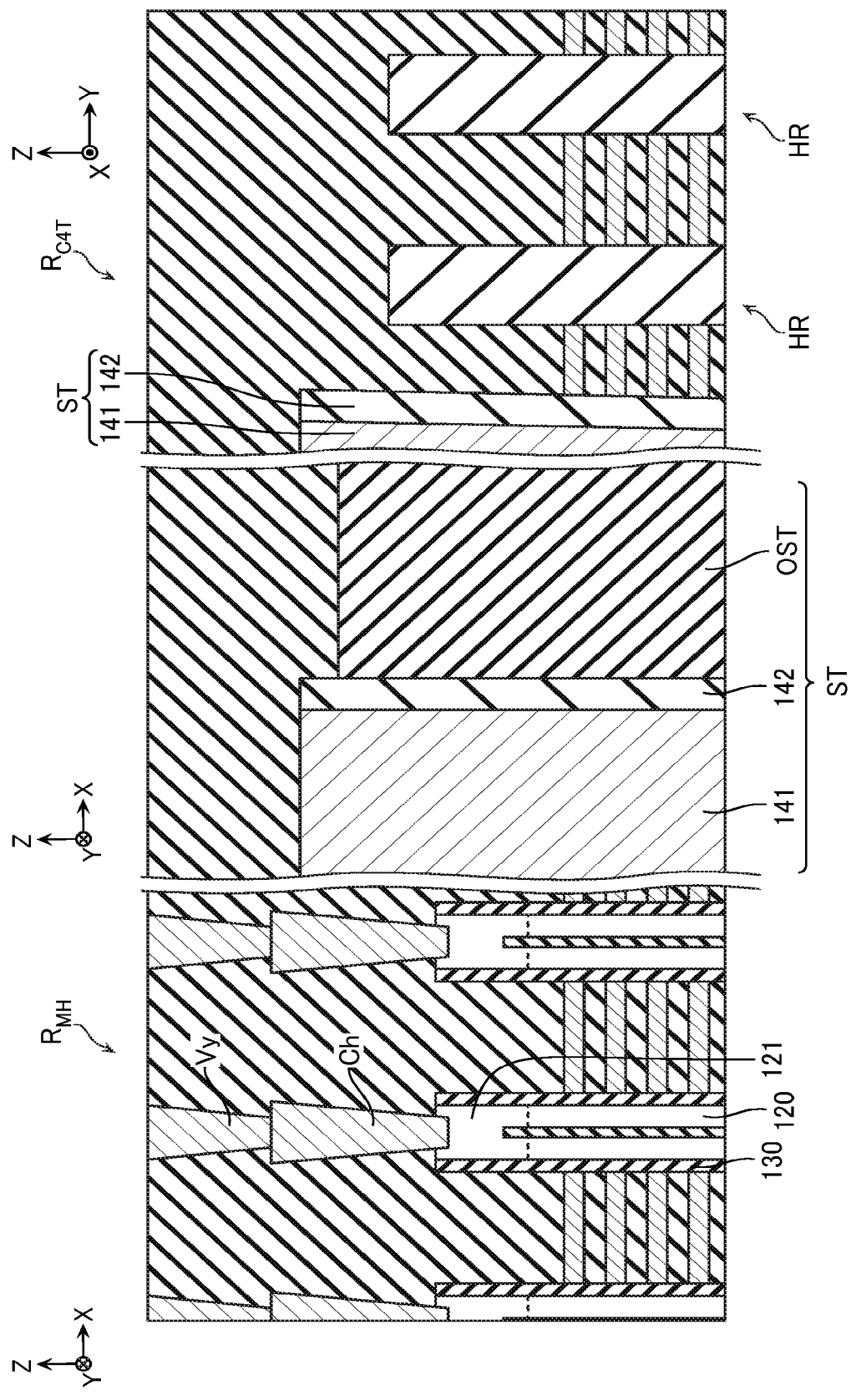
FIG. 64 is a schematic cross-sectional view illustrating a part of a configuration of a semiconductor memory device according to another embodiment.

The semiconductor memory devices according to the first embodiment to the fourth embodiment have been described above. However, the semiconductor memory devices according to these embodiments are only examples and specific configurations and operations are adjustable as appropriate. Subsequently, with reference to FIG. 56 to FIG. 64, semiconductor memory devices according to other embodiments are described. FIG. 56, FIG. 57, and FIG. 61 to FIG. 64 are schematic cross-sectional views illustrating a part of configurations of semiconductor memory devices according to other embodiments. FIG. 60 is a schematic cross-sectional view illustrating a part of configuration of semiconductor memory devices according to the first embodiment. FIG. 58 and FIG. 59 are schematic plan views illustrating a part of configurations of semiconductor memory devices according to other embodiments. In FIG. 58 and FIG. 59, illustration of the supporting structures HR is omitted.

Figure 56:
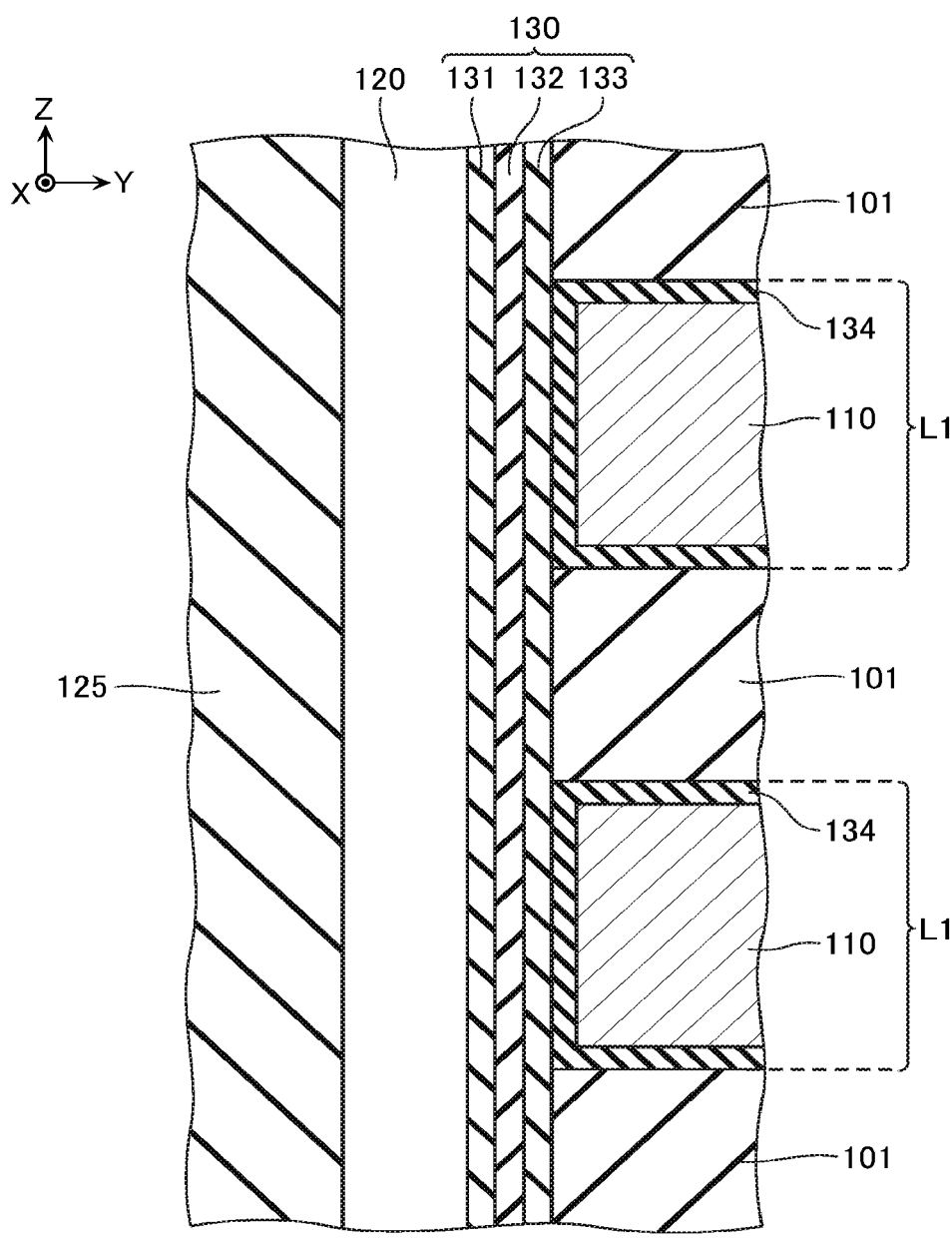
FIG. 56 is a schematic cross-sectional view illustrating a part of a configuration of a semiconductor memory device according to another embodiment.

For example, in the semiconductor memory device according to the first embodiment to the fourth embodiment, as illustrated in FIG. 56, the plurality of layers L1 may each include a high dielectric constant insulating layer 134 covering the upper surface, the lower surface and side surfaces in the X-direction and in the Y-direction of the conductive layer 110. The high dielectric constant insulating layer 134 may contain, for example, an insulating metal oxide of alumina ($Al_2O_3$) or the like. For example, as illustrated in FIG. 57, the high dielectric constant insulating layer 134 may be disposed between the conductive layer 110 and the insulating layer 110A so as to be in contact with them. The high dielectric constant insulating layer 134 may be disposed on one and the other side surfaces in the Y-direction of the insulating layer 110A. In this case, it is possible to regard that each layer of the plurality of layers L1 in the inter-finger structure STb (STc), ST2, ST3, ST4 includes the high dielectric constant insulating layer 134 in addition to the insulating layer 110A, and that the high dielectric constant insulating layers 134 constituting the insulating layer portion of the plurality of layers L1 together with the insulating layers 110A in the inter-finger structure STb (STc), ST2, ST3, ST4 are in contact with the conductive layer 110 on the side surface in its Y-direction.

For example, widths in directions perpendicular to the extending directions of the insulating layer OST3 according to the third embodiment and the insulating layer OST4 according to the fourth embodiment may be equal to the above-described width $Y_{142}$ (FIG. 10) similarly to the first embodiment. However, for example, as illustrated in FIG. 58, widths $X_{OST3}$ in the direction perpendicular to the extending direction of the insulating layer OST3 may be smaller than the above-described width $Y_{142}$ similarly to the second embodiment. Similarly, as illustrated in FIG. 59, widths $W_{OST41}$ and $W_{OST42}$ in the directions perpendicular to the extending directions of the first part OST41 and the second part OST42 according to the fourth embodiment may be smaller than the above-described width $Y_{142}$ similarly to the second embodiment. In the latter case, the insulating layer OST3 and the insulating layer OST4 may be formed by a method similar to that of the insulating layer OST2 according to the second embodiment.

In the first embodiment to the fourth embodiment, in the process described with reference to FIG. 16 and FIG. 17 or the processes corresponding to this, the memory holes MH and the through holes $H_{HR}$ are simultaneously formed. As a result, for example, as exemplified in FIG. 60, the height position of the upper end of the impurity region 121 disposed on the upper end of the semiconductor layer 120 matches the height position of the upper end of the supporting structure HR. In the first embodiment to the fourth embodiment, in the process described with reference to FIG. 20 to FIG. 23 or the processes corresponding to this, the trenches STA or the like are formed, and inside the trenches STA or the like, both the insulating layers OST, OST2, OST3, OST4 and the conductive layer 141 and insulating layer 142 are formed. As a result, for example, as exemplified in FIG. 60, the height positions of the upper ends of the insulating layers OST, OST2, OST3, OST4 match the height position of the upper end of the conductive layer 141 and the insulating layer 142.

However, such configurations and manufacturing methods are only examples, and specific configurations and manufacturing methods are adjustable as appropriate.

For example, the formation of the insulating layers OST, OST3, OST4 may be performed before the formation of the trenches STA. In this case, for example, the formation of the insulating layers OST, OST3, OST4 may be performed simultaneously with the formation of the semiconductor layers 120 and the gate insulating films 130 and the formation of the supporting structures HR. In this case, for example, as exemplified in FIG. 61, the height positions of the upper ends of the insulating layers OST, OST3, OST4 may match the height position of the upper end of the impurity region 121 disposed on the upper end of the semiconductor layer 120 and the height position of the upper end of the supporting structure HR.

For example, the formation of the supporting structures HR may be performed before or after the formation of the semiconductor layers 120 and the gate insulating films 130. In the former case, the height position of the upper end of the supporting structure HR may be disposed below the height position of the upper end of the impurity region 121 disposed on the upper end of the semiconductor layer 120. In the latter case, for example, as exemplified in FIG. 62, the height position of the upper end of the supporting structure HR may be disposed above the height position of the upper end of the impurity region 121 disposed on the upper end of the semiconductor layer 120.

In such cases, the formation of the insulating layers OST, OST3, OST4 may be performed simultaneously with the formation of the supporting structures HR. In this case, for example, as exemplified in FIG. 63, the height positions of the upper ends of the insulating layers OST, OST3, OST4 may match the height position of the upper end of the supporting structure HR.

In such a case, the formation of the insulating layers OST, OST3, OST4 may be performed before or after the formation of the supporting structures HR. In the former case, the height positions of the upper ends of the insulating layers OST, OST3, OST4 may be disposed below the height position of the upper end of the supporting structure HR. In the latter case, for example, as exemplified in FIG. 64, the height positions of the upper ends of the insulating layers OST, OST3, OST4 may be disposed above the height position of the upper end of the supporting structure HR.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate including a first region, a second region, and a third region arranged in a first direction, the second region being disposed between the first region and the third region in the first direction;
   a stacked structure disposed above the semiconductor substrate and including a plurality of first layers stacked so as to be spaced apart from one another, the plurality of first layers including a plurality of conductive layers disposed corresponding to the respective plurality of first layers in the first region and the third region, the stacked structure including a plurality of insulating layers disposed corresponding to the respective plurality of first layers in the second region;
   first to third insulating members disposed above the semiconductor substrate and extending in the first direction and in a stacking direction of the plurality of first layers in the stacked structure, the second insulating member being disposed so as to be spaced apart from the first insulating member and the third insulating member in a second direction intersecting with the first direction and the stacking direction between the first insulating member and the third insulating member in the second direction, the first insulating member and the third insulating member extending across the first to third regions in the first direction and separating the plurality of first layers in the second direction, the second insulating member extending across the first region and the third region in the first direction; and
   a plurality of semiconductor layers disposed extending in the stacking direction in the stacked structure in the first region and the third region, the plurality of semiconductor layers forming a plurality of memory cells in a plurality of intersection portions with the plurality of conductive layers, wherein the second insulating member contacts side edge portions on both sides of the plurality of insulating layers in the first direction in the second region, the plurality of first layers extend in the second direction in the second region from an edge portion on a side of the first insulating member through a central region including the plurality of insulating layers to an edge portion on a side of the third insulating member, the plurality of first layers including the plurality of conductive layers in each of a first side region in the second direction between the first insulating member and the central region and a second side region in the second direction between the third insulating member and the central region, the plurality of conductive layers in the first region and the plurality of conductive layers in the third region are mutually connected via the plurality of conductive layers in the first side region and the second side region, and the second insulating member includes:
 a first part extending in the first direction in the first region; and
 a second part partially extending in the second direction along one side edge portion on a first region side of the side edge portions of the insulating layers in the second region, the second part directly contacts the first part.

2. The semiconductor memory device according to claim 1, wherein
the second part has a length in the first direction smaller than a length of the first part in the second direction.

3. The semiconductor memory device according to claim 1, wherein
the second part has a length in the second direction that is equal to or more than a half a first length, the first length being a distance between the first insulating member and the second insulating member in the second direction in the first region.

4. The semiconductor memory device according to claim 1, wherein
the plurality of conductive layers in the first side region in the second region directly contact the plurality of insulating layers, and
the plurality of conductive layers in the second side region in the second region directly contact the plurality of insulating layers.

5. The semiconductor memory device according to claim 1, wherein
the plurality of first layers extend in the second direction in the second region continuously from the edge portion on the side of the first insulating member to the edge portion on the side of the third insulating member.

6. A semiconductor memory device comprising:
a semiconductor substrate including a first region, a second region, and a third region arranged in a first direction, the second region being disposed between the first region and the third region in the first direction;
a stacked structure disposed above the semiconductor substrate and including a plurality of first layers and a plurality of interlayer insulating layers alternately stacked, the plurality of first layers including a plurality of conductive layers disposed corresponding to the respective plurality of first layers in the first region and the third region, the stacked structure including a plurality of insulating layers disposed corresponding to the respective plurality of first layers in the second region;

first to third insulating members disposed above the semiconductor substrate and extending in the first direction and in a stacking direction of the stacked structure of the plurality of first layers and the plurality of interlayer insulating layers in the stacked structure, the second insulating member being disposed so as to be spaced apart from the first insulating member and the third insulating member in a second direction intersecting with the first direction and the stacking direction between the first insulating member and the third insulating member in the second direction, the first insulating member and the third insulating member extending across the first to third regions in the first direction and separating the plurality of first layers and the plurality of interlayer insulating layers in the second direction, the second insulating member extending across the first region and the third region in the first direction; and a plurality of semiconductor layers disposed extending in the stacking direction in the stacked structure in the first region and the third region, the plurality of semiconductor layers forming a plurality of memory cells in a plurality of intersection portions with the plurality of conductive layers, wherein
 the second insulating member contacts side edge portions on both sides of the plurality of insulating layers in the first direction in the second region, the plurality of first layers include the plurality of conductive layers in the second region in each of a first side region in the second direction between the first insulating member and a central region including the plurality of insulating layers and a second side region in the second direction between the third insulating member and the central region, the plurality of conductive layers in the first region and the plurality of conductive layers in the third region are mutually connected via the plurality of conductive layers in the first side region and the second side region, the plurality of interlayer insulating layers extend from an edge portion on a side of the first insulating member to an edge portion on a side of the third insulating member through the central region in the second direction in the second region, and the second insulating member includes:
 a first part extending in the first direction in the first region; and
 a second part partially extending in the second direction along one side edge portion on a first region side of the side edge portions of the insulating layers in the second region, the second part directly contacting the first part.

7. The semiconductor memory device according to claim 6, wherein
the second part has a length in the first direction smaller than a length of the first part in the second direction.

8. The semiconductor memory device according to claim 6, wherein
the second part has a length in the second direction that is equal to or more than a half a first length, the first length being a distance between the first insulating member and the second insulating member in the second direction in the first region.

9. The semiconductor memory device according to claim 6, wherein the plurality of conductive layers in the first side region in the second region directly contact the plurality of insulating layers, and the plurality of conductive layers in the second side region in the second region directly contact the plurality of insulating layers.

10. The semiconductor memory device according to claim 6, wherein the plurality of interlayer insulating layers extend continuously from the edge portion on the side of the first insulating member to the edge portion on the side of the third insulating member in the second direction in the second region.

11. A semiconductor memory device comprising:

a semiconductor substrate; and a memory cell array, wherein the semiconductor substrate includes a first region and a second region arranged in a first direction, the memory cell array includes:
- a first finger structure and a second finger structure extending across the first region and the second region in the first direction and arranged in a second direction intersecting with the first direction; and
- an inter-finger structure disposed between the first finger structure and the second finger structure and extending across the first region and the second region in the first direction, the first finger structure includes:
- a plurality of first conductive layers arranged in a third direction intersecting with a substrate surface of the semiconductor substrate; and
- a first semiconductor layer disposed in the first region, and extending in the third direction through the plurality of first conductive layers, the second finger structure includes:
- a plurality of second conductive layers arranged in the third direction; and
- a second semiconductor layer disposed in the first region, and extending in the third direction, and opposed to through the plurality of second conductive layers, the inter-finger structure includes:
- a plurality of first insulating layers disposed in the second region and arranged in the third direction; and
- a second insulating layer extending in the third direction and being in contact with a side edge portion on one side in the first direction of the plurality of first insulating layers in the second region, the plurality of first insulating layers have side surfaces on one side in the second direction, and the side surfaces on the one side contact the plurality of first conductive layers, and the plurality of first insulating layers have side surfaces on a second side opposite to the first side in the second direction, and the side surfaces on the second side contact the plurality of second conductive layers, and the second insulating layer includes:
- a first part extending in the first direction in the first region; and
- a second part partially extending in the second direction along the side edge portion on the one side in the first direction of the plurality of first insulating layers in the second region, the second part directly contacting the first part.

12. The semiconductor memory device according to claim 11, wherein each of the plurality of first insulating layers include:
- a third insulating layer;
- a first high dielectric constant insulating layer disposed on side surfaces on the first side in the second direction of the third insulating layer; and
- a second high dielectric constant insulating layer disposed on a side surface on the second side in the second direction of the third insulating layer, the first high dielectric constant insulating layer contacts one of the plurality of first conductive layers in the second direction, and the second high dielectric constant insulating layer contacts one of the plurality of second conductive layers in the second direction.

* * * * *